United States Patent
Utsumi et al.

(10) Patent No.: US 9,188,863 B2
(45) Date of Patent: Nov. 17, 2015

(54) RESIST COMPOSITION AND METHOD OF FORMING RESIST PATTERN

(71) Applicant: Tokyo Ohka Kogyo Co., Ltd., Kawasaki-shi (JP)

(72) Inventors: Yoshiyuki Utsumi, Kawasaki (JP); Toshiaki Hato, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/920,481

(22) Filed: Jun. 18, 2013

(65) Prior Publication Data

US 2013/0344435 A1 Dec. 26, 2013

(30) Foreign Application Priority Data

Jun. 20, 2012 (JP) ................................. 2012-139068

(51) Int. Cl.
*G03F 7/004* (2006.01)
*G03F 7/38* (2006.01)
*G03F 7/40* (2006.01)
*G03F 7/039* (2006.01)

(52) U.S. Cl.
CPC .............. *G03F 7/039* (2013.01); *G03F 7/0045* (2013.01); *G03F 7/0397* (2013.01); *G03F 7/38* (2013.01); *G03F 7/40* (2013.01)

(58) Field of Classification Search
CPC ....... G03F 7/0045; G03F 7/0397; G03F 7/38; G03F 7/40
USPC .............. 430/270.1, 919, 920, 921, 922, 326, 430/330
See application file for complete search history.

(56) References Cited

U.S. PATENT DOCUMENTS

| 5,525,453 | A | * | 6/1996 | Przybilla et al. ............ 430/270.1 |
| 6,902,862 | B2 | * | 6/2005 | Takahashi et al. ......... 430/270.1 |
| 6,949,325 | B2 | | 9/2005 | Li et al. |
| 7,252,924 | B2 | * | 8/2007 | Yamanaka et al. ......... 430/270.1 |
| 2001/0049073 | A1 | | 12/2001 | Hada et al. |
| 2004/0110085 | A1 | | 6/2004 | Iwai et al. |
| 2008/0318159 | A1 | * | 12/2008 | Fujimori .................... 430/270.1 |
| 2009/0111047 | A1 | * | 4/2009 | Yamashita ................. 430/270.1 |
| 2009/0197204 | A1 | | 8/2009 | Shiono et al. |
| 2009/0317743 | A1 | | 12/2009 | Shiono et al. |
| 2010/0310985 | A1 | | 12/2010 | Mori et al. |
| 2011/0117499 | A1 | | 5/2011 | Matsumiya et al. |
| 2012/0082936 | A1 | | 4/2012 | Serizawa et al. |
| 2012/0149916 | A1 | | 6/2012 | Utsumi et al. |
| 2013/0052585 | A1 | * | 2/2013 | Ayothi et al. .............. 430/283.1 |

FOREIGN PATENT DOCUMENTS

| JP | A-2000-206694 | 7/2000 |
| JP | A-2003-241385 | 8/2003 |
| JP | A-2005-336452 | 12/2005 |
| JP | A-2006-259582 | 9/2006 |
| JP | A-2006-317803 | 11/2006 |
| JP | A-2009-025723 | 2/2009 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |
| WO | WO 2010/147079 A1 | 12/2010 |

* cited by examiner

*Primary Examiner* — John S Chu
(74) *Attorney, Agent, or Firm* — Knobbe Martens Olson & Bear LLP

(57) ABSTRACT

A resist composition which generates acid upon exposure and exhibits changed solubility in a developing solution by the action of acid, and which includes a base component which exhibits changed solubility in a developing solution by the action of acid, and a nitrogen-containing compound which has a boiling point of 50 to 200° C., a conjugate acid thereof having a pKa of 0 to 7, and a photodecomposable base; and a method of forming a resist pattern using the resist composition.

18 Claims, No Drawings

RESIST COMPOSITION AND METHOD OF FORMING RESIST PATTERN

TECHNICAL FIELD

The present invention relates to a resist composition and a method of forming a resist pattern.

Priority is claimed on Japanese Patent Application No. 2012-139068, filed on Jun. 20, 2012, the content of which is incorporated herein by reference.

BACKGROUND ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have lead to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production of the semiconductor elements. Furthermore, research is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in a developing solution under the action of acid and an acid generator component that generates acid upon exposure.

For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator component, and the action of this acid causes an increase in the polarity of the base resin, making the exposed portions soluble in the alkali developing solution. Thus, by conducting alkali developing, the unexposed portions remain to form a positive resist pattern.

On the other hand, in a case where such a base resin is applied to a solvent developing process using a developing solution containing an organic solvent (organic developing solution), when the polarity of the base resin is increased, the solubility of the exposed portions in an organic developing solution is relatively decreased. As a result, the unexposed portions of the resist film are dissolved and removed by the organic developing solution, and a negative resist pattern in which the exposed portions are remaining is formed. Such a solvent developing process for forming a negative-tone resist composition is sometimes referred to as "negative-tone developing process" (for example, see Patent Document 1).

In general, the base resin for a chemically amplified resist composition contains a plurality of structural units for improving lithography properties and the like. For example, in the case of a resin composition which exhibits increased solubility in an alkali developing solution by the action of acid, a structural unit containing an acid decomposable group which is decomposed by the action of acid generated from an acid generator component and exhibits increased polarity is used. Further, a structural unit containing a lactone-containing cyclic group or a structural unit containing a polar group such as a hydroxy group is used (for example, see Patent Document 2).

On the other hand, as acid generators usable in a chemically amplified resist composition, various types have been proposed including, for example, onium salt acid generators; oxime sulfonate acid generators; diazomethane acid generators; nitrobenzylsulfonate acid generators; iminosulfonate acid generators; and disulfone acid generators.

Further, as the miniaturization of patterns proceeds, a chemically amplified resist composition further containing an acid diffusion control agent, for obtaining an excellent contrast and for preventing roughness of a resist pattern and pattern collapse, as well as a base component and an acid generator component.

Patent Document 3 discloses a radiation-sensitive resin composition containing a compound which has a characteristic that, at unexposed portions of the resist film, an ion-exchange reaction with acid generated from an acid generator component and the like upon exposure is caused, thereby preventing diffusion of acid; and at exposed portions of the resist film, the compound is decomposed thereby, losing the basicity thereof with respect to acid generated from an acid generator component and the like.

DOCUMENTS OF RELATED ART

Patent Document

[Patent Document 1] Japanese Unexamined Patent Application, First Publication No. 2009-025723
[Patent Document 2] Japanese Unexamined Patent Application, First Publication No. 2003-241385
[Patent Document 3] WO2010/147079

SUMMARY OF THE INVENTION

However, with respect to the radiation-sensitive resin composition described in Patent Document 3, there is a problem that the composition exhibits a low level of sensitivity and the dimension of a resist pattern formed using the composition which has been stored for a certain period after preparation of the composition is very different from the dimension of a resist pattern formed using the resist composition before storage.

The present invention has been developed in light of the circumstances described above, and has an object of providing a resist composition and a method of forming a resist pattern in which the resist composition exhibits a high level of sensitivity, an excellent storage stability and excellent lithography properties.

A first aspect of the present invention for solving the aforementioned problems is a resist composition which generates acid upon exposure and exhibits changed solubility in a developing solution by the action of acid, and which includes a base component (A) which exhibits changed solubility in a developing solution by the action of acid, and a nitrogen-containing compound (N) which has a boiling point of 50 to 200° C., wherein a conjugate acid thereof has a pKa of 0 to 7, and a photodecomposable base (D1).

A second aspect of the present invention is a method of forming a resist pattern, including: forming a resist film using a resist composition according to the first aspect on a substrate, subjecting the resist film to exposure, and subjecting the resist film to developing to form a resist pattern.

According to the present invention, there are provided a resist composition and a method of forming a resist pattern in which the resist composition can exhibits a high level of sensitivity and excellent storage stability and excellent lithography properties.

MODE FOR CARRYING OUT THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

The expression "may have a substituent" means that a case where a hydrogen atom (—H) is substituted with a monovalent group, or a case where a methylene (—CH$_2$—) group is substituted with a divalent group.

The term "exposure" is used as a general concept that includes irradiation with any form of radiation.

An "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid (CH$_2$=CH—COOH) has been substituted with an organic group.

The acrylate ester may have the hydrogen atom bonded to the carbon atom on the α-position substituted with a substituent. The substituent (R$^\alpha$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent (R$^\alpha$) in which the substituent has been substituted with a substituent containing an ester bond (e.g., an itaconic acid diester), or an acrylic acid having the hydrogen atom bonded to the carbon atom on the α-position substituted with a substituent (R$^\alpha$) in which the substituent has been substituted with a hydroxyalkyl group or a group in which the hydroxy group within a hydroxyalkyl group has been modified (e.g., α-hydroxyalkyl acrylate) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent (R$^\alpha$) on the α-position of the aforementioned α-substituted acrylate ester can be mentioned.

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and which may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and which may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" includes styrene itself and compounds in which the hydrogen atom at the α-position of styrene has been substituted with another substituent such as an alkyl group or a halogenated alkyl group.

A "structural unit derived from styrene or a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

<<Resist Composition>>

The resist composition of the first aspect of the present invention is a resist composition which generates acid upon exposure and exhibits changed solubility in a developing solution by the action of acid, and which includes a base component (A) which exhibits changed solubility in a developing solution by the action of acid (hereafter, sometimes referred to as "component (A)"), and a nitrogen-containing compound (N) which has a boiling point of 50 to 200° C. (hereafter, sometimes referred to as "component (N)"), wherein a conjugate acid thereof has a pKa of 0 to 7, and a photodecomposable base (D1) (hereafter, sometimes referred to as "component (D1)").

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

The resist composition of the present invention has a function of generating acid upon exposure, and in the resist composition, the component (A) may generate acid upon exposure, or an additive component other than the component (A) may generate acid upon exposure.

More specifically, the resist composition of the present invention may be a resist composition (1) containing an acid generator component (B) which generates acid upon exposure (hereafter, referred to as "component (B)");

a resist composition (2) in which the component (A) is a component which generates acid upon exposure; or a resist composition (3) in which the component (A) is a component which generates acid upon exposure, and further containing an acid generator component (B).

That is, the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

The resist composition of the present invention is particularly preferably the aforementioned resist composition (1).

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A), a resin, a low molecular weight compound, or a combination thereof may be used.

The component (A) may be a component that exhibits increased solubility in a developing solution under action of acid or a component that exhibits decreased solubility in a developing solution under action of acid.

In the present invention, the component (A) may be a component that generates acid upon exposure.

When the resist composition of the present invention is a "negative resist composition for alkali developing process" that forms a negative-tone resist pattern in an alkali developing process (or a "positive resist composition for solvent developing process" that forms a positive-tone resist pattern in a solvent developing process), as the component (A), a base component (A-2) that is soluble in an alkali developing solution (hereafter, this base component is sometimes referred to as "component (A-2)") is preferably used, and a cross-linking component is further added. In such a resist composition, when acid is generated upon exposure, the action of the acid causes cross-linking between the component (A-2) and the cross-linking component. As a result, the solubility of the resist composition in an alkali developing solution is decreased (the solubility of the resist composition in an organic developing solution is increased). Therefore, in the formation of a resist pattern, by conducting selective exposure of a resist film formed by applying the resist composition to a substrate, the exposed portions become insoluble in an alkali developing solution (soluble in an organic developing solution), whereas the unexposed portions remain soluble in an alkali developing solution (insoluble in an organic developing solution), and hence, a negative resist pattern can be formed by conducting development using an alkali developing solution. On the other hand, when an organic developing solution is used as the developing solution, a positive resist pattern can be formed.

As the component (A-2), a resin that is soluble in an alkali developing solution (hereafter, referred to as "alkali-soluble resin") is used.

Examples of the alkali soluble resin include a resin having a structural unit derived from at least one of α-(hydroxyalkyl) acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin which has a sulfonamide group and may have the hydrogen atom bonded to the carbon atom on the α-position substituted with a substituent or polycycloolefin resin having a sulfonamide group, as disclosed in U.S. Pat. No. 6,949,325; an acrylic resin which may have the hydrogen atom bonded to the carbon atom on the α-position substituted with a substituent and having a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin having a fluorinated alcohol, as disclosed in Japanese Unexamined Patent Application, First Publication No. 2006-259582. These resins are preferable in that a resist pattern can be formed with minimal swelling.

Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linker added is preferably within a range from 1 to 50 parts by weight, relative to 100 parts by weight of the alkali-soluble resin.

In the case where the resist composition of the present invention is a resist composition which forms a positive pattern in an alkali developing process and a negative pattern in a solvent developing process (i.e., a positive type resist composition for alkali developing process) or a resist composition which forms a negative pattern in a solvent developing process (i.e., a negative type resist composition for solvent developing process), it is preferable to use a base component (A-1) (hereafter, referred to as "component (A-1)") which exhibits increased polarity by the action of acid, as a component (A). By using the component (A-1), since the polarity of the base component changes prior to and after exposure, an excellent development contrast can be obtained not only in an alkali developing process, but also in a solvent developing process.

More specifically, in the case of applying an alkali developing process, the component (A-1) is substantially insoluble in an alkali developing solution prior to exposure, but when acid is generated upon exposure, the action of this acid causes an increase in the polarity of the base component, thereby increasing the solubility of the component (A-1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern can be formed by alkali developing.

On the other hand, in the case of a solvent developing process, the component (A-1) exhibits high solubility in an organic developing solution prior to exposure, and when acid is generated upon exposure, the polarity of the component (A-1) is increased by the action of the generated acid, thereby decreasing the solubility of the component (A-1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

In the present invention, the component (A) is preferably a component (A-1).

[Polymeric Compound (A1)]

When the component (A) is component (A-1), the component (A-1) preferably includes a polymeric compound (A1) which has a structural unit (a1) containing an acid decomposable group that exhibits increased polarity by the action of acid (hereafter, sometimes referred to as "component (A1)").

(Structural Unit (a1))

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of acid to form a polar group.

Examples of the polar group include a carboxy group, a hydroxy group, an amino group and a sulfo group (—SO$_3$H). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" include:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes, and the solubility in an alkali developing solution is relatively increased, whereas the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, referred to as "acetal-type acid dissociable group").

[Chemical Formula 1]

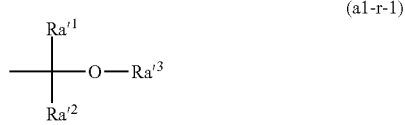

(a1-r-1)

In the formula, Ra$'^1$ and Ra$'^2$ represents a hydrogen atom or an alkyl group; and Ra$'^3$ represents a hydrocarbon group, provided that Ra$'^3$ may be bonded to Ra$'^1$ or Ra$'^2$ to form a ring.

In the formula (a1-r-1), it is preferable that at least one of Ra$'^1$ and Ra$'^2$ represents a hydrogen atom, and it is more preferable that both of Ra$'^1$ and Ra$'^2$ represent a hydrogen atom.

In the case where Ra$'^1$ or Ra$'^2$ is an alkyl group, as the alkyl group, the same alkyl groups as those described above the for the substituent which may be bonded to the carbon atom on the α-position of the aforementioned α-substituted acrylate can be mentioned, and an alkyl group of 1 to 5 carbon atoms is preferable. Specific examples thereof include a linear or branched alkyl group. Specific examples of the linear or branched alkyl group include a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is particularly preferable.

In the formula (a1-r-1), examples of the hydrocarbon group for Ra$'^3$ include a linear, branched or cyclic alkyl group.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group, a neopentyl group, 1,1-diethylpropyl group and 2,2-dimethylbutyl group, and an isopropyl group is desirable.

When Ra$'^3$ is a cyclic hydrocarbon group, the hydrocarbon group may be either an aliphatic group or an aromatic group, and may be either a polycyclic group or a monocyclic group.

As the monocyclic alicyclic hydrocarbon group, a group in which one hydrogen atom has been removed from a monocycloalkane is preferable. The monocycloalkane preferably has 3 to 6 carbon atoms, and specific examples thereof include cyclopentane and cyclohexane.

As the polycyclic alicyclic hydrocarbon group, a group in which one hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

When the cyclic hydrocarbon group for Ra$'^3$ is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which one hydrogen atom has been removed from the aforementioned aromatic hydrocarbon ring (aryl group); and a group in which one hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2, and most preferably 1.

In the case where Ra$'^3$ is bonded to Ra$'^1$ or Ra$'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below. Hereafter, with respect to the acid dissociable group represented by the following formula (a1-r-2), the acid dissociable group constituted of alkyl groups is referred to as "tertiary ester-type acid dissociable group".

[Chemical Formula 2]

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned.

$Ra'^4$ is preferably an alkyl group of 1 to 5 carbon atoms. In the case where $Ra'^5$ and $Ra'^6$ are mutually bonded to form a ring, a group represented by general formula (a1-r2-1) shown below. On the other hand, in the case where $Ra'^4$ to $Ra'^6$ are not mutually bonded and independently represent a hydrocarbon group, the group represented by general formula (a1-r-2) shown below can be mentioned.

[Chemical Formula 3]

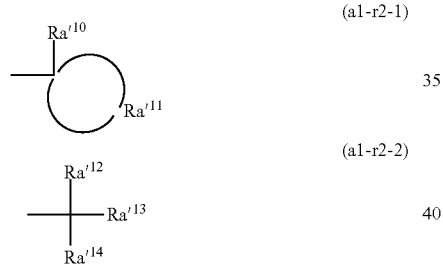

(a1-r2-1)

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r-1), as the aliphatic cyclic group which is formed by $Ra'^{11}$ and the carbon group having $Ra'^{10}$ bonded thereto, the same groups as those described above for the cyclic alkyl group for $Ra'^3$ in the formula (a1-r-1) are preferable.

In the formula (a1-r-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r-2), it is preferable that $Ra'^{13}$ is the same group as described above for the linear, branched or cyclic alkyl group for $Ra'^3$ in the formula (a1-r-1).

Among these, the same cyclic alkyl group as those describe above for $Ra'^3$ is more preferable.

Specific examples of the group represented by formula (a1-r-1) are shown below. In the present specification, "*" in the formula represents a valence bond.

[Chemical Formula 4]

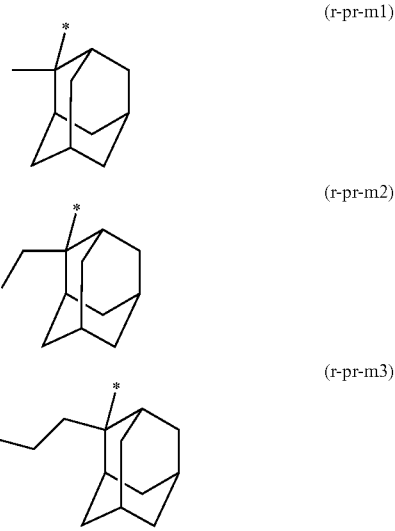

(r-pr-m1)

(r-pr-m2)

(r-pr-m3)

(r-pr-m4)

(r-pr-m5)

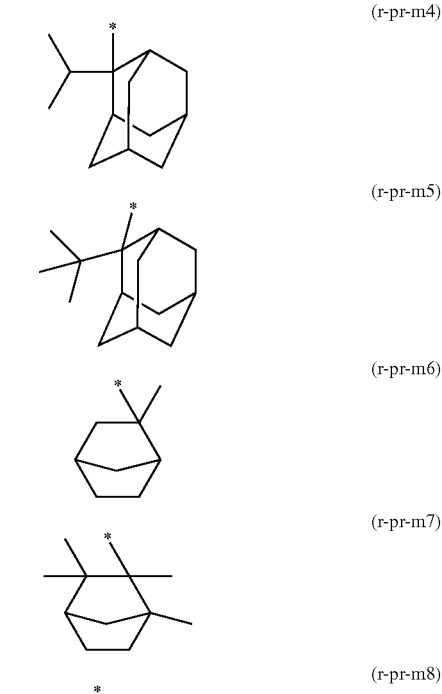

(r-pr-m6)

(r-pr-m7)

(r-pr-m8)

(r-pr-m9)

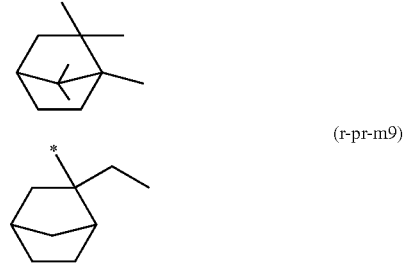

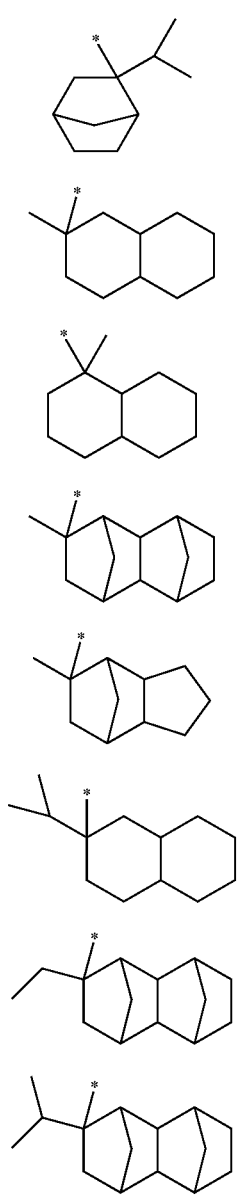
[Chemical Formula 5]
(r-pr-s1)
(r-pr-s2)
(r-pr-s3)
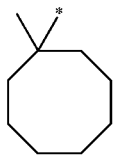 (r-pr-s4)
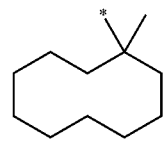 (r-pr-s5)
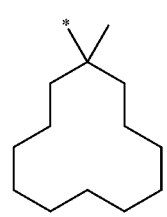 (r-pr-s6)
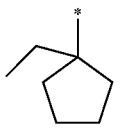 (r-pr-s7)
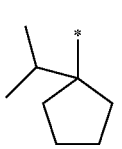 (r-pr-s8)
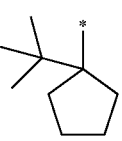 (r-pr-s9)
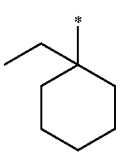 (r-pr-s10)
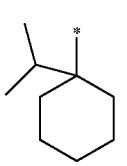 (r-pr-s11)
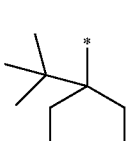 (r-pr-s12)
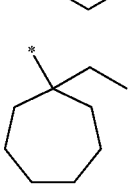 (r-pr-s13)

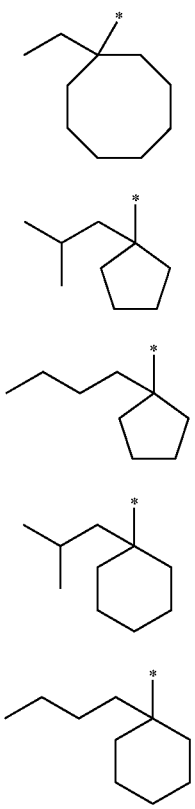
(r-pr-s14)
(r-pr-s15)
(r-pr-s16)
(r-pr-s17)
(r-pr-s18)
Specific examples of the group represented by formula (a1-r-2) are shown below.
[Chemical Formula 6]
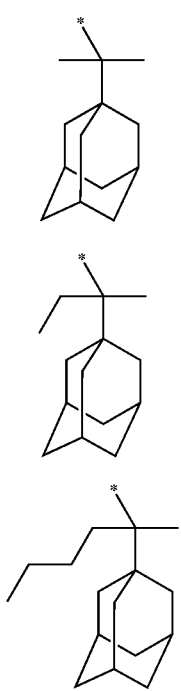
(r-pr-cm1)
(r-pr-cm2)
(r-pr-cm3)
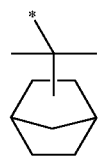 (r-pr-cm4)
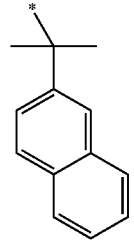 (r-pr-cm5)
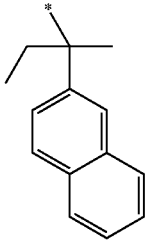 (r-pr-cm6)
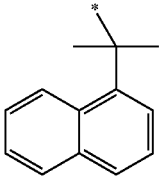 (r-pr-cm7)
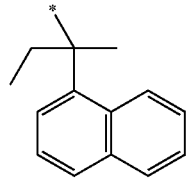 (r-pr-cm8)
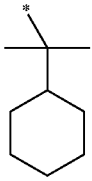 (r-pr-cs1)
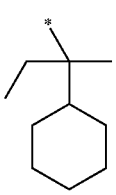 (r-pr-cs2)
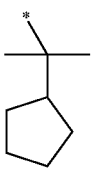 (r-pr-cs3)

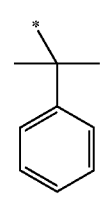 (r-pr-cs4)

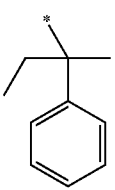 (r-pr-cs5)

 (r-pr-c1)

 (r-pr-c2)

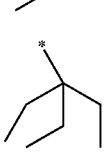 (r-pr-c3)

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 7]

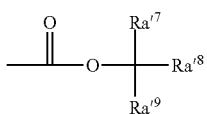 (a1-r-3)

In the formula, $Ra'^7$ to $Ra'^9$ each independently represents an alkyl group.

In the formula (a1-r-3), $Ra'^7$ to $Ra'^9$ is each preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from an acrylamide which contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

Specific examples of preferable structural units for the structural unit (a1) include structural units represented by general formula (a1-1) or (a1-2) shown below.

[Chemical Formula 8]

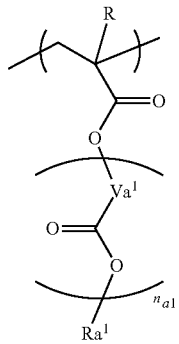

In the formulae, R represents a hydrogen atom, an alkyl group of 1 to 5 carbon atoms or a halogenated alkyl group of 1 to 5 carbon atoms; $Va^1$ represents a divalent hydrocarbon group which may have an ether bond; $n_{a1}$ represents 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_2$ represents 1 to 3; and $Ra^2$ represents an acid dissociable group represented by the aforementioned formula (a1-r-1) or (a1-r-3).

In general formula (a1-1), as the alkyl group of 1 to 5 carbon atoms represented by R, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, $Va^1$ may have an ether bond (—O—) interposed between the carbon atoms of the aforementioned divalent hydrocarbon group. $Va^1$ may have one ether bond or two ether bonds.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic alicyclic hydrocarbon group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 5 to 30 carbon atoms, more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (for example, a group in which one hydrogen atom has been removed from an aryl group within an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atoms, more preferably 1 or 2, and most preferably 1.

In the aforementioned formula (a1-2), the hydrocarbon group for $Wa^1$ having a valency of $n_{a2}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $n_{a2}+1$ is preferably divalent, trivalent or tetravalent, and divalent or trivalent is more preferable.

Specific examples of structural units represented by general formula (a1-1) are shown below. In the formulae shown below, $R^\alpha$ represents a hydrogen atom, a methyl group or a trifluoromethyl group.

[Chemical Formula 9]

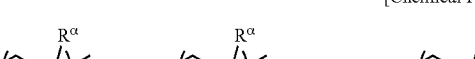

-continued
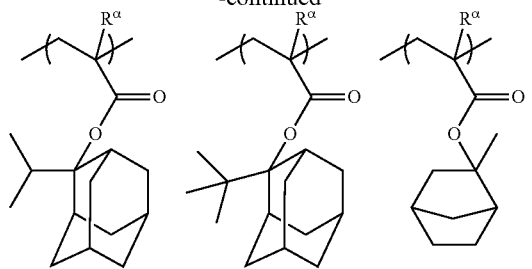
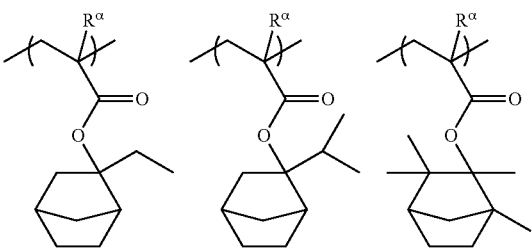
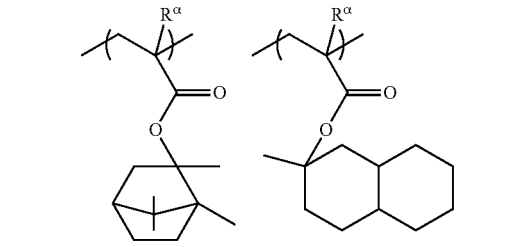
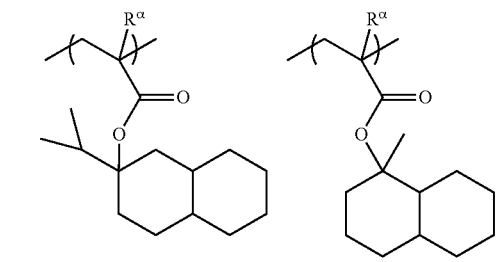
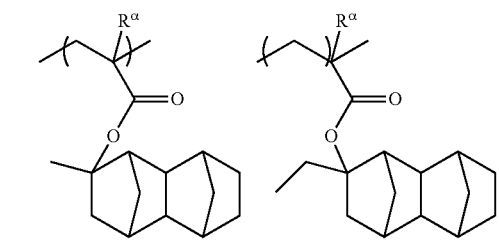
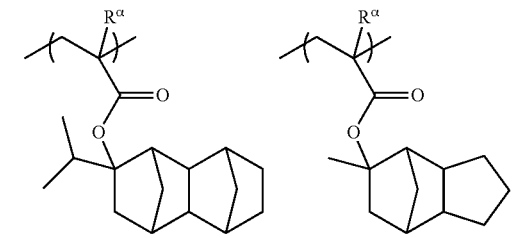
-continued
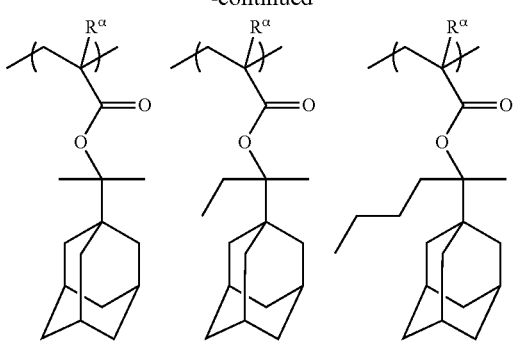
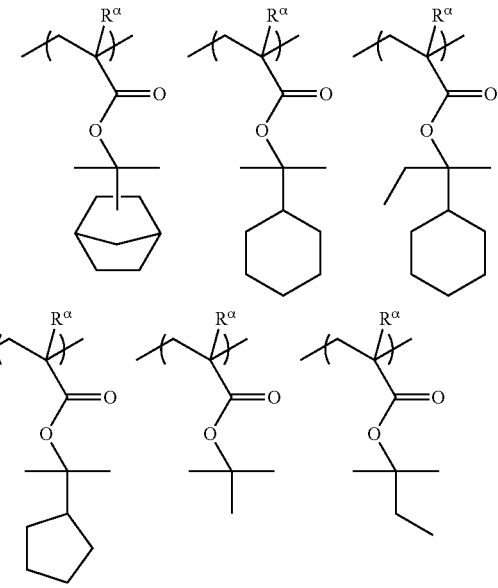
[Chemical Formula 10]
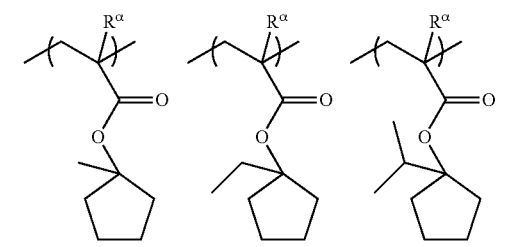
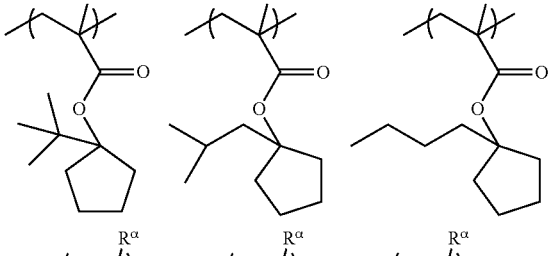
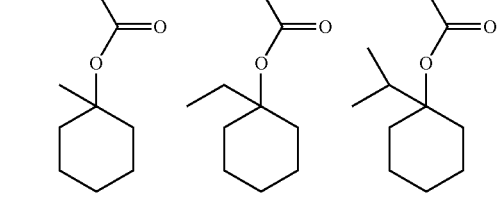

[Chemical Formula 11]
[Chemical Formula 12]
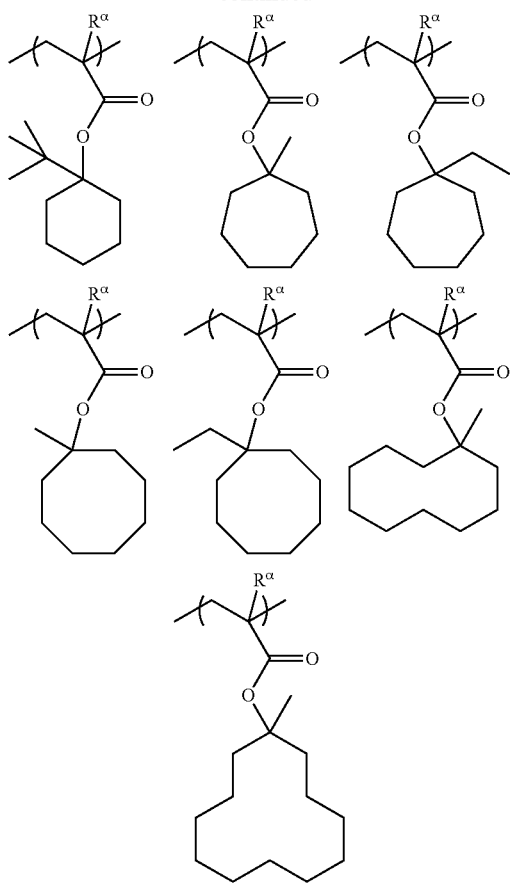
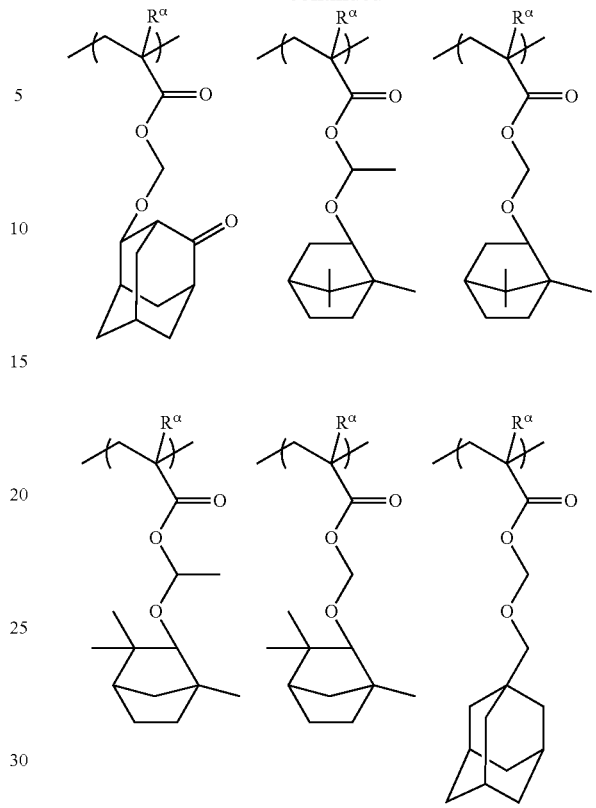
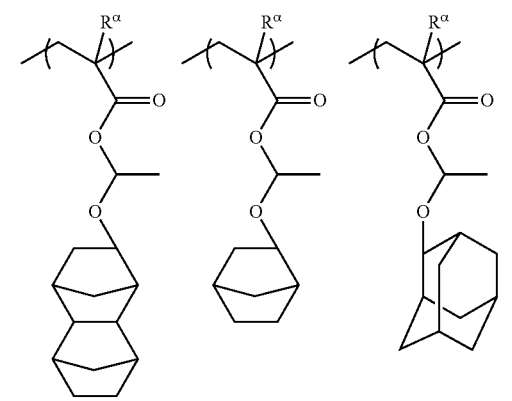
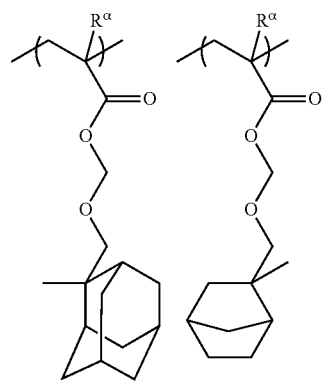
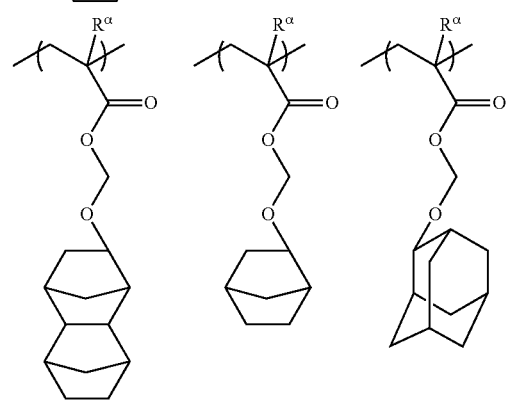
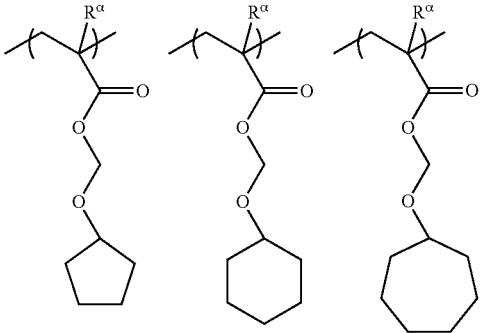

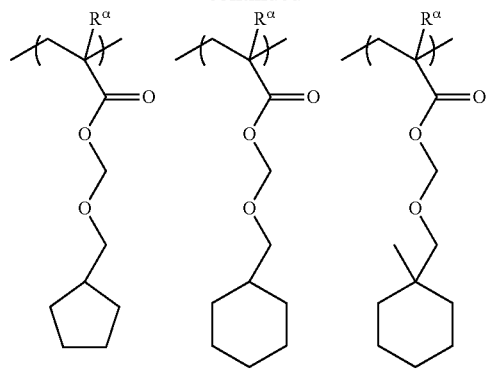
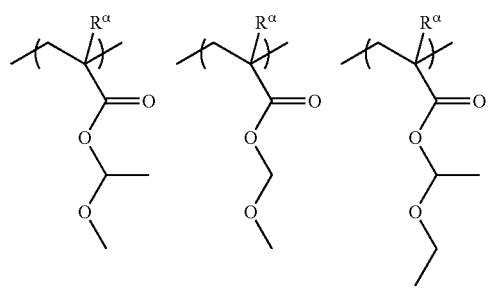
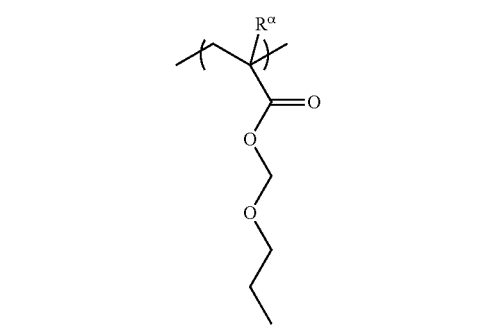
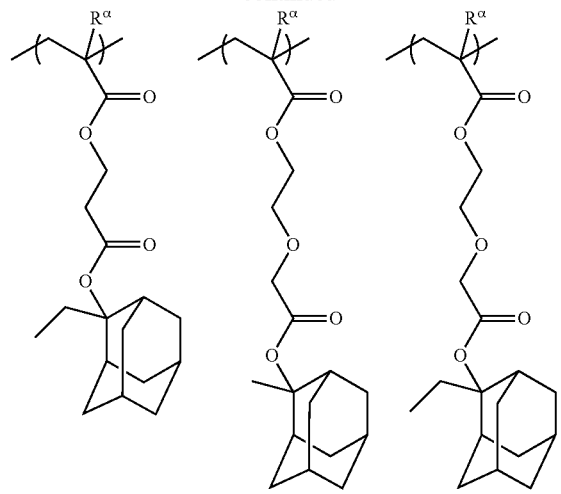
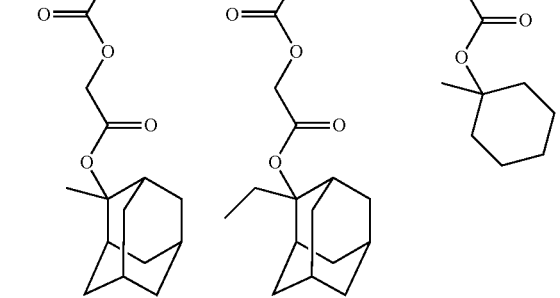
[Chemical Formula 13]
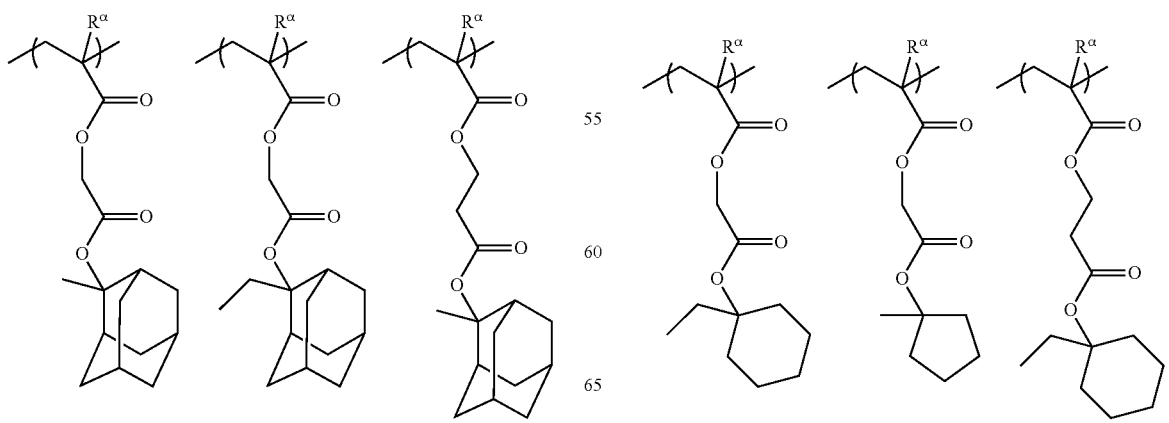

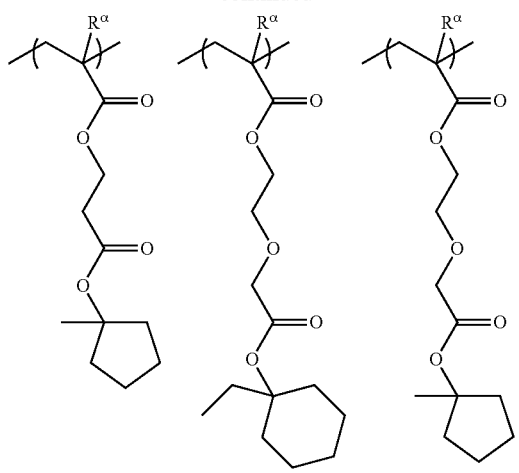
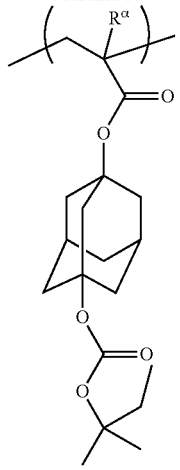
Specific examples of structural units represented by general formula (a1-2) are shown below. In the formulae shown below, $R^\alpha$ represents a hydrogen atom, a methyl group or a trifluoromethyl group.
[Chemical Formula 14]
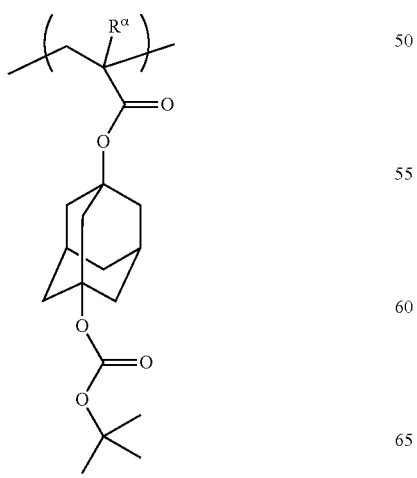
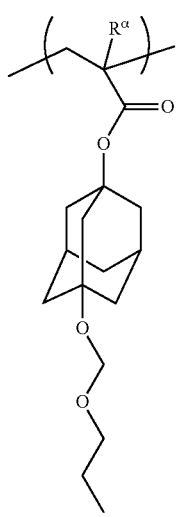

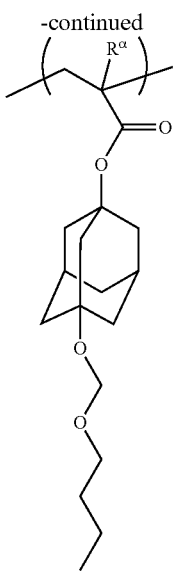
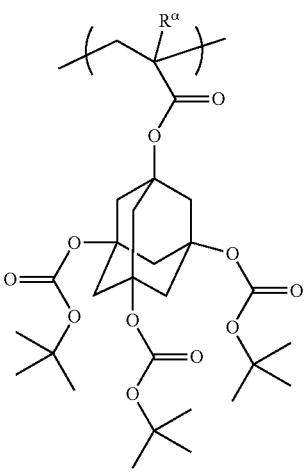
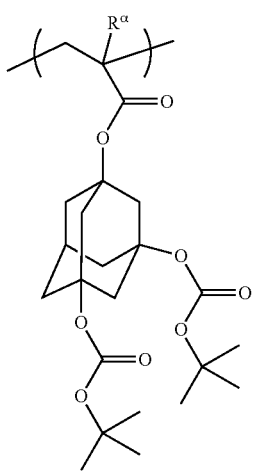

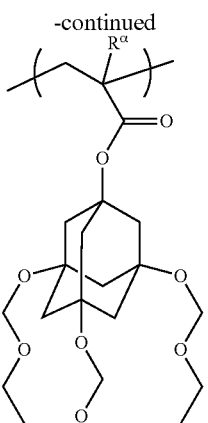
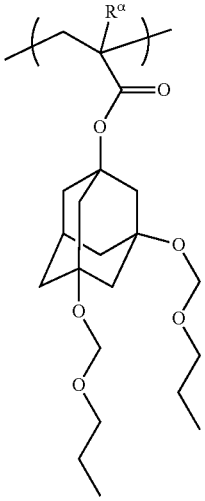

As the structural unit (a1) contained in the component (A1), 1 type of structural unit may be used, or 2 or more types may be used.

In the component (A1), the amount of the structural unit (a1) based on the combined total of all structural units constituting the component (A1) is preferably 20 to 80 mol %, more preferably 20 to 75 mol %, and still more preferably 25 to 70 mol %. When the amount of the structural unit (a1) is at least as large as the lower limit of the above-mentioned range, a pattern can be easily formed, and various lithography properties such as sensitivity, resolution, LWR and the like are improved. On the other hand, when the amount of the structural unit (a1) is no more than the upper limit of the above-mentioned range, a good balance can be achieved with the other structural units.

(Other Structural Units)

The component (A1) may further include a structural unit other than the structural unit (a1), as well as the structural unit (a1). As the other structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used. For example, a structural units (a2) to (a4) shown below can be used.

Structural Unit (a2):

The structural unit (a2) is a structural unit which contains a lactone-containing cyclic group, an —SO$_2$— containing cyclic group or a carbonate-containing cyclic group.

When the component (A1) is used for forming a resist film, the lactone-containing cyclic group, the —SO$_2$— containing cyclic group or the carbonate-containing cyclic group within the structural unit (a2) is effective in improving the adhesion between the resist film and the substrate.

The aforementioned structural unit (a1) which contains a lactone-containing cyclic group, an —SO$_2$— containing cyclic group or a carbonate-containing cyclic group falls under the definition of the structural unit (a2); however, such a structural unit is regarded as a structural unit (a1), and does not fall under the definition of the structural unit (a2).

The term "lactone-containing cyclic group" refers to a cyclic group including a ring containing a —O—C(=O)— structure (lactone ring). The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2) is not particularly limited, and an arbitrary structural unit may be used. Specific examples include structural units represented by general formulae (a2-r-1) to (a2-r-7) shown below.

[Chemical Formula 15]

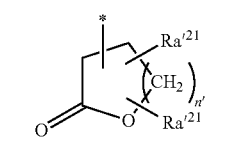
(a2-r-1)

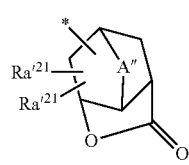
(a2-r-2)

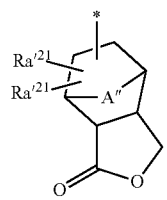
(a2-r-3)

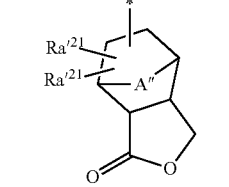
(a2-r-4)

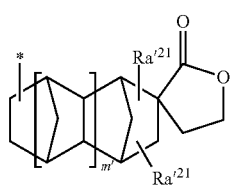
(a2-r-5)

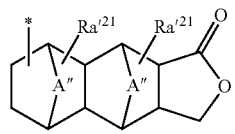
(a2-r-6)

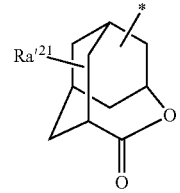

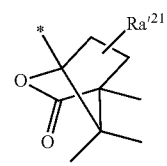
(a2-r-7)

In the formulae, each Ra'$^{21}$ independently represents an alkyl group, an alkoxy group, a halogen atom, a halogenated alkyl group, a hydroxy group, —COOR″, —OC(=O)R″, a hydroxyalkyl group or a cyano group; R″ represents a hydrogen atom or an alkyl group; A″ represents an oxygen atom, a sulfur atom or an alkylene group of 1 to 5 carbon atoms which may contain an oxygen atom (—O—) or a sulfur atom (—S—); n' represents an integer of 0 to 2; and m' represents 0 or 1.

In the formulae (a2-r-2), (a2-r-3) and (a2-r-5), as the alkylene group of 1 to 5 carbon atoms for A″, a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A″, an alkylene group of 1 to 5 carbon atoms or —O— is preferable, more preferably an alkylene group of 1 to 5 carbon atoms, and most preferably a methylene group.

In the formulae (a2-r-1) to (a2-r-7), the alkyl group for Ra'$^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or an ethyl group is preferable, and a methyl group is particularly desirable.

The alkoxy group for Ra'$^{21}$ is preferably an alkoxy group of 1 to 6 carbon atoms.

Further, the alkoxy group is preferably a linear or branched alkoxy group. Specific examples of the alkoxy groups include the aforementioned alkyl groups for Ra'$^{21}$ having an oxygen atom (—O—) bonded thereto.

As examples of the halogen atom for Ra'$^{21}$, a fluorine atom, chlorine atom, bromine atom and iodine atom can be given. Among these, a fluorine atom is preferable.

Examples of the halogenated alkyl group for Ra'$^{21}$ include groups in which part or all of the hydrogen atoms within the aforementioned alkyl groups has been substituted with the aforementioned halogen atoms. As the halogenated alkyl group, a fluorinated alkyl group is preferable, and a perfluoroalkyl group is particularly desirable.

With respect to —COOR" and —OC(═O)R" for Ra'$^{21}$, R" represents a hydrogen atom or an alkyl group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one hydrogen atom has been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one hydrogen atom has been removed from a monocycloalkane such as cyclopentane and cyclohexane; and groups in which one hydrogen atom has been removed from a polycycloalkane such as adamantane, norbornane, isobornane, tricyclodecane or tetracyclododecane.

The hydroxyalkyl group for Ra'$^{21}$ preferably has 1 to 6 carbon atoms, and specific examples thereof include the aforementioned alkyl groups for the substituent in which at least one hydrogen atom has been substituted with a hydroxy group.

Specific examples of the group represented by the aforementioned general formulae (a2-r-1) to (a2-r-7) are shown below.

[Chemical Formula 16]

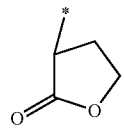

(r-Ic-1-1)

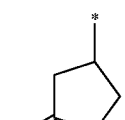

(r-Ic-1-2)

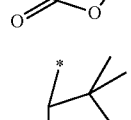

(r-Ic-1-3)

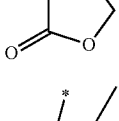

(r-Ic-1-4)

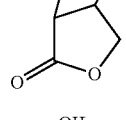

(r-Ic-1-5)

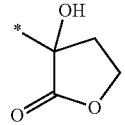

-continued (r-Ic-1-6)

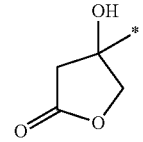

(r-Ic-1-7)

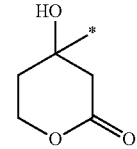

(r-Ic-2-1)

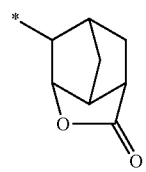

(r-Ic-2-2)

(r-Ic-2-3)

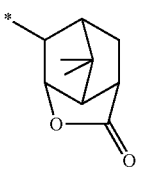

(r-Ic-2-4)

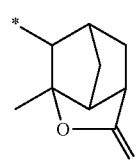

(r-Ic-2-5)

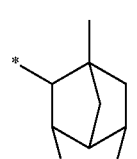

(r-Ic-2-6)

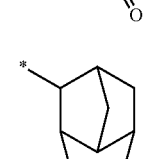

(r-Ic-2-7)

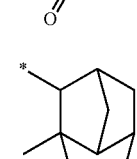

-continued
(r-Ic-2-8)
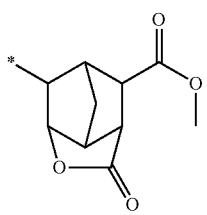
(r-Ic-2-9)
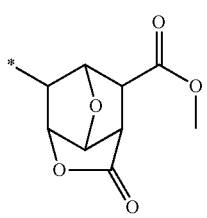
(r-Ic-2-10)
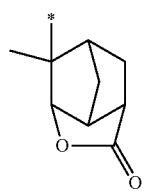
(r-Ic-2-11)
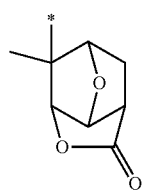
(r-Ic-2-12)
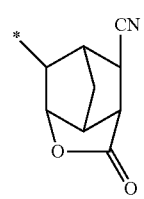
(r-Ic-2-13)
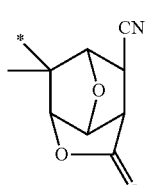
(r-Ic-3-1)
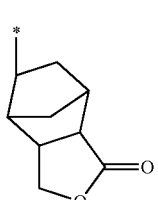
(r-Ic-3-2)
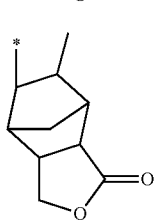
-continued
(r-Ic-3-3)
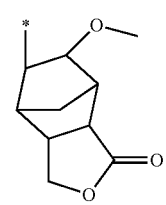
(r-Ic-3-4)
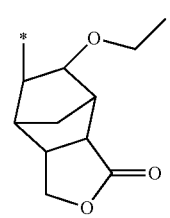
(r-Ic-3-5)
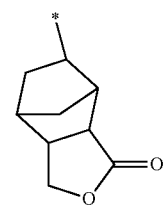
[Chemical Formula 17]
(r-Ic-4-1)
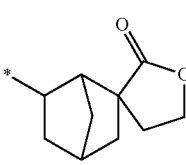
(r-Ic-4-2)
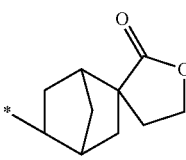
(r-Ic-4-3)
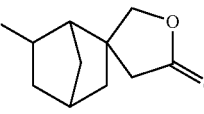
(r-Ic-4-4)
(r-Ic-4-5)
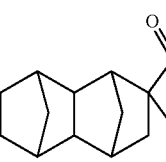
(r-Ic-4-6)
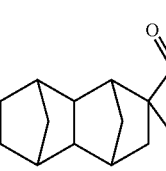

(r-Ic-4-7)
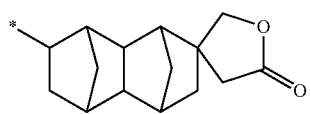

(r-Ic-4-8)
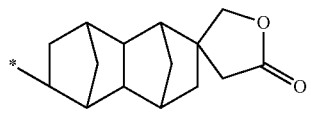

(r-Ic-4-9)
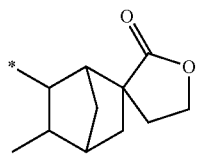

(r-Ic-5-1)
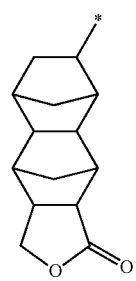

(r-Ic-5-2)
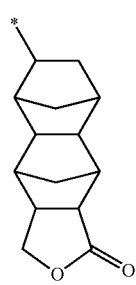

(r-Ic-5-3)
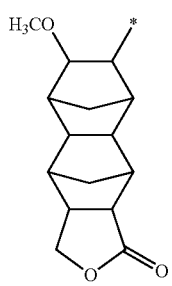

(r-Ic-5-4)
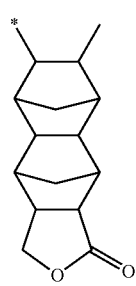

(r-Ic-6-1)
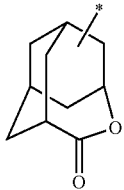

(r-Ic-7-1)
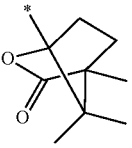

An "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

More specific examples of the —SO$_2$— containing cyclic group include groups represented by general formulae (a5-r-1) to (a5-r-4) shown below.

[Chemical Formula 18]

(a5-r-1)
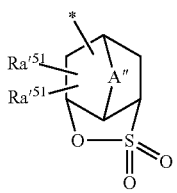

(a5-r-2)
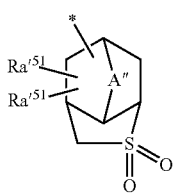

(a5-r-3)
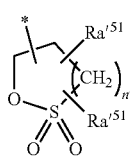

(a5-r-4)

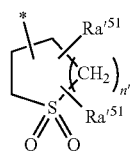

In the formulae, each Ra'$^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom (—O—) or a sulfur atom (—S—); and n' represents an integer of 0 to 2.

In general formulae (a5-r-1) to (a5-r-4), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for Ra'$^{51}$ include the same groups as those described above in the explanation of Ra'$^{21}$ in the general formulae (a2-r-1) to (a2-r-7).

Specific examples of the group represented by the aforementioned general formulae (a5-r-1) to (a5-r-4) are shown below. In the formulae shown below, "Ac" represents an acetyl group.

[Chemical Formula 19]

(r-s1-1-1)

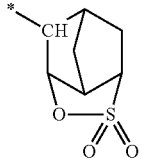

(r-s1-1-2)

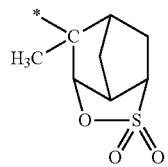

(r-s-1-1-3)

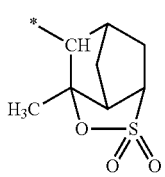

(r-s1-1-4)

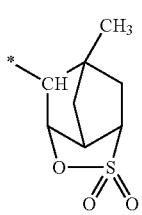

(r-s1-1-5)

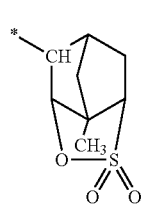

(r-s1-1-6)

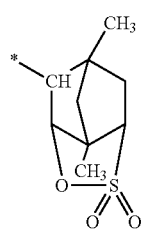

(r-s1-1-7)

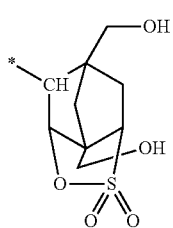

(r-s1-1-8)

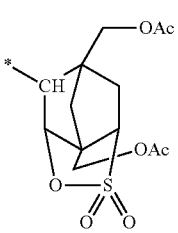

(r-s1-1-9)

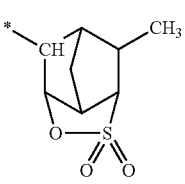

(r-s1-1-10)

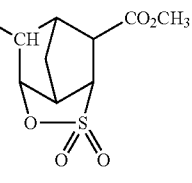

(r-s1-1-11)

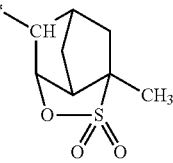

(r-s1-1-12)

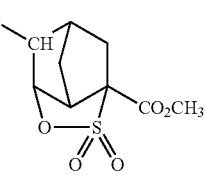

-continued
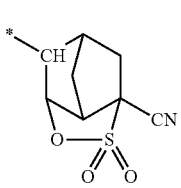 (r-s1-1-13)
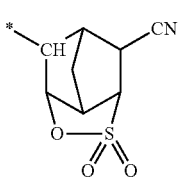 (r-s1-1-14)
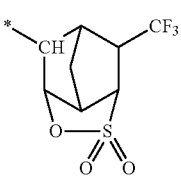 (r-s1-1-15)
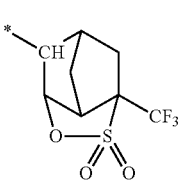 (r-s1-1-16)
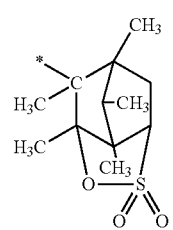 (r-s1-1-17)
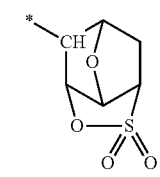 (r-s1-1-18)
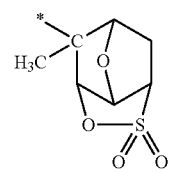 (r-s1-1-19)
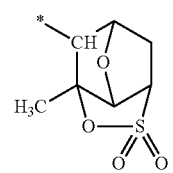 (r-s1-1-20)
-continued
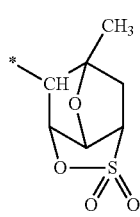 (r-s1-1-21)
[Chemical Formula 20]
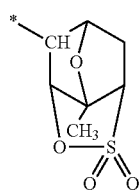 (r-s1-1-22)
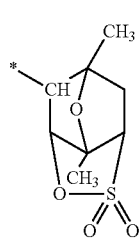 (r-s1-1-23)
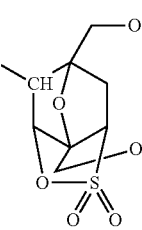 (r-s1-1-24)
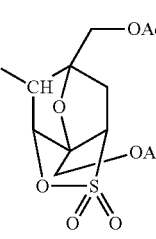 (r-s1-1-25)
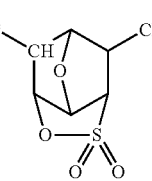 (r-s1-1-26)
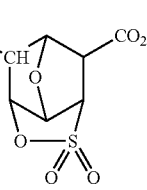 (r-s1-1-27)

(r-s1-1-28)
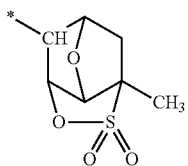

(r-s1-1-29)
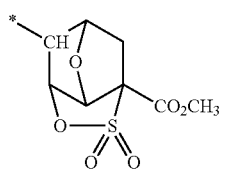

(r-s1-1-30)
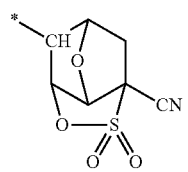

(r-s1-1-31)
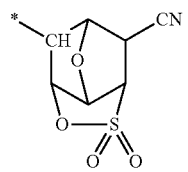

(r-s1-1-32)
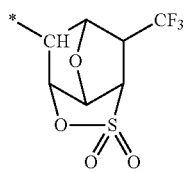

(r-s1-1-33)
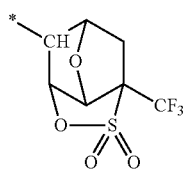

[Chemical Formula 21]

(r-s1-2-1)
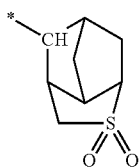

(r-s1-2-2)
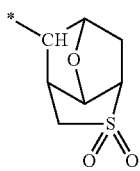

(r-s1-3-1)
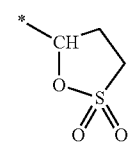

(r-s1-4-1)
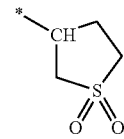

The term "carbonate-containing cyclic group" refers to a cyclic group including a ring containing a —O—C(=O)—O— structure (carbonate ring) in the ring skeleton thereof. The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used. Specific examples include groups represented by general formulae (ax3-r-1) to (ax3-r-3) shown below.

[Chemical Formula 22]

(ax3-r-1)
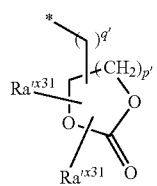

(ax3-r-2)
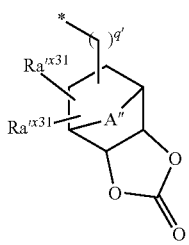

(ax3-r-3)
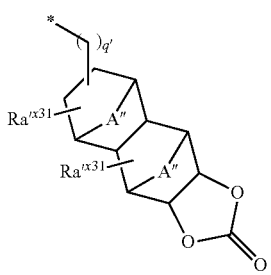

In the formulae, each $Ra'^{x31}$ independently represents a hydrogen atom, an alkyl group, an alkoxy group, a halogen atom, a halogenated alkyl group, a hydroxy group, —COOR″, —OC(=O)R″, a hydroxyalkyl group or a cyano group; R″ represents a hydrogen atom or an alkyl group; A″ represents an oxygen atom, a sulfur atom or an alkylene group of 1 to 5 carbon atoms which may contain an oxygen atom (—O—) or a sulfur atom (—S—); p′ represents an integer of 1 to 3; and q′ represents 0 or 1.

In general formulae (ax3-r-1) to (ax3-r-3), A″ is the same as defined for A″ in general formulae (a2-r-2), (a2-r-3) and (a2-r-5).

Examples of the alkyl group, alkoxy group, halogen atom, halogenated alkyl group, —COOR″, —OC(=O)R″ and hydroxyalkyl group for Ra′$^{31}$ include the same groups as those described above in the explanation of Ra′$^{21}$ in the general formulae (a2-r-1) to (a2-r-7).

Specific examples of the group represented by the aforementioned general formulae (ax3-r-1) to (ax3-r-3) are shown below.

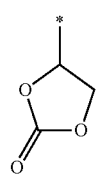
(r-cr-1-1)

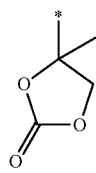
(r-cr-1-2)

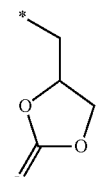
(r-cr-1-3)

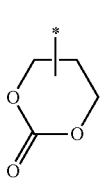
(r-cr-1-4)

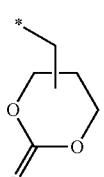
(r-cr-1-5)

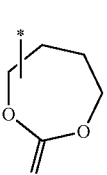
(r-cr-1-6)

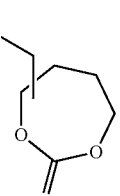
(r-cr-1-6)

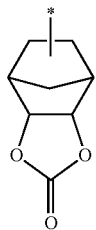
(r-cr-2-1)

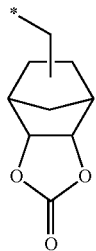
(r-cr-2-2)

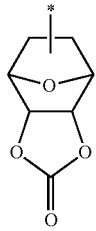
(r-cr-2-3)

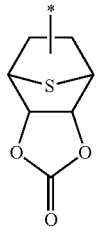
(r-cr-2-4)

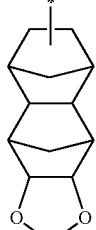
(r-cr-3-1)

(r-cr-3-2)

(r-cr-3-3)

(r-cr-3-4)

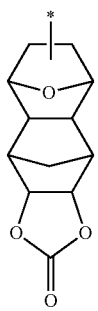

(r-cr-3-5)

The structural unit (a2) is preferably a structural unit represented by general formula (a2-1) shown below.

[Chemical Formula 24]

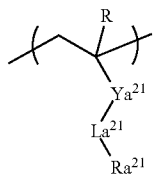

(a2-1)

In the formula, R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO—, —CON(R')—, —OCO—, —CONHCO— or —CONHCS—; R' represents a hydrogen atom or a methyl group, provided that when $La^{21}$ represents —O—, $Ya^{21}$ does not represent —CO—; and $Ra^{21}$ represents a lactone-containing cyclic group, a carbonate-containing cyclic group or an —$SO_2$— containing cyclic group.

In the formula (a2-1), R is the same as defined above.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given.

Specific examples of the linear or branched aliphatic hydrocarbon group include the same group as exemplified above for $Va^1$ in the aforementioned formula (a1-1).

The linear or branched aliphatic hydrocarbon group may or may not have a substituent. Examples of the substituent include a fluorine atom, a fluorinated alkyl group of 1 to 5 carbon atoms, and a carbonyl group.

As examples of the hydrocarbon group containing a ring in the structure thereof, a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic group is interposed within a linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for $Va^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—

Specific examples of the aromatic hydrocarbon group as a divalent hydrocarbon group include the same group as exemplified above for $Va^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is most desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O— and a group represented by general formula —$Y^{21}$—O—$Y^{22}$—, —$Y^{21}$—O—, —$Y^{21}$—C(=O)—O—, —[$Y^{21}$—C(=O)—O]$_{m''}$—$Y^{22}$— or —$Y^{21}$—O—C(=O)—$Y^{22}$— [in the formulae, each of $Y^{21}$ and $Y^{22}$ independently represents a divalent hydrocarbon group which may have a substituent, O represents an oxygen atom, and m" represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula —$Y^{21}$—O—$Y^{22}$—, —$Y^{21}$—O—, —$Y^{21}$—C(=O)—O—, —[$Y^{21}$—C(=O)—O]$_{m''}$—$Y^{22}$— or —$Y^{21}$—O—C(=O)—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m''}$—$Y^{22}$—, m" represents an integer of 0 to 3, preferably an integer of 0 to 2, more preferably 0 or 1, and particularly preferably 1. Namely, it is particularly desirable that the group represented by the formula —[$Y^{21}$—C(=O)—O]$_{m''}$—$Y^{22}$— is a group represented by the formula —$Y^{21}$—C(=O)—O—$Y^{22}$—.

Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

$Ya^{21}$ preferably represents an ester bond [—C(=O)—O—], an ether bond (—O—), a linear or branched alkylene group, a combination of these, or a single bond.

In the formula (a2-1), $Ra^{21}$ represents a lactone-containing cyclic group, an —SO$_2$— containing cyclic group or a carbonate-containing cyclic group.

Preferable examples of the lactone-containing cyclic group, the —SO$_2$— containing cyclic group and the carbonate-containing cyclic group for $Ra^{21}$ include groups represented by the aforementioned formula (a2-r-1) to (a2-r-7), groups represented by general formulae (a5-r-1) to (a5-r-4) and groups represented by general formulae (ax3-r-1) to (ax3-r-3).

Among the examples shown above, a lactone-containing cyclic group or —SO$_2$— containing cyclic group is preferable, a group represented by the general formula (a2-r-1), (a2-r-2) or (a5-r-1) is more preferable, and a group represented by any one of the chemical structures (r-lc-1-1) to (r-lc-1-7), (r-lc-2-1) to (r-lc-2-13), (r-sl-1-1) and (r-sl-1-18) is still more preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 10 to 70 mol %, still more preferably 10 to 65 mol %, and particularly preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

Structural Unit (a3):

The structural unit (a3) is a structural unit containing a polar group-containing aliphatic hydrocarbon group (provided that the structural units that fall under the definition of structural units (a1) and (a2) are excluded).

When the component (A1) includes the structural unit (a3), it is presumed that the hydrophilicity of the component (A1) is enhanced, thereby contributing to improvement in resolution.

Examples of the polar group include a hydroxyl group, a cyano group, a carboxyl group, or a hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups may be monocyclic or polycyclic, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that includes an aliphatic polycyclic group that contains a hydroxyl group, a cyano group, a carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulae (a3-1), (a3-2) and (a3-3) shown below are preferable.

[Chemical Formula 25]

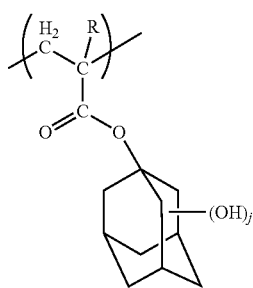

(a3-1)

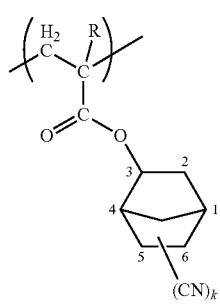

(a3-2)

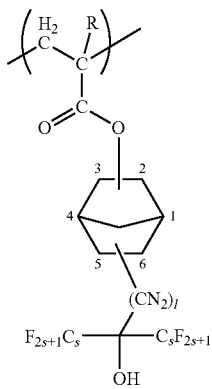

(a3-3)

In the formulae, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

When the component (A1) contains the structural unit (a3), the amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

Structural Unit (a4):

The structural unit (a4) is a structural unit containing an acid non-dissociable, aliphatic cyclic group.

When the component (A1) includes the structural unit (a4), dry etching resistance of the resist pattern to be formed are improved. Further, the hydrophobicity of the component (A1) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of the acid (e.g., acid generated from the components (A) or a component (B) described later) upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include structural units represented by general formulae (a4-1) to (a4-7) shown below.

[Chemical Formula 26]

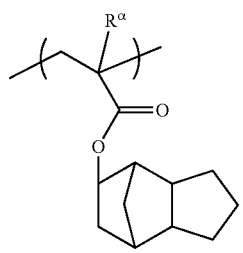
(a4-1)

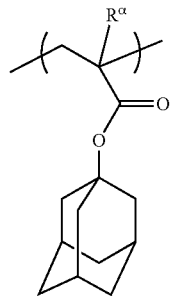
(a4-2)

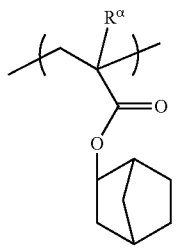
(a4-3)

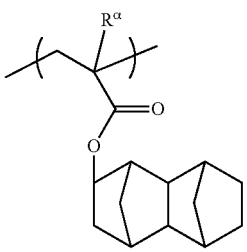
(a4-4)

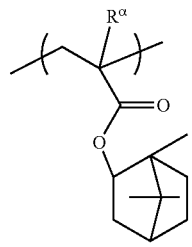
(a4-5)

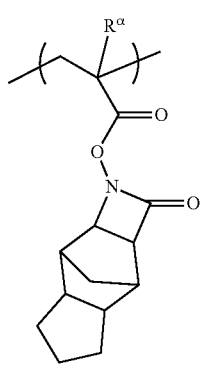
(a4-6)

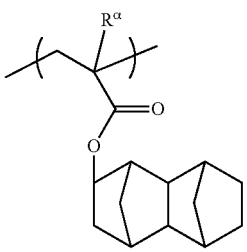
(a4-7)

In the formulae, $R^\alpha$ is the same as defined above.

As the structural unit (a4) contained in the component (A1), 1 type of structural unit may be used, or 2 or more types may be used.

When the component (A1) includes the structural unit (a4), the amount of the structural unit (a4) based on the combined total of all structural units constituting the component (A1) is preferably 1 to 30 mol %, and more preferably 3 to 20 mol %. When the amount of the structural unit (a4) is at least as large as the lower limit of the above-mentioned range, the effect of using the structural unit (a4) can be satisfactorily achieved. On the other hand, when the amount of the structural unit (a4) is no more than the upper limit of the above-mentioned range, a good balance can be achieved with the other structural units.

The component (A1) is a polymer containing at least the structural unit (a1), and preferably a copolymer having the one or more structural units selected from structural units (a2) to (a4), as well as the structural unit (a1).

Specific examples of the copolymer include a copolymer consisting of a repeating structure of a structural unit (a1) and a structural unit (a2); a copolymer consisting of a repeating structure of a structural unit (a1) and a structural unit (a3); a copolymer consisting of a repeating structure of a structural unit (a1), a structural unit (a2) and a structural unit (a3); and a copolymer consisting of a repeating structure of a structural unit (a1), a structural unit (a2), a structural unit (a3) and a structural unit (a4).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved, such as improvement in MEF and circularity, and reduction of roughness.

In the resist composition of the present invention, the component (A-1) may contain "a base component which exhibits increased polarity under action of acid" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. As the component (A2), one type of base component may be used, or two or more types of base components may be used in combination.

In the resist composition of the present invention, as the component (A), one type may be used, or two or more types may be used in combination.

In the resist composition of the present invention, the amount of the component (A) can be appropriately adjusted depending on the thickness of the resist film to be formed, and the like.

<Component (N)>

The resist composition of the present invention include a nitrogen-containing compound (N) which has a boiling point of 50 to 200° C., wherein a conjugate acid thereof has a pKa of 0 to 7.

In the present invention, the "boiling point" means the temperature at which boiling occurs under a pressure of 1 atm, and the temperature is recited in Chemical Database.

In the present invention, pKa refers to an acid dissociation constant which is generally used as a parameter which shows the acid strength of an objective substance. The pKa value of the conjugate acid of the component (N) can be determined by a conventional method. Alternatively, the pKa value can be calculated by simulation using a conventional software such as "ACD/Labs" (trade name; manufactured by Advanced Chemistry Development, Inc.).

The boiling point of the component (N) is 50 to 200° C., preferably 55 to 180° C. and more preferably 60 to 160° C.

When the boiling point of the component (N) is at least as large as the lower limit of the above-mentioned range, the resist composition can be easily prepared. When the boiling point of the component (N) is less than the lower limit of the above-mentioned range, the component (N) is easily vaporized and therefore, it becomes difficult to control the concentration of the component (N). On the other hand, when the boiling point of the component (N) is no more than the upper limit of the above-mentioned range, an excellent sensitivity tends to be obtained during forming a resist pattern.

The pKa of the conjugate acid of the component (N) (i.e., the calculated value using a software "ACD/Labs") is preferably 0 to 7, preferably 0.5 to 7, and more preferably 1 to 7.

When the pKa of the conjugate acid of the component (N) is within the above-mentioned range, dimensional variation between the dimension of the resist pattern formed using a resist composition prior to storage and the dimension of the resist pattern formed using a resist composition after storage becomes small, and therefore, the level of storage stability becomes excellent.

Further, when the pKa of the conjugate acid of the component (N) is less than the lower limit of the above-mentioned range, the effect of suppressing change with the passage of time with respect to the dimensional variation of a resist pattern is less likely to be obtained. On the other hand, when the pKa of the conjugate acid of the component (N) is greater than the upper limit of the above-mentioned range, an unstable compound is likely to be decomposed under basic condition.

The component (N) is not particularly limited, as long as it has a boiling point of 50 to 200° C., and the conjugate acid thereof has a pKa of 0 to 7.

Preferable examples of the nitrogen-containing compound (N) include at least one compound selected from the group consisting of a compound represented by general formula (N1) shown below (hereafter, sometimes referred to as "component (N1)") and a compound represented by general formula (N2) shown below (hereafter, sometimes referred to as "component (N2)").

[Chemical Formula 27]

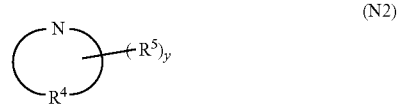

In the formulae, $R^1$ to $R^3$ each independently represents a hydrogen atom, an alkyl group of 1 to 15 carbon atoms which may have a substituent, a fluorinated alkyl group which may have a substituent or an aryl group which may have a substituent, and two of $R^1$ to $R^3$ may be mutually bonded to form a ring, provided that, at least one of $R^1$ to $R^3$ represents a fluorinated alkyl group, an aryl group or an aryl group having a fluorine atom; $R^4$ represents a group which forms an aromatic ring with the nitrogen atom bonded to the $R^4$ group; $R^5$ represents an alkyl group of 1 to 15 carbon atoms which may have a substituent or a halogen atom; and y represents an integer of 0 to 5.

[A Compound Represented by General Formula (N1): Component (N1)]

In the aforementioned formula (N1), $R^1$ to $R^3$ each independently represents a hydrogen atom, an alkyl group of 1 to 15 carbon atoms which may have a substituent, a fluorinated alkyl group which may have a substituent or aryl group which may have a substituent.

As the alkyl group for $R^1$ to $R^3$, a linear, branched or cyclic alkyl group can be mentioned, and each of alkyl groups for $R^1$ to $R^3$ has 1 to 15 carbon atoms, preferably 1 to 10, and more preferably 1 to 5.

The alkyl group for $R^1$ to $R^3$ includes the same linear, branched or cyclic alkyl group as those described above as the hydrocarbon group for $Ra^{t3}$ in the formula (a1-r-1).

Among these, as the alkyl group for $R^1$ to $R^3$, a linear or branched alkyl group is preferable, and more preferably a linear alkyl group. Specific examples of the alkyl group for $R^1$ to $R^3$ include a methyl group, an ethyl group, a propyl group, an isopropyl group, an n-butyl group, an isobutyl group, a tert-butyl group, a pentyl group, an isopentyl group and a neopentyl group.

The fluorinated alkyl group for $R^1$ to $R^3$ is preferably a group in which part or all of the hydrogen atoms within the aforementioned alkyl group for $R^1$ to $R^3$ have been substituted with a fluorine atom. The fluorination ratio (number of hydrogen atoms substituted with a fluorine atom/number of all hydrogen atoms within the alkyl group prior to substitution At least two of $R^1$ to $R^3$ may be mutually bonded to form a ring. Examples of the formed ring include a pyrrolidine ring, a piperidine ring and a hexamethylene imine ring.

Provided that, at least one of $R^1$ to $R^3$ represents a fluorinated alkyl group an aryl group or an aryl group having a fluorine atom, and a fluorinated alkyl group is preferable, and a fluorinated alkyl group of 1 to 5 carbon atoms is more preferable. As a result, the component (N) tends to exhibit weak basicity, and therefore, the storage stability of the resist composition is further improved.

When at least one of $R^1$ to $R^3$ represents a fluorinated alkyl group an aryl group or an aryl group having a fluorine atom, it is preferable that the remaining two groups are hydrogen atoms or alkyl groups, it is more preferable that the remaining two groups are hydrogen atoms, and it is still more preferable that the remaining two groups are the same groups.

Examples of the component (N1) include a fluorinated monoalkylamine in which part or all of carbon atoms at larger or equal to second position (i.e., 2nd to 8th positions) of the alkyl group within a primary amine of 3 to 8 carbon atoms have been fluorinated; a fluorinated dialkylamine in which part or all of carbon atoms at larger or equal to second position (i.e., 2nd to 8th positions) of the alkyl group within the dialkyl amine of 2 to 8 carbon atoms have been fluorinated, such as bis(2,2,2-trifluoroethyl)amine (boiling point: 81° C.) and bis (2,2,3,3,3-pentafluoropropyl)amine (boiling point: 103° C.); a cyclic fluorinated alkylamine such as 1-(2,2,2-trifluoroethyl)pyrrolidine; a primary or secondary (substituted) aromatic amine such as aniline (boiling point: 184° C., pKa: 4.87), methylphenylamine (boiling point: 195° C.), 2-methoxy-N-methylaniline (boiling point: 115° C.), m-methoxyaniline (boiling point: 80° C.) and methylaniline (boiling point: 199 to 203° C.); and fluorinated derivatives thereof (fluorinated aromatic amine). Preferable examples thereof include a fluorinated mooalkylamine or a fluorinated aromatic amine.

[Chemical Formula 28]

| | | | | |
|---|---|---|---|---|
| $H_2N-CF_2-CF_2-CF_3$ | $H_2N-CF_2CF_3$ | $H_2N-CF_2CF_2CF_2CF_3$ | $H_2N-CF_2(CF_2)_5CF_3$ |
| pKa 5.89 | 5.89 | 5.92 | 6.05 |
| boiling point 69 | 50 | 87 | 151 |

| 2-fluoroaniline | 3-fluoroaniline | 4-fluoroaniline |
|---|---|---|
| pKa 3.20 | 3.58 | 4.66 |
| boiling point 182 to 183 | 188 | 188 | with fluorine atoms) of the fluorinated alkyl group is preferably 50% or more, and more preferably 75% or more.

As the aryl group for $R^1$ to $R^3$, groups in which one hydrogen atom has been removed from an aromatic hydrocarbon ring, such as benzene, fluorene, naphthalene, anthracene and phenanthrene, can be mentioned, and a phenyl group or a naphthyl group is preferable.

The alkyl group, the fluorinated alkyl group and the aryl group for $R^1$ to $R^3$ may have a substituent. Examples of substituents include an alkoxy group, a hydroxy group, a carbonyl group and —O—.

[A Compound Represented by General Formula (N2): Component (N2)]

In the formula (N2), $R^4$ is an aromatic group which forms a ring with the nitrogen atom having the $R^4$ group bonded thereto. Specific examples of $R^4$ include =CH—, =C<(quaternary carbon), —O—, —S— and =N—. The hydrogen atom within =CH— may be substituted with a substituent. Examples of the formed ring include an azole ring, a pyridine ring, a pyrimidine ring, an azepine ring, a pyrazine ring, a quinoline ring and a benzoquinoline ring. Further, the ring may contain an oxygen atom in the ring skeleton thereof, and specific examples of preferable rings which contain an oxygen atom include an oxazole ring and an isooxazole ring. The aromatic ring is preferably 4 to 7-membered ring, more preferably 4 to 6-membered ring and still more preferably 6-membered ring.

$R^5$ represents an alkyl group of 1 to 15 carbon atoms which may have a substituent or a halogen atom.

As the alkyl group of 1 to 15 carbon atoms for $R^5$ which may have a substituent, the same alkyl groups of 1 to 15 carbon atoms which may have a substituent as those described above for $R^1$ to $R^3$ in the aforementioned formula (N1) can be used. Among these, an alkyl group of 1 to 5 carbon atoms is preferable.

Examples of the halogen atom for $R^5$ include a fluorine atom, a chlorine atom, a bromine atom and an iodine atom, and a fluorine atom is particularly desirable.

y represents an integer of 0 to 5, and preferably an integer of 0 to 2 and particularly preferably 2.

Specific examples of component (N2) are shown below.

[Chemical Formula 29]

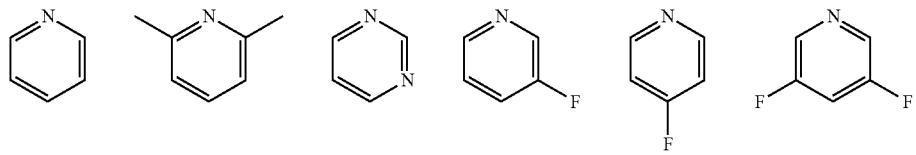

| pKa | 5.23 | 6.67 | 1.78 | 2.81 | 4.15 | 0.39 |
|---|---|---|---|---|---|---|
| boiling point | 116 | 144 | 124 | 107 | 104 | 92.5 |

As the component (N), one type of compound may be used, or two or more types may be used in combination.

As the component (N), it is preferable that the component (N1) and the component (N2) are used in combination. By using the component (N1) and the component (N2) in combination, dimensional variation between the dimension of the resist pattern formed using a resist composition prior to storage and the dimension of the resist pattern formed using a resist composition after storage becomes small, and hence, the level of storage stability becomes excellent. In this case, the blend ratio (weight ratio) of the components (N1) and (N2), represented by formula [the component (N1)/the component (N2)], is preferably 95/5 to 5/95, more preferably 70/30 to 30/70.

In the resist composition, the amount of the component (N) relative to 100 parts by weight of the component (A) is preferably 0.05 to 30 parts by weight, and more preferably 0.05 to 20 parts by weight and
still more preferably 0.05 to 15 parts by weight.

When the amount of the component (N) is at least as large as the lower limit of the above-mentioned range, the effects of the present invention can be reliably obtained.

<Component (D1)>

The resist composition of the present invention includes a photodecomposable base (D1).

The component (D1) functions as a quencher (i.e., acid diffusion control agent) which traps the acid generated upon exposure, and contributes to improving various lithography properties.

In the present invention, the component (D1) may be a photodegradable base which is decomposed upon exposure and then loses the ability of controlling of acid diffusion.

Examples of the component (D1) include a compound represented by general formula (d1-1) shown below (hereafter, sometimes referred to as "component (d1-1)"), a compound represented by general formula (d1-2) shown below (hereafter, sometimes referred to as "component (d1-2)") and a compound represented by general formula (d1-3) shown below (hereafter, sometimes referred to as "component (d1-3)").

[Chemical Formula 30]

(d1-1)

(d1-2)

-continued (d1-3)

$Rd_4 \diagdown Yd^1 \diagdown N_\ominus \diagup S \diagdown Rd^3$ with $O_2$ and $(M^{m\oplus})_{1/m}$ In the formulae, $Rd^1$ to $Rd^4$ each represents a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents an organic cation having a valency of m.

[Component (d1-1)]
—Anion Moiety

In the formula (d1-1), $Rd^1$ represents a cyclic group which may have a substituent, a chain-like alkyl group which may have a substituent or a chain-like alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group.

As the aromatic hydrocarbon group for $Rd^1$, aryl groups in which one hydrogen atom has been removed from either an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $Rd^1$, groups in which one hydrogen atom has been removed from a monocycloalkane or a polycycloalkane exemplified above in the explanation of the divalent aliphatic hydrocarbon group for Va$^1$ in the formula (a1-1) can be mentioned, and an adamantyl group or a norbornyl group is preferable.

Further, the cyclic hydrocarbon group for Rd$^1$ may contain a hetero atom like as a heterocycle, and specific examples thereof include lactone-containing cyclic groups represented by the aforementioned general formulae (a2-r-1) to (a2-r-7), —SO$_2$— containing cyclic groups represented by the aforementioned formulae (a5-r-1) to (a5-r-4) and heterocycles shown below.

[Chemical Formula 31]

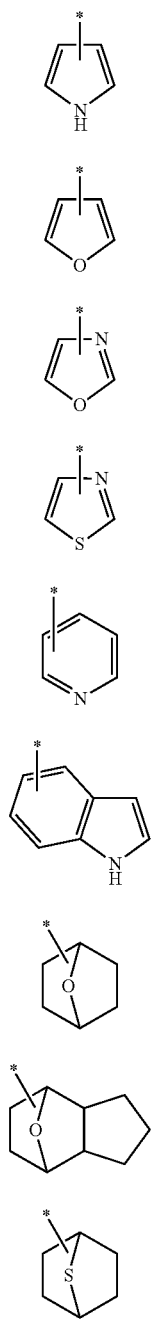

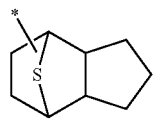
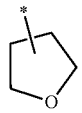
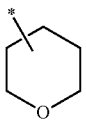
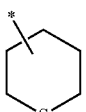
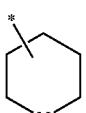
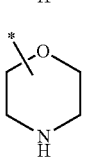

As the substituent for substituting the cyclic hydrocarbon group for Rd$^1$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the halogenated alkyl group as a substituent includes a group in which a part or all of the hydrogen atoms within an alkyl group of 1 to 5 carbon atoms such as a methyl group, an ethyl group, a propyl group, an n-butyl group or a tert-butyl group have been substituted with the aforementioned halogen atoms.

(Chain-Like Alkyl Group which May have a Substituent)

The chain-like alkyl group for Rd$^1$ may be either linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent)

The chain-like alkenyl group for $Rd^1$ may be linear or branched, and preferably has 2 to 10 carbon atoms, more preferably 2 to 5 carbon atoms, still more preferably 2 to 4 carbon atoms, and particularly preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for substituting the chain-like alkyl group or alkenyl group for $Rd^1$, an alkoxy group, a halogen atom, a halogenated alkyl group, a hydroxyl group, a carbonyl group, a nitro group, an amino group, the cyclic group described above for $Rd^1$ or the like can be used.

Among these, as the group for $Rd^1$, a cyclic group which may have a substituent and a chain-like alkyl group which may have a substituent are preferable, and an aromatic hydrocarbon group which may have a substituent, an aliphatic cyclic group which may have a substituent and a chain-like alkyl group which may have a substituent are more preferable. As the substituents which these groups may have, a hydroxy group, a fluorine atom or a fluorinated alkyl group is preferable.

The aromatic hydrocarbon group is more preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

As the chain-like alkyl group, a fluorinated alkyl group containing a fluorine atom as a substituent is preferable. The fluorinated alkyl group containing a fluorine atom as a substituent preferably has 1 to 11 carbon atoms, more preferably 1 to 8, and still more preferably 1 to 4.

The fluorinated alkyl group may contain an atom other than fluorine. Examples of the atom other than fluorine include an oxygen atom, a sulfur atom and a nitrogen atom.

As for $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 32]

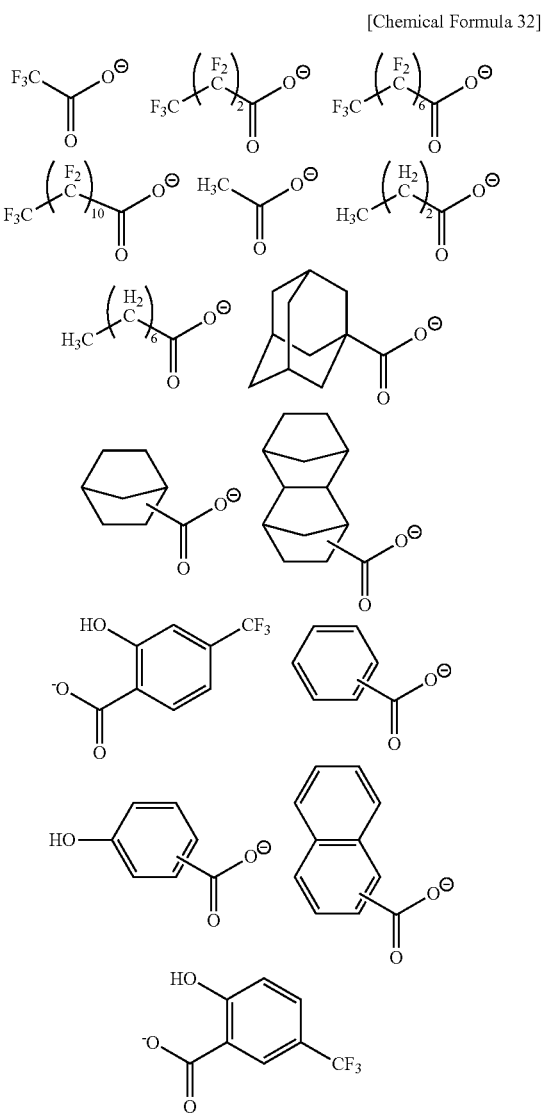

—Cation Moiety

In formula (d1-1), $M^{m+}$ represents an organic cation having a valency of m.

The organic cation for $M^{m+}$ is not particularly limited, and examples thereof include the same cation moieties as those represented by formulae (ca-1) to (ca-4) described later, and cation moieties represented by formulae (ca-1-1) to (ca-1-63) described later are preferable.

As the component (d1-1), one type of compound may be used, or two or more types of compounds may be used in combination.

[Component (d1-2)]

—Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $Rd^1$ in the aforementioned formula (d1-1), provided that, the carbon atom adjacent to the sulfur atom within $Rd^2$ group has no fluorine atom bonded thereto (i.e., the carbon atom within $Rd^2$ group adjacent to the sulfur atom is not substituted with a fluorine atom). As a result, the anion of the component (d1-2) becomes an appropriately weak acid anion, thereby improving the quenching ability of the component (D1).

As $Rd^2$, an aliphatic cyclic group which may have a substituent is preferable, and a group in which one or more hydrogen atoms have been removed from adamantane, norbornane, isobornane, tricyclodecane or tetracyclododecane (which may have a substituent); or a group in which one or more hydrogen atom have been removed from camphor is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for $Rd^1$ in the formula (d1-1) can be mentioned.

Specific examples of preferable anion moieties for the component (d1-2) are shown below.

[Chemical Formula 33]

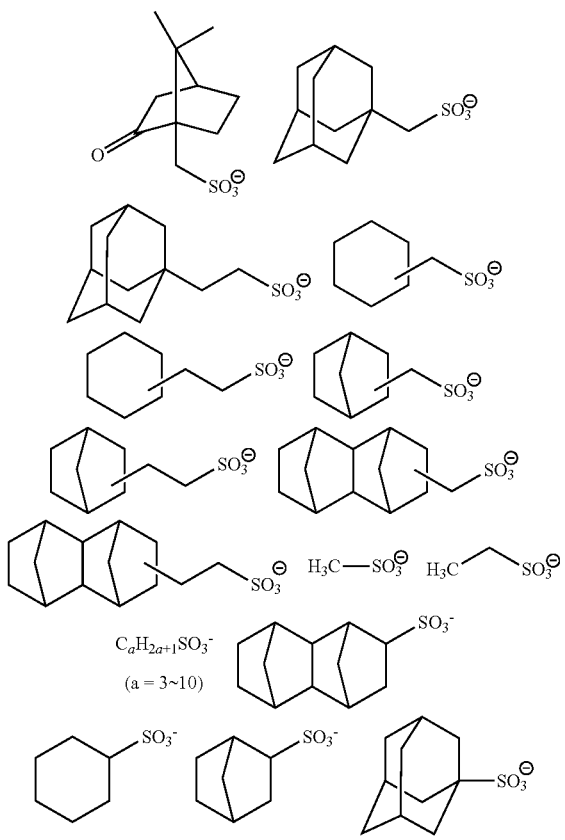

-continued

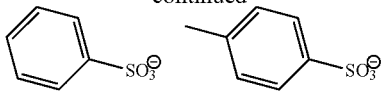

—Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

[Component (d1-3)]

—Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $Rd^1$ in the aforementioned formula (d1-1).

In particular, $Rd^3$ is preferably a cyclic group containing a fluorine atom, a chain-like alkyl group or a chain-like alkenyl group. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for $Rd^1$ in the aforementioned formula (d1-1). Among these, an alkyl group which may have substituent, an alkoxy group which may have substituent, an alkylene group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are desirable.

As the alkenyl group for $Rd^4$, the same groups as those described above for $Rd^1$ can be mentioned, and a vinyl group, a propenyl group (an allyl group), a 1-methylpropenyl group and a 2-methylpropenyl group are preferable.

These groups may have a halogenated alkyl group of 1 to 5 carbon atoms as a substituent.

As the cyclic group for $Rd^4$, the same groups as those described above for $Rd^1$ can be mentioned. Among these, as the cyclic group, an alicyclic group (e.g., a group in which one hydrogen atom has been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these groups is preferable. As the alkylene group, a linear or branched alkylene group is preferable, and a methylene group or an ethylene group is more preferable.

Specific examples of preferable anion moieties for the component (d1-3) are shown below.

-continued

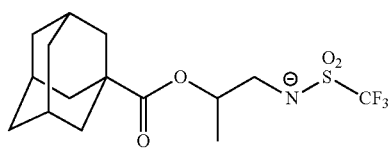
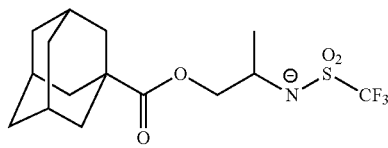
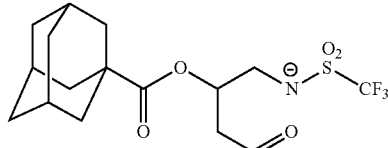
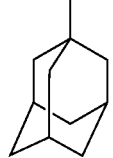

[Chemical Formula 34]

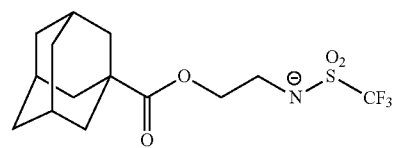
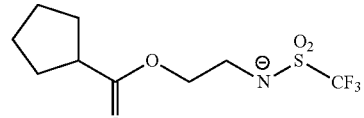
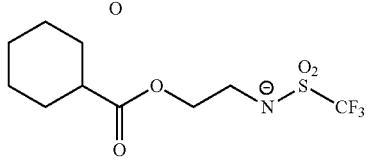
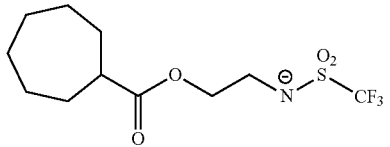
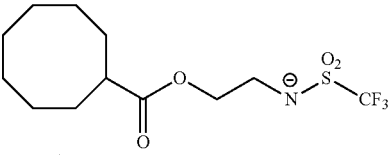
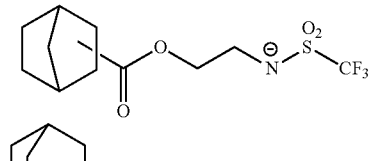
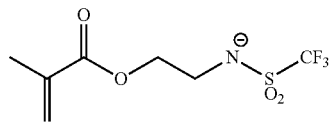
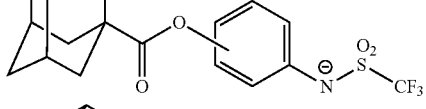
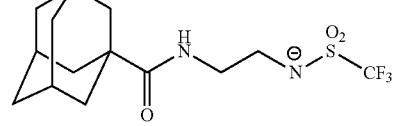

[Chemical Formula 35]

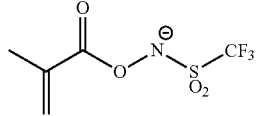

-continued

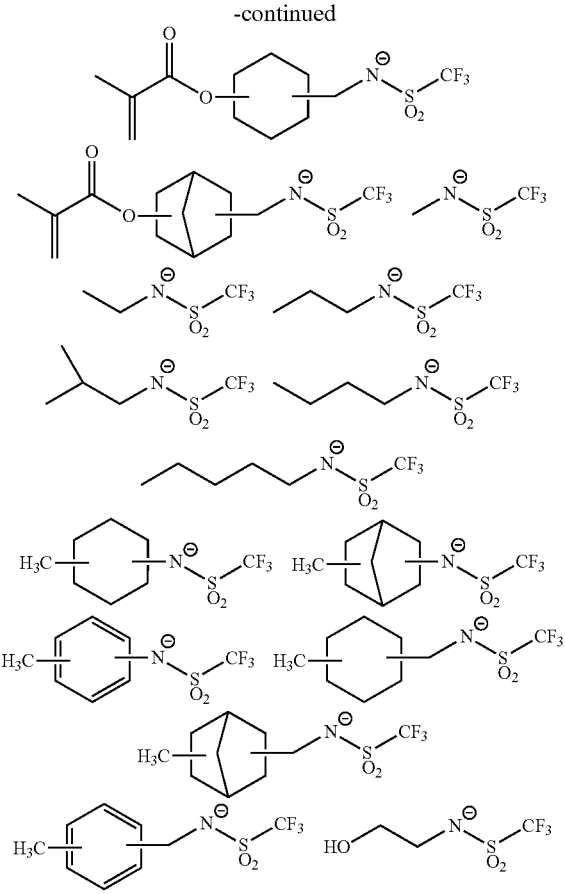

—Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of compound may be used, or two or more types may be used in combination.

Among these, as the component (D1), at least one compound selected from the group consisting of the component (d1-1), the component (d1-2) and the component (d1-3) is preferably used, and the component (d1-2) is particularly preferable.

In the resist composition, the amount of the component (D1), relative to 100 parts by weight of the component (A) is preferably from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

(Production Method of Components (D1))

The production methods of the components (d1-1) and (d1-2) are not particularly limited, and the components (d1-1) and (d1-2) can be produced by conventional methods.

The production method of the component (d1-3) is not particularly limited, and for example, the component (d1-3) can be produced by a method described in US2012-0149916.

<Other Components>

Furthermore, the resist composition of the present invention preferably includes an acid generator component which generates acid upon exposure (hereafter, referred to as "component (B)"), in addition to the components (A), (N) and (D1).

[Component (B)]

As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, onium salt acid generators are preferably used.

Examples of the onium salt acid generators include a compound represented by general formula (b-1) shown below (hereafter, sometimes referred to as "component (b-1)"), a compound represented by general formula (b-2) shown below (hereafter, sometimes referred to as "component (b-2)") and a compound represented by general formula (b-3) shown below (hereafter, sometimes referred to as "component (b-3)").

[Chemical Formula 36]

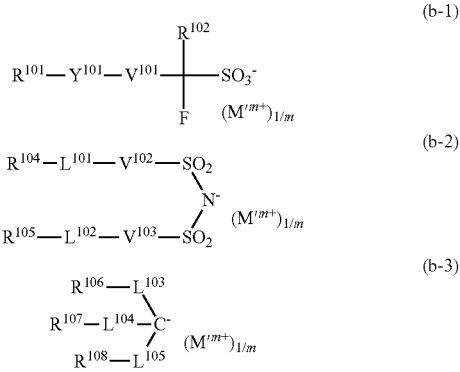

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that, $R^{104}$ and $R^{105}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M^{m+}$ represents an onium cation having a valency of m.

{Anion Moiety}

—Anion Moiety of Component (b-1)

In formula (b-1), $R^{101}$ represents a cyclic group which may have a substituent, a chain-like alkyl group which may have a substituent or a chain-like alkenyl group which may have a substituent, and is the same groups as those defined above for $Rd^1$ in the aforementioned formula (d1-1).

Among these, as $R^{101}$, a cyclic group which may have a substituent is preferable, and a cyclic hydrocarbon group which may have a substituent is more preferable. Specific examples include a group in which one or more hydrogen atoms have been removed from a phenyl group, a naphthyl group or a polycycloalkane, lactone-containing cyclic groups represented by the formulae (a2-r-1) to (a2-r-7) and —SO$_2$— containing cyclic groups represented by the formulae (a5-r-1) to (a5-r-4) and the like.

In the formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—) and a carbonate group (—O—C(=O)—O—); and a combination of any of the aforementioned non-hydrocarbon, oxygen atom-containing linking groups with an alkylene group. Furthermore, the combinations may have a sulfonyl group (—SO$_2$—) bonded thereto. As the combination, the linking groups represented by formulae (y-al-1) to (y-al-7) shown below can be mentioned.

[Chemical Formula 37]

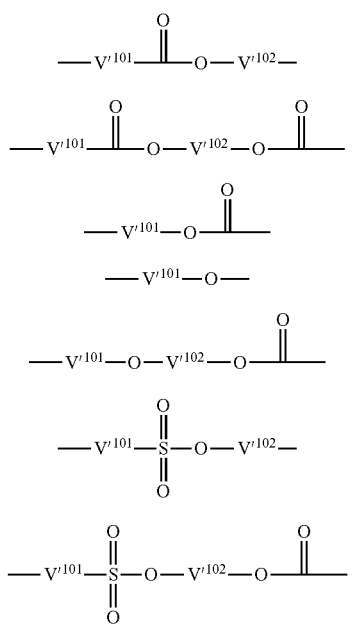

In the formulae, $V'^{101}$ represents a single bond or an alkylene group of 1 to 5 carbon atoms; and $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

As the alkylene group for $V'^{101}$ and $V'^{102}$, a linear alkylene group or a branched alkylene group can be used, and a linear alkylene group is preferable.

Specific examples of the alkylene group for $V'^{101}$ and $V'^{102}$ include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group described above for $Ra'^3$ in the aforementioned formula (a1-r-1), and a cyclohexylene group, 1,5-adamantylene group or 2,6-adamantylene group is more preferable.

$Y^{101}$ is preferably a divalent linking group containing an ether bond or an ester bond, and linking groups represented by the aforementioned formulae (y-al-1) to (y-al-5) are preferable.

In the formula (b-1), $V^{101}$ represents a single bond, an alkylene group or a fluorinated alkylene group. The alkylene group or fluorinated alkylene group for $V^{101}$ preferably has 1 to 4 carbon atoms. As the fluorinated alkylene group for $V^{101}$, a group in which part or all of the hydrogen atoms within the aforementioned alkylene group for $V^{101}$ has been substituted with fluorine atoms can be used. Among these, $V^{101}$ is preferably a single bond or a fluorinated alkylene group of 1 to 4 carbon atoms.

In the formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and is more preferably a fluorine atom.

As specific examples of anion moieties of the formula (b-1), fluorinated alkylsulfonate anions such as a trifluoromethanesulfonate anion or a perfluorobutanesulfonate anion when $Y^{101}$ is a single bond, and anions represented by formulae (an-1) to (an-3) shown below when $Y^{101}$ is a divalent linking group containing an oxygen atom can be mentioned.

[Chemical Formula 38]

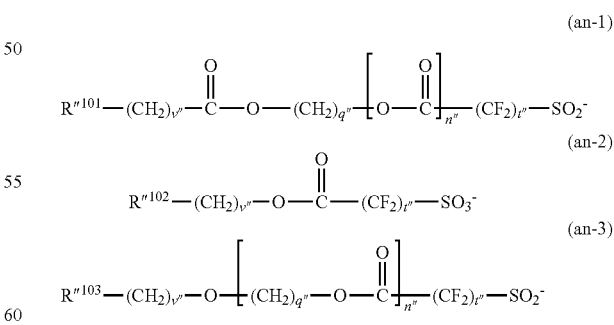

In the formulae, $R'''^{101}$ represents an aliphatic cyclic group which may have a substituent, a group represented by any one of the aforementioned formulae (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulae (a2-r-1) to (a2-r-7) or an —SO$_2$— containing cyclic group represented by any one of the aforementioned formulae (a5-r-1) to (a5-r-4); R$''^{103}$ represents an aromatic cyclic group which may have a substituent, an aliphatic cyclic group which may have a substituent or a chain-like alkenyl group which may have a substituent; v" represents an integer of 0 to 3; q" represents an integer of 1 to 20; t" represents an integer of 1 to 3; and n" represents 0 or 1.

As the aliphatic cyclic group for R$''^{101}$, R$''^{102}$ and R$''^{103}$ which may have a substituent, the same groups as the cyclic aliphatic hydrocarbon group for R$^{101}$ described above are preferable. As the substituent, the same groups as those described above for substituting the cyclic aliphatic hydrocarbon group for R$^{101}$ can be mentioned.

As the aromatic cyclic group for R$''^{103}$ which may have a substituent, the same groups as the aromatic hydrocarbon group exemplified as a cyclic hydrocarbon group for R$^{101}$ described above are preferable. As the substituent, the same groups as those described above for substituting the aromatic hydrocarbon group for R$^{101}$ can be mentioned.

As the chain-like alkyl group for R$''^{101}$ which may have a substituent, the same groups as those described above for R$^{101}$ are preferable. As the chain-like alkenyl group for R$''^{103}$ which may have a substituent, the same groups as those described above for R$^{101}$ are preferable.

—Anion Moiety of Component (b-2)

In formula (b-2), R$^{104}$ and R$^{105}$ each independently represents a cyclic group which may have a substituent, a chain-like alkyl group which may have a substituent or a chain-like alkenyl group which may have a substituent, and is the same groups as those defined above for R$^{101}$ in the aforementioned formula (b-1), provided that, R$^{104}$ and R$^{105}$ may be mutually bonded to form a ring.

As R$^{104}$ and R$^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, preferably 1 to 7, and more preferably 1 to 3. The smaller the number of carbon atoms of the chain-like alkyl group for R$^{104}$ and R$^{105}$ within the above-mentioned range of the number of carbon atoms, the more the solubility in a resist solvent is improved. Further, in the chain-like alkyl group for R$^{104}$ and R$^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), V$^{102}$ and V$^{103}$ each independently represents a single bond, an alkylene group or a fluorinated alkylene group, and is the same groups as those defined above for V$^{101}$ in the aforementioned formula (b-1).

In the formula (b-2), L$^{101}$ and L$^{102}$ each independently represents a single bond or an oxygen atom.

—Anion Moiety of Component (b-3)

In formula (b-3), R$^{106}$ to R$^{108}$ each independently represents a cyclic group which may have a substituent, a chain-like alkyl group which may have a substituent or a chain-like alkenyl group which may have a substituent, and is the same groups as those defined above for R$^{101}$ in the aforementioned formula (b-1).

L$^{103}$ to L$^{105}$ each independently represents a single bond, —CO— or —SO$_2$—.

{Cation Moiety}

In the formulae (b-1), (b-2) and (b-3), M$^{m+}$ represents an onium cation having a valency of m. Among these, a sulfonium cation or an iodonium cation is preferable, and cation moieties represented by general formulae (ca-1) to (ca-4) shown below are particularly preferable.

[Chemical Formula 39]

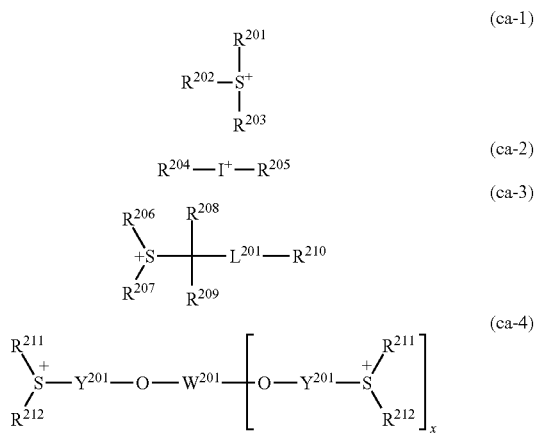

In the formulae, each of R$^{201}$ to R$^{207}$, R$^{211}$ and R$^{212}$ independently represents an aryl group which may have a substituent, an alkyl group which may have a substituent or an alkenyl group which may have a substituent; R$^{201}$ to R$^{203}$, R$^{206}$ and R$^{207}$, and R$^{211}$ and R$^{212}$ may be mutually bonded to form a ring with the sulfur atom; R$^{208}$ and R$^{209}$ each represents a hydrogen atom or an alkyl group of 1 to 5 carbon atoms; R$^{210}$ represents an aryl group which may have a substituent, an alkyl group which may have a substituent, an alkenyl group which may have a substituent or an —SO$_2$— containing cyclic group which may have a substituent; L$^{201}$ represents —C(=O)— or —C(=O)—O—; Y$^{201}$ each independently represents an arylene group, an alkylene group or an alkenylene group; x represents 1 or 2; and W$^{201}$ represents a linking group having a valency of (x+1).

As the aryl group for R$^{201}$ to R$^{207}$, R$^{211}$ and R$^{212}$ an unsubstituted aryl group of 6 to 20 carbon atoms can be mentioned, and a phenyl group or a naphthyl group is preferable.

As the alkyl group for R$^{201}$ to R$^{207}$, R$^{211}$ and R$^{212}$ a chain-like or cyclic alkyl group of 1 to 30 carbon atoms is preferable.

The alkenyl group for R$^{201}$ to R$^{207}$, R$^{211}$ and R$^{212}$ preferably has 2 to 10 carbon atoms.

Specific examples of the substituent which R$^{201}$ to R$^{207}$ and R$^{210}$ to R$^{212}$ may have include an alkyl group, a halogen atom, a halogenated alkyl group, a carbonyl group, a cyano group, an amino group, an aryl group and groups represented by formulae (ca-r-1) to (ca-r-7) shown below.

[Chemical Formula 40]

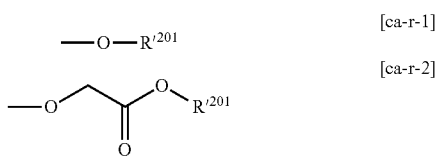

-continued

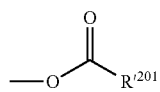
[ca-r-3]

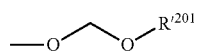
[ca-r-4]

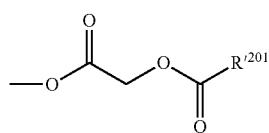
[ca-r-5]

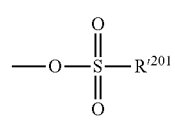
[ca-r-6]

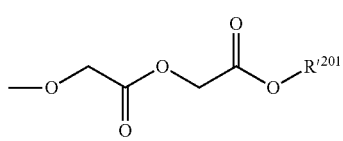
[ca-r-7]

In the formulae, $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ in the aforementioned formula (b-1) can be mentioned. As the cyclic group which may have a substituent and chain-like alkyl group which may have a substituent, the same groups as those described above for the acid dissociable group represented by the aforementioned formula (a1-r-2) can be also mentioned.

When $R^{201}$ to $R^{203}$, $R^{206}$ and $R^{207}$, and $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). As the ring to be formed, the ring containing the sulfur atom in the skeleton thereof is preferably a 3 to 10-membered ring, and most preferably a 5 to 7-membered ring. Examples of the formed ring include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring and a tetrahydrothiopyranium ring.

$R^{208}$ and $R^{209}$ each independently represents a hydrogen atom or an alkyl group of 1 to 5 carbon atoms, is preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent or an —SO$_2$— containing cyclic group which may have a substituent.

As the aryl group for $R^{210}$, an unsubstituted aryl group of 6 to 20 carbon atoms can be mentioned, and a phenyl group or a naphthyl group is preferable.

As the alkyl group for $R^{210}$, a chain-like or cyclic alkyl group of 1 to 30 carbon atoms is preferable.

The alkenyl group for $R^{210}$ preferably has 2 to 10 carbon atoms.

As the —SO$_2$— containing cyclic group for $R^{210}$ which may have a substituent, the same groups as those described above for Ra$^{21}$ in the general formula (a2-1) can be mentioned, and the group represented by the aforementioned general formula (a5-r-1) is preferable.

$Y^{201}$ each independently represents an arylene group, an alkylene group or an alkenylene group.

As the arylene group for $Y^{201}$, a group in which one hydrogen atom has been removed from an aryl group exemplified as an aromatic hydrocarbon group for $R^{101}$ in the aforementioned formula (b-1) can be mentioned.

As the alkylene group and the alkenylene group for $Y^{201}$, the same aliphatic hydrocarbon group as those described above for the divalent hydrocarbon group for Va$^1$ in the aforementioned general formula (a1-1) can be mentioned.

In the formula (ca-4), x represents 1 or 2.

$W^{201}$ represents a linking group having a valency of (x+1), that is, a divalent or trivalent linking group.

As the divalent linking group for $W^{201}$, a divalent hydrocarbon groups which may have a substituent is preferable, and as examples thereof, the same hydrocarbon group as those described above for Ya$^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. As the arylene group, a phenylene group and a naphthylene group can be mentioned. Of these, a phenylene group is particularly desirable.

As the trivalent linking group for $W^{201}$, a group in which one hydrogen atom has been removed from the aforementioned divalent linking group for $W^{201}$ and a group in which the divalent linking group has been bonded to an another divalent linking group can be mentioned. The trivalent linking group for $W^{201}$ is preferably an arylene group having two carbonyl groups bonded thereto.

Specific examples of preferable cations represented by formula (ca-1) include cations represented by formulae (ca-1-1) to (ca-1-63) shown below.

[Chemical Formula 41]

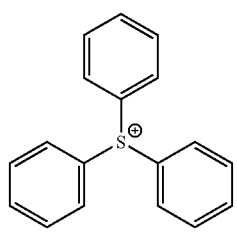
(ca-1-1)

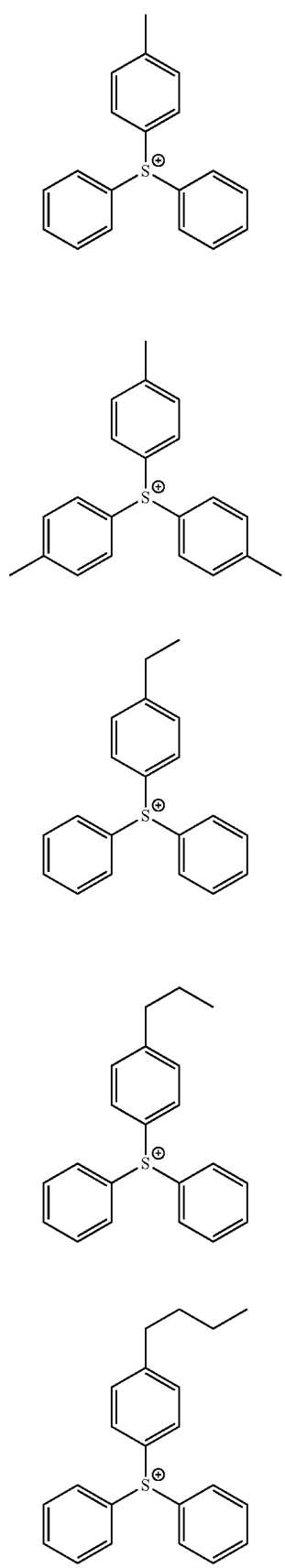
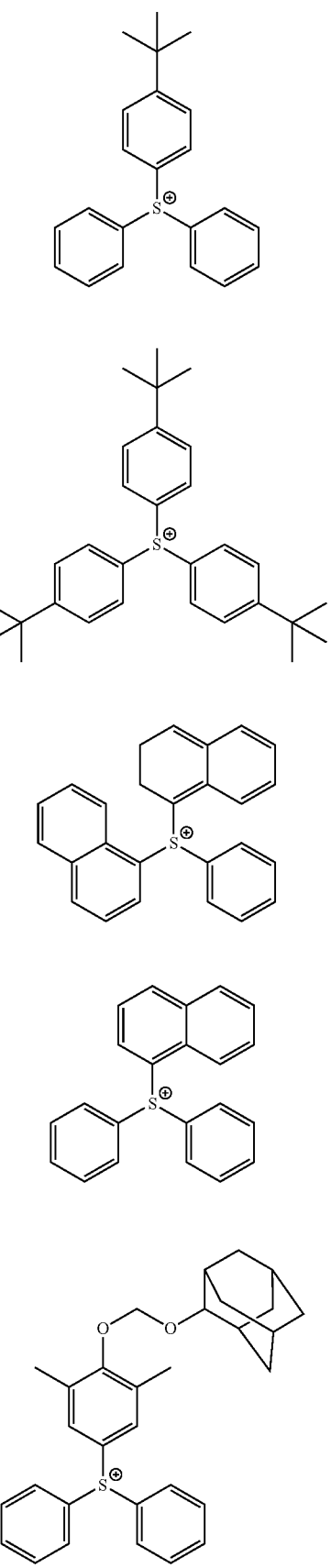

(ca-1-12)
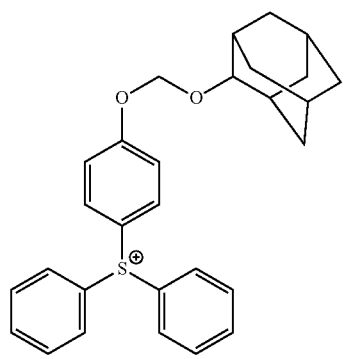
(ca-1-16)
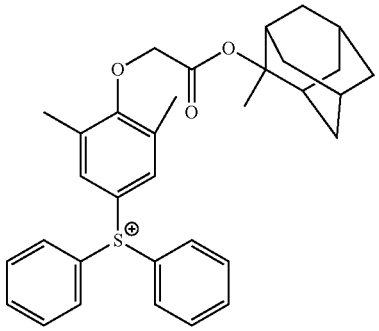
(ca-1-13)
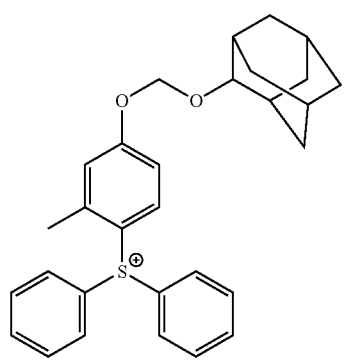
[Chemical Formula 42]
(ca-1-17)
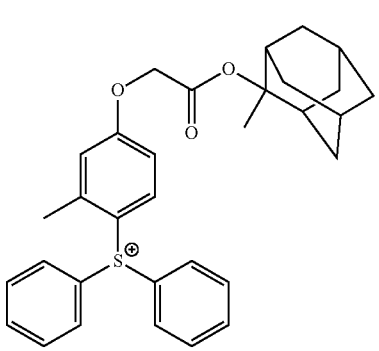
(ca-1-14)
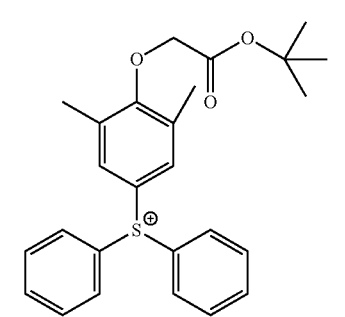
(ca-1-18)
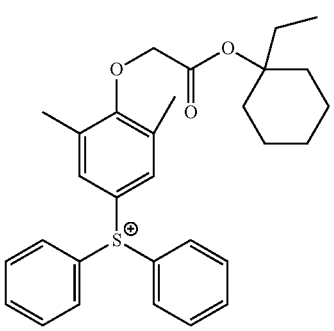
(ca-1-15)
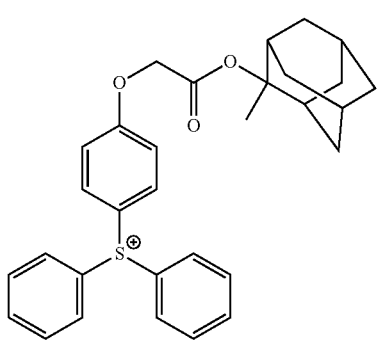
(ca-1-19)
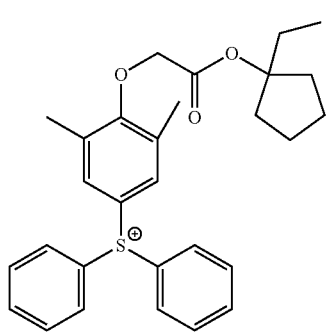

-continued
(ca-1-20)
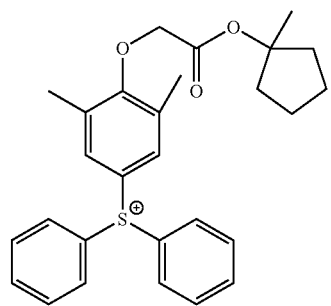
(ca-1-21)
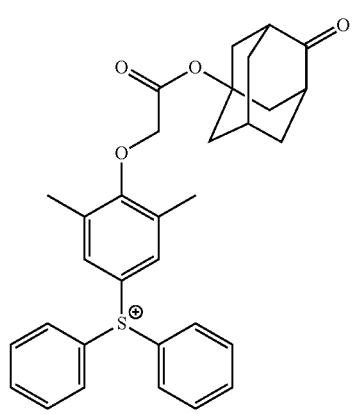
(ca-1-22)
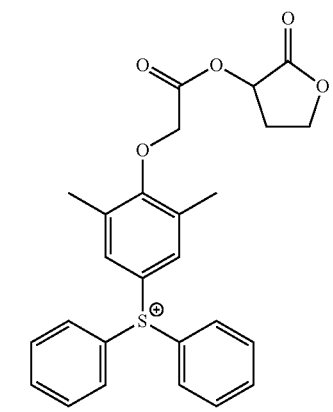
(ca-1-23)
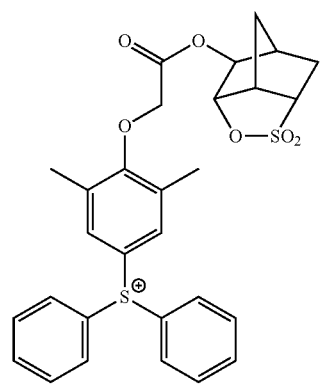
-continued
(ca-1-24)
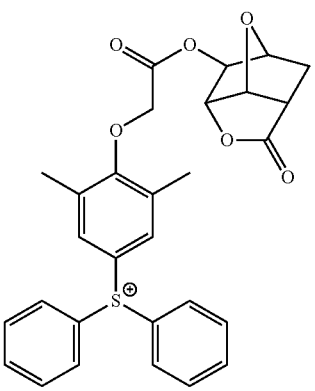
(ca-1-25)
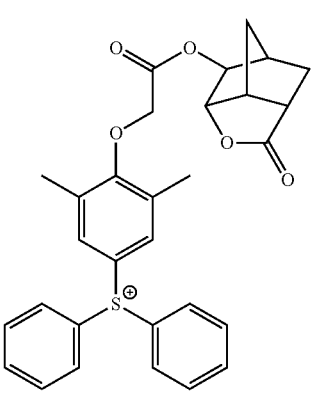
(ca-1-26)
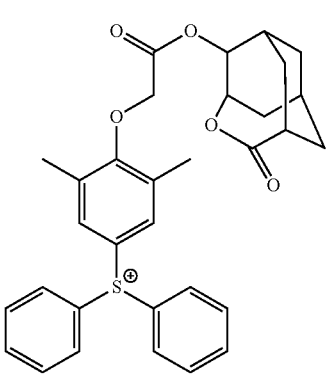
(ca-1-27)
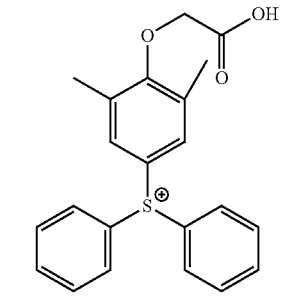

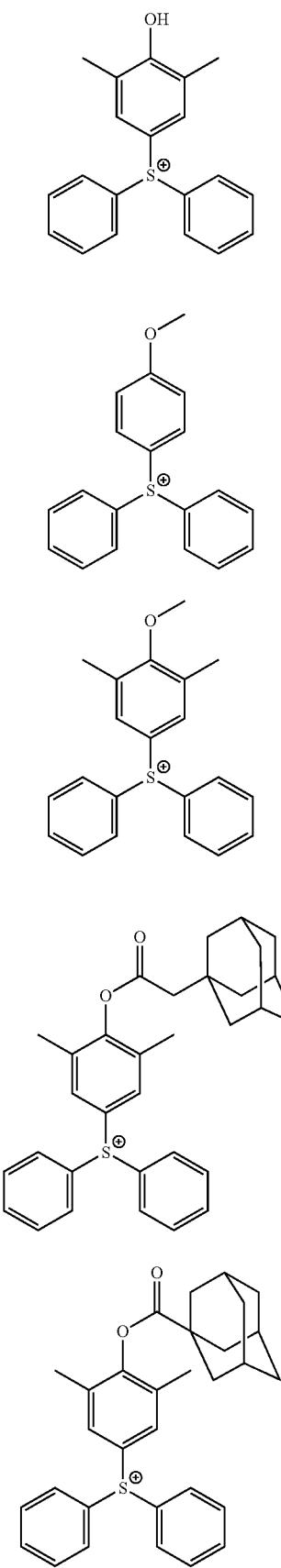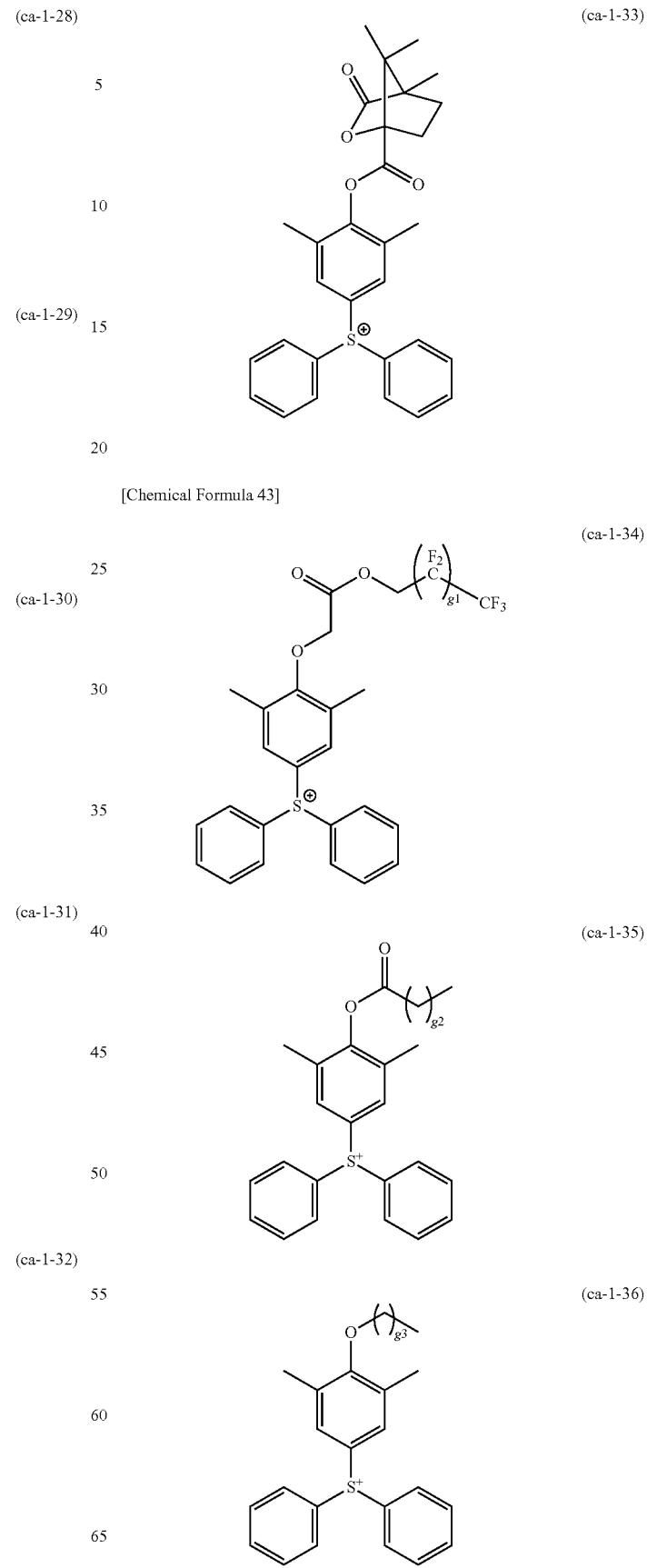

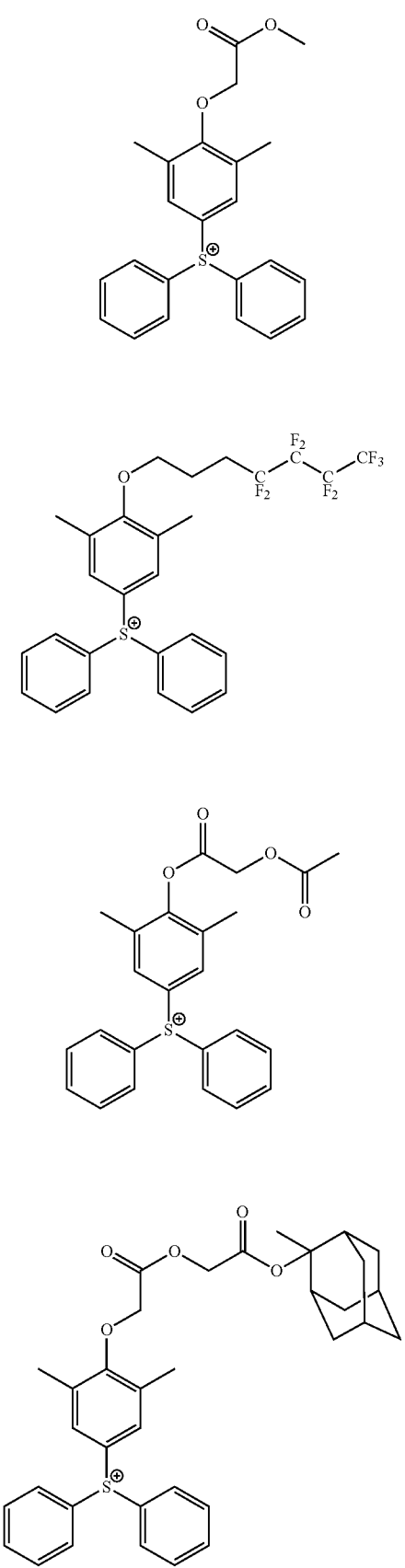

(ca-1-48)
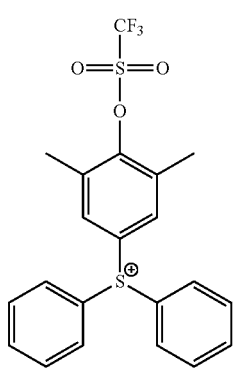
In the formulae, g1, g2 and g3 represent recurring numbers, wherein g1 is an integer of 1 to 5, g2 is an integer of 0 to 20, and g3 is an integer of 0 to 20.
[Chemical Formula 44]
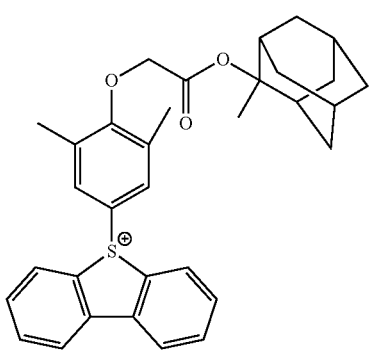
(ca-1-49)
(ca-1-50)
(ca-1-51)
(ca-1-52)
(ca-1-53)
(ca-1-54)
(ca-1-55)
(ca-1-56)

(ca-1-57) 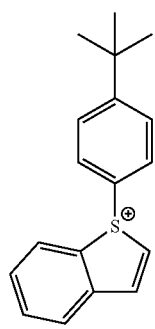

(ca-1-58) 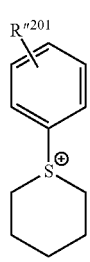

(ca-1-59) 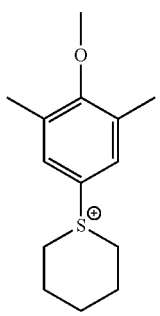

(ca-1-60) 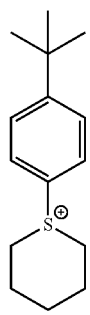

(ca-1-61) 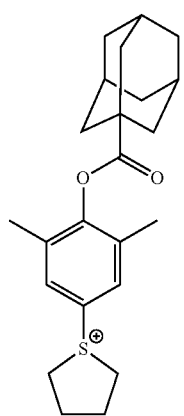

(ca-1-62) 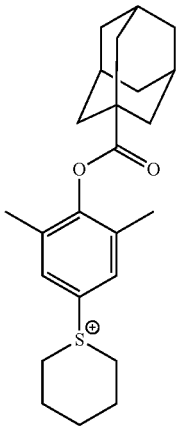

(ca-1-63) 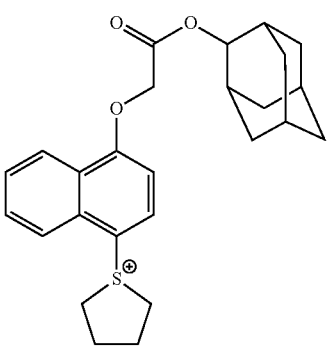

In the formulae, $R''^{201}$ represents a hydrogen atom or a substituent, and as the substituent, the same groups as those described above for substituting the $R^{201}$ to $R^{207}$ and $R^{210}$ to $R^{212}$ can be mentioned.

Specific examples of preferable cations represented by the formula (ca-3) include cations represented by formulae (ca-3-1) to (ca-3-6) shown below.

[Chemical Formula 45]

(ca-3-1) 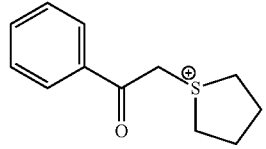

(ca-3-2) 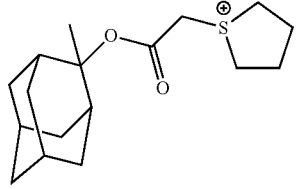

(ca-3-3) 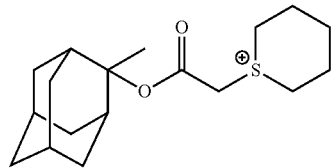

-continued (ca-3-4)
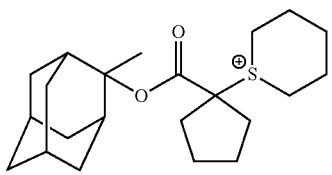

(ca-3-5)
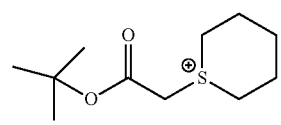

(ca-3-6)
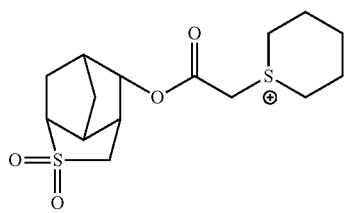

Specific examples of preferable cations represented by formula (ca-4) include cations represented by formulae (ca-4-1) to (ca-4-2) shown below.

[Chemical Formula 46]

(ca-12) and (ca-3) shown below or a component which has an anion moiety represented by general formula (Ban-1) shown below is preferable, and a component which has a cation moiety represented by general formula (ca-11) shown below or a component which has an anion moiety represented by general formula (Ban-1) shown below is more preferable, and an acid generator component which has a cation moiety represented by general formula (ca-11) shown below and an anion moiety represented by general formula (Ban-1) shown below is particularly preferable.

[Chemical Formula 47]

(ca-11)
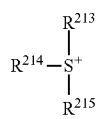

(ca-12)
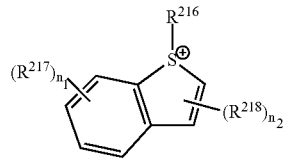

(ca-4-1)

(ca-4-2)

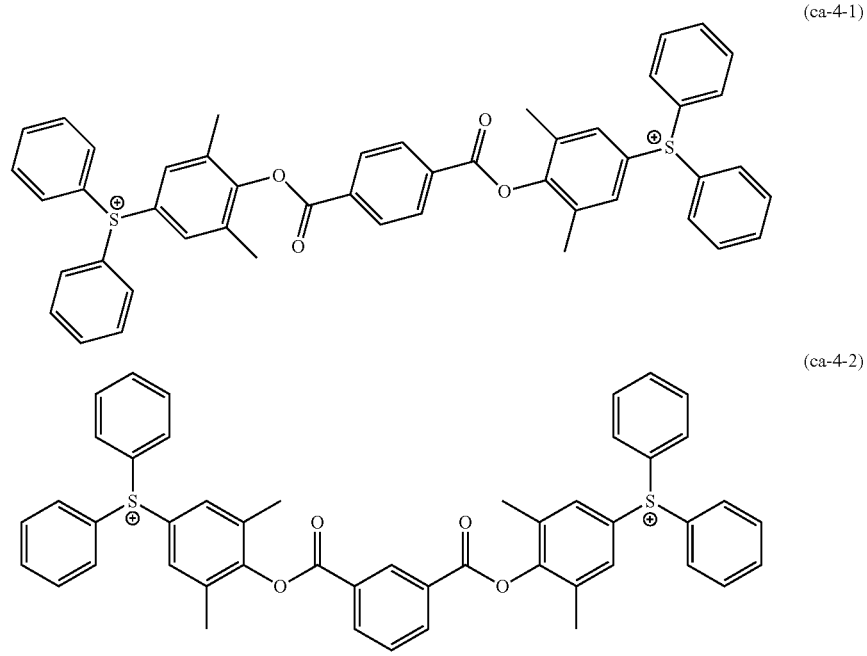

In the resist composition of the present invention, as the component (B), a component which has at least one cation moiety selected from the group consisting of cations represented by the aforementioned formulae (ca-1) and (ca-3) or a component which has an anion moiety of the compound represented by general formula (b-1) (component (b-1)) can be used.

Among these, as the component (B), a component which has at least one cation moiety selected from the group consisting of cations represented by general formulae (ca-11), -continued (ca-3)
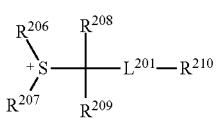

In the formulae, $R^{213}$ to $R^{215}$ each independently represents an aryl group which may have a substituent, an alkyl group which may have a substituent or an alkenyl group which may have a substituent, and two of $R^{213}$ to $R^{215}$ may be mutually bonded to form a ring with the sulfur atom; $R^{216}$ represents an aryl group which may have a substituent, an alkyl group which may have a substituent or an alkenyl group which may have a substituent; $R^{217}$ and $R^{218}$ each independently represents an alkyl group, an acetyl group, an alkoxy group, a carboxy group, a hydroxy group or a hydroxyalkyl group; $n_1$ represents an integer of 0 to 3; $n_2$ represents an integer of 0 to 2; $R^{206}$ and $R^{207}$ each independently represents an aryl group which may have a substituent, an alkyl group which may have a substituent or an alkenyl group which may have a substituent, and may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an —SO$_2$— containing cyclic group which may have a substituent; and $L^{201}$ represents —C(=O)— or —C(=O)—O—.

[Chemical Formula 48]

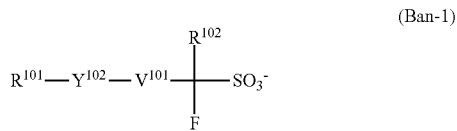

(Ban-1)

In the formula, $R^{101}$ represents a cyclic group which may have a substituent, a chain-like alkyl group which may have a substituent or a chain-like alkenyl group which may have a substituent; $Y^{102}$ represents a divalent linking group having —C(=O)—O—; $V^{101}$ represents a single bond, an alkylene group or a fluorinated alkylene group; and $R^{102}$ represents a fluorine atom or a fluorinated alkyl group of 1 to 5 carbon atoms.

—Cation Moiety Represented by General Formula (ca-11)

In the aforementioned formulae, $R^{213}$ to $R^{215}$ each independently represents an aryl group which may have a substituent, an alkyl group which may have a substituent or an alkenyl group which may have a substituent, and two of $R^{213}$ to $R^{215}$ may be mutually bonded to form a ring with the sulfur atom. $R^{213}$ and $R^{215}$ are the same groups as those defined above for $R^{201}$ and $R^{203}$ in the aforementioned formula (ca-1).

—Cation Moiety Represented by General Formula (ca-12)

In the aforementioned formulae, $R^{216}$ represents an aryl group which may have a substituent, an alkyl group which may have a substituent or an alkenyl group which may have a substituent. $R^{216}$ is the same groups as those defined above for $R^{201}$ to $R^{203}$ in the aforementioned formula (ca-1).

$R^{217}$ and $R^{218}$ each independently represents an alkyl group, an acetyl group, an alkoxy group, a carboxy group, a hydroxy group or a hydroxyalkyl group. With respect to $R^{217}$ and $R^{218}$, the alkyl group is preferably an alkyl group of 1 to 5 carbon atoms, more preferably a linear or branched alkyl group, and particularly preferably a methyl group, an ethyl group, a propyl group, an isopropyl group, an n-butyl group or a tert-butyl group. The alkoxy group is preferably an alkoxy group of 1 to 5 carbon atoms, more preferably a linear or branched alkoxy group, and particularly preferably a methoxy group or an ethoxy group. The hydroxyalkyl group is preferably a group in which one or more hydrogen atoms within the aforementioned alkyl group have been substituted with hydroxy groups, and examples thereof include a hydroxymethyl group, a hydroxyethyl group and a hydroxypropyl group.

$n_1$ represents an integer of 0 to 3, preferably an integer of 0 to 2, and more preferably 0 or 1.

$n_2$ represents an integer of 0 to 2, and preferably 0 or 1.

—Cation Moiety Represented by General Formula (ca-3)

The cation moiety represented by general formula (ca-3) is the same as defined above for the cation moiety represented by the aforementioned general formula (ca-3).

—Anion Moiety Represented by General Formula (Ban-1)

In the aforementioned formula, $R^{101}$, $V^{101}$ and $R^{102}$ as are the same defined above for $R^{101}$, $V^{101}$ and $R^{102}$ in the aforementioned general formula (b-1).

In the formula, $Y^{102}$ represents a divalent linking group having —C(=O)—O—. Specific examples thereof include a divalent linking group having —C(=O)—O— among the "divalent linking group containing an oxygen atom" for $Y^{101}$ in the general formula (b-1). Here, the direction of the "—C(=O)—O—" within the divalent linking group may be —C(=O)—O— or —O—C(=O)—.

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, an uniform solution can be obtained and the storage stability becomes satisfactory.

[Component (D2)]

The resist composition of the present invention may also contain a nitrogen-containing organic compound component other than the aforementioned components (N) and (D1) (hereafter, referred to as "component (D2)").

The component (D2) is not particularly limited, as long as it functions as an acid diffusion control agent, and does not fall under the definition of the component (N) or the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia (NH$_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl] amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5 parts by weight, relative to 100 parts by weight of the component (A). When the amount of the component (D2) is within the above-mentioned range, the shape of the resist pattern and the post exposure stability of the latent image formed by the pattern-wise exposure of the resist layer are improved.

[Component (F)]

In the present invention, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) represented by formula (f1-1) shown below and the aforementioned structural unit (a1); and a copolymer of a structural unit (f1) represented by the formula (f1-1) shown below, a structural unit derived from acrylic acid or methacrylic acid and the aforementioned structural unit (a1) are preferable. As the structural unit (a1) to be copolymerized with a structural unit (f1) represented by formula (f1-1) shown below, a structural unit derived from 1-ethyl-1-cyclooctyl(meth)acrylate is preferable.

[Chemical Formula 49]

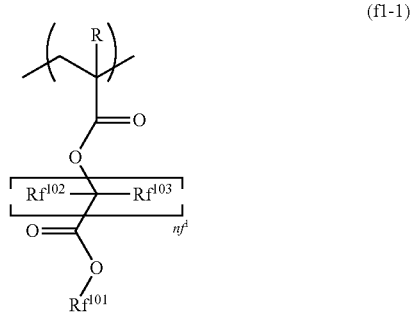

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R bonded to the carbon atom on the α-position is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as described above for R, and a methyl group or an ethyl group is preferable. Specific examples of the halogenated alkyl group of 1 to 5 carbon atoms represented by $Rf^{102}$ and $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, $-CH_2-CF_3$, $-CH_2-CF_2-CF_3$, $-CH(CF_3)_2$, $-CH_2-CH_2-CF_3$ and $-CH_2-CH_2-CF_2-CF_2-CF_2-CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is typically used in an amount within a range from 0.5 to 10 parts by weight, relative to 100 parts by weight of the component (A).

[Other Additives]

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

However, in the resist composition of the present invention, it is preferable that at least one compound selected from the group consisting of organic carboxylic acids, and phosphorus oxo acids and derivatives thereof (hereafter, referred to as "component (E)") is not included. When the resist composition of the present invention does not include the component (E), deterioration in sensitivity and deterioration with time can be prevented.

In the component (E), examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned phosphorous oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinic acid esters.

[Component (S)]

The resist composition according to the present invention can be prepared by dissolving the resist materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL weight ratio or PGMEA:cyclohexanone weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the organic solvent is used in an amount such that the solid content of the resist composition becomes within the range from 1 to 20% by weight, and preferably from 2 to 15% by weight.

The resist composition of the present invention exhibits a high level of sensitivity and excellent storage stability, and achieve excellent lithography properties.

The resist composition of the present invention includes a nitrogen-containing compound (N), wherein a conjugate acid thereof has a pKa of 0 to 7, in addition to the base component (A). Therefore, the action of acid on the component (A) during storage can be suppressed, and the level of storage stability becomes excellent. By virtue of the component (N) having a boiling point of 50 to 200° C., the component (N) is vaporized during formation of a resist film and removed from the film. As a result, deterioration of sensitivity during formation of a resist pattern can be suppressed. Further, by using the photodecomposable base (D1) in combination, an excellent contrast between exposed portions and unexposed portions of a resist film can be reliably obtained. By the synergistic action of these, a resist pattern can be formed that exhibits excellent lithography properties.

The resist composition of the present invention may be used in an alkali developing process or in a solvent developing process. For example, when the component (A) is a component (A-1), the resist composition may be used in a method of forming a positive-tone resist pattern in an alkali developing process, or in a method of forming a negative-tone resist pattern in a solvent developing process.

<<Method of Forming a Resist Pattern>>

The method of forming a resist pattern of the second aspect of the present invention includes: forming a resist film on a substrate using a resist composition of the present invention; conducting exposure of the resist film; and developing the resist film to form a resist pattern.

The method for forming a resist pattern according to the present invention can be performed, for example, as follows.

Firstly, a resist composition of the present invention is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents and nitrile solvents are preferable.

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

As a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

As an ester solvent, butyl acetate is preferable.

Examples of nitrile solvents include acetonitrile, propionitrile, valeronitrile, butyronitrile and the like.

If desired, the organic developing solution may have a conventional additive blended. Examples of the additive include surfactants. The surfactant is not particularly limited, and for example, an ionic or non-ionic fluorine and/or silicon surfactant can be used. As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in the case of a solvent developing process, any of the aforementioned organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

EXAMPLES

As follows is a description of examples of the present invention, although the scope of the present invention is by no way limited by these examples.

Production of Resist Composition

Examples 1 to 17, Comparative Examples 1 to 14

The components shown in Tables 1 and 2 were mixed together and dissolved to obtain resist compositions.

TABLE 1

| | Component (A) | Component (B) | Component (D) | | Component (N) | Component (S) | |
| --- | --- | --- | --- | --- | --- | --- | --- |
| | | | Component (D1) | Component (D2) | | | |
| Comparative Example 1 | (A)-1 [100] | (B)-1 [22.8] | (D1)-1 [1.60] | — | — | (S)-1 [10] | (S)-2 [2800] |
| Example 1 | (A)-1 [100] | (B)-1 [22.8] | (D1)-1 [1.60] | — | (N)-1 [0.13] | (S)-1 [10] | (S)-2 [2800] |
| Example 2 | (A)-1 [100] | (B)-1 [22.8] | (D1)-1 [1.60] | — | (N)-1 [0.63] | (S)-1 [10] | (S)-2 [2800] |
| Example 3 | (A)-1 [100] | (B)-1 [22.8] | (D1)-1 [1.60] | — | (N)-1 [1.90] | (S)-1 [10] | (S)-2 [2800] |
| Example 4 | (A)-1 [100] | (B)-1 [22.8] | (D1)-1 [1.60] | — | (N)-1 [6.31] | (S)-1 [10] | (S)-2 [2800] |
| Comparative Example 2 | (A)-1 [100] | (B)-1 [22.8] | (D1)-1 [1.60] | (D2)-1 [3.61] | — | (S)-1 [10] | (S)-2 [2800] |
| Comparative Example 3 | (A)-1 [100] | (B)-1 [22.8] | (D1)-1 [1.60] | (D2)-2 [2.37] | — | (S)-1 [10] | (S)-2 [2800] |
| Comparative Example 4 | (A)-1 [100] | (B)-1 [22.8] | (D1)-1 [1.60] | (D2)-3 [1.54] | — | (S)-1 [10] | (S)-2 [2800] |
| Example 5 | (A)-1 [100] | (B)-1 [22.8] | (D1)-1 [1.60] | — | (N)-1 [3.16] | (S)-1 [10] | (S)-2 [2800] |
| Example 6 | (A)-1 [100] | (B)-1 [22.8] | (D1)-1 [1.60] | — | (N)-2 [1.25] | (S)-1 [10] | (S)-2 [2800] |
| Example 7 | (A)-1 [100] | (B)-1 [22.8] | (D1)-1 [1.60] | — | (N)-3 [1.70] | (S)-1 [10] | (S)-2 [2800] |
| Example 8 | (A)-1 [100] | (B)-1 [22.8] | (D1)-1 [1.60] | — | (N)-4 [1.27] | (S)-1 [10] | (S)-2 [2800] |
| Example 9 | (A)-1 [100] | (B)-1 [22.8] | (D1)-1 [1.60] | — | (N)-5 [1.54] | (S)-1 [10] | (S)-2 [2800] |
| Example 10 | (A)-1 [100] | (B)-1 [22.8] | (D1)-1 [1.60] | — | (N)-6 [1.54] | (S)-1 [10] | (S)-2 [2800] |

TABLE 2

| | Component (A) | Component (B) | Component (D) | | Component (N) | Component (S) | |
| --- | --- | --- | --- | --- | --- | --- | --- |
| | | | Component (D1) | Component (D2) | | | |
| Comparative Example 5 | (A)-2 [100] | (B)-1 [22.8] | (D1)-1 [1.60] | (D2)-1 [3.61] | — | (S)-1 [10] | (S)-2 [2800] |
| Example 11 | (A)-2 [100] | (B)-1 [22.8] | (D1)-1 [1.60] | — | (N)-1 [3.16] | (S)-1 [10] | (S)-2 [2800] |
| Comparative Example 6 | (A)-3 [100] | (B)-1 [22.8] | (D1)-1 [1.60] | (D2)-4 [5.61] | — | (S)-1 [10] | (S)-2 [2800] |
| Comparative Example 7 | (A)-3 [100] | (B)-1 [22.8] | (D1)-1 [1.60] | (D2)-5 [1.97] | — | (S)-1 [10] | (S)-2 [2800] |
| Comparative Example 8 | (A)-3 [100] | (B)-1 [22.8] | (D1)-1 [1.60] | (D2)-6 [4.70] | — | (S)-1 [10] | (S)-2 [2800] |
| Comparative Example 9 | (A)-3 [100] | (B)-1 [22.8] | (D1)-1 [1.60] | (D2)-7 [2.05] | — | (S)-1 [10] | (S)-2 [2800] |
| Comparative Example 10 | (A)-3 [100] | (B)-1 [22.8] | (D1)-1 [1.60] | (D2)-8 [2.81] | — | (S)-1 [10] | (S)-2 [2800] |
| Comparative Example 11 | (A)-3 [100] | (B)-1 [22.8] | (D1)-1 [1.60] | (D2)-9 [3.10] | — | (S)-1 [10] | (S)-2 [2800] |
| Comparative Example 12 | (A)-3 [100] | (B)-1 [22.8] | (D1)-1 [1.60] | (D2)-10 [3.19] | — | (S)-1 [10] | (S)-2 [2800] |
| Example 12 | (A)-3 [100] | (B)-1 [22.8] | (D1)-1 [1.60] | — | (N)-1 [3.16] | (S)-1 [10] | (S)-2 [2800] |
| Example 13 | (A)-1 [100] | (B)-1 [22.8] | (D1)-2 [1.30] | — | (N)-1 [3.16] | (S)-1 [10] | (S)-2 [2800] |
| Example 14 | (A)-1 [100] | (B)-1 [22.8] | (D1)-3 [2.00] | — | (N)-1 [3.16] | (S)-1 [10] | (S)-2 [2800] |
| Comparative Example 13 | (A)-1 [100] | (B)-2 [10.0] | (D1)-1 [1.60] | (D2)-1 [3.61] | — | (S)-1 [10] | (S)-2 [2800] |
| Example 15 | (A)-1 [100] | (B)-2 [10.0] | (D1)-1 [1.60] | — | (N)-1 [3.16] | (S)-1 [10] | (S)-2 [2800] |

TABLE 2-continued

| | Component (A) | Component (B) | Component (D1) | Component (D2) | Component (N) | Component (S) | |
|---|---|---|---|---|---|---|---|
| Comparative Example 14 | (A)-1 [100] | (B)-3 [13.0] | (D1)-1 [1.60] | (D2)-1 [3.61] | — | (S)-1 [10] | (S)-2 [2800] |
| Example 16 | (A)-1 [100] | (B)-3 [13.0] | (D1)-1 [1.60] | — | (N)-1 [3.16] | (S)-1 [10] | (S)-2 [2800] |
| Example 17 | (A)-1 [100] | (B)-3 [13.0] | (D1)-1 [1.60] | — | (N)-1 [1.58] (N)-3 [0.85] | (S)-1 [10] | (S)-2 [2800] |

In Table 1, the values in brackets [ ] indicate the amount (in terms of parts by weight) of the component added. The reference characters indicate the following.

(A)-1 to (A)-3: polymeric compounds represented by chemical formulae (A1-1) to (A1-3) shown below, respectively: With respect to each of the polymeric compounds, the weight average molecular weight (Mw) and the dispersity (Mw/Mn) determined by the polystyrene equivalent value as measured by gel permeation chromatography (GPC) are shown. Further, as a result of an analysis by carbon 13 nuclear magnetic resonance spectroscopy (600 MHz $^{13}$C-NMR), the composition of the copolymer (ratio (molar ratio) of the respective structural units within the structural formula), i.e., l/m/n is shown.

(B)-1 to (B)-3: acid generators represented by chemical formulae (B)-1 to (B)-3 shown below, respectively (D1)-1 to (D1)-3: photodecomposable bases represented by chemical formulae (D1)-1 to (D1)-3 shown below, respectively (D2)-1 to (D2)-10: nitrogen-containing organic compounds represented by chemical formulae (D2)-1 to (D2)-10 shown below, respectively (N)-1 to (N)-6: nitrogen-containing compound represented by chemical formulae (N)-1 to (N)-6 shown below, respectively The pKa values and the boiling points of compounds (D2) and (N) are also shown.

The pKa value was calculated by simulation using a conventional software "Software V11.02 (1994-2011 ACD/Labs)" (trade name; manufactured by Advanced Chemistry Development, Inc.).

The boiling point means the temperature at which boiling occurs under a pressure of 1 atm, and wherein the temperature is recited in Chemical Database. With respect to (D2)-5, the boiling point is a value under a pressure of 15 mmHg. With respect to (D2)-6 and (D2)-10, the melting point is shown instead of the boiling point. With respect to the melting point (mp), the temperature recited in Chemical Database is shown.

(S)-1: γ-butyrolactone (S)-2: a mixed solvent of propylene glycol monomethyl ether acetate/propylene glycol monomethyl ether=6/4 (weight ratio).

[Chemical Formula 50]

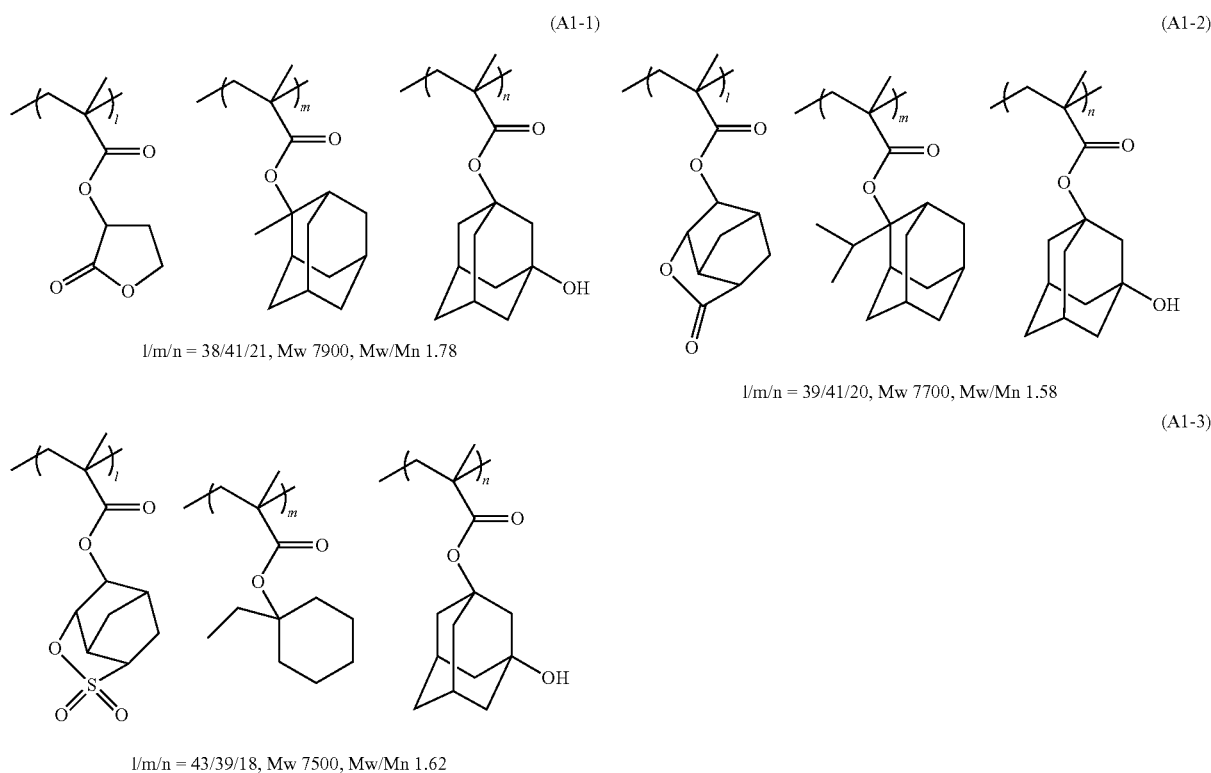

l/m/n = 38/41/21, Mw 7900, Mw/Mn 1.78 (A1-1)

l/m/n = 39/41/20, Mw 7700, Mw/Mn 1.58 (A1-2)

l/m/n = 43/39/18, Mw 7500, Mw/Mn 1.62 (A1-3)

[Chemical Formula 51]
(B)-1 (B)-2
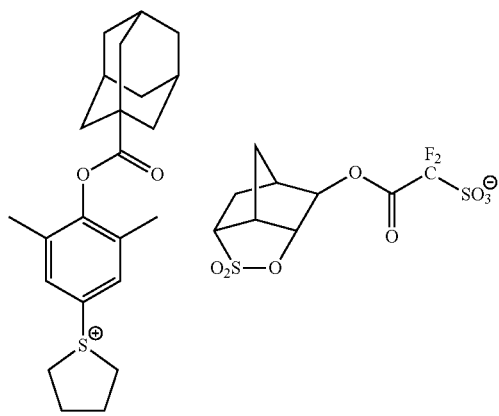
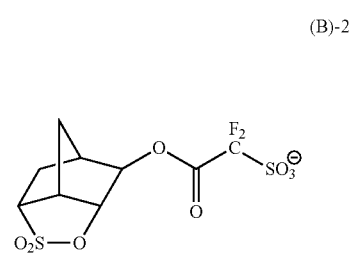
(B)-3
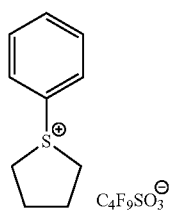
[Chemical Formula 52]
(D1)-1 (D1)-2
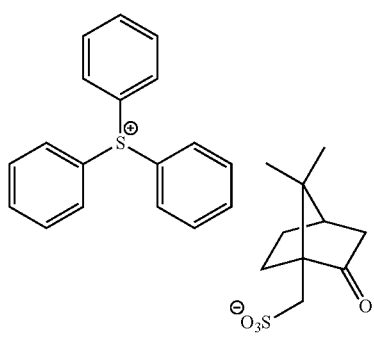
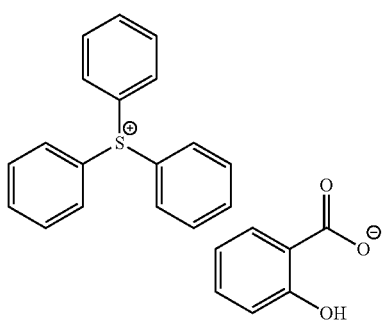
(D1)-3
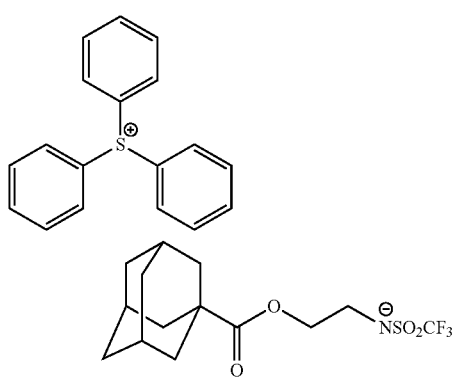

-continued

[Chemical 53]

(D2)-1

(D2)-2

(D2)-3

| | | | |
|---|---|---|---|
| pKa | 9.99 | 7.77 | -0.43 |
| boiling point | 242.5 | 335.4 | 127 |

[Chemical Formula 54]

(D2)-4

(D2)-5

(D2)-6

| | | | |
|---|---|---|---|
| pKa | 10.08 | 10.43 | 5.14 |
| boiling point | 366 | 108 (°C./15 mmHg) | 275 (mp) |

[Chemical Formula 55]

(D2)-7

(D2)-8

(D2)-9

(D2)-10

| | | | | |
|---|---|---|---|---|
| pKa | 8.96 | 4.25 | 11.03 | -2.04 |
| boiling point | 198 | 257 | 265 | 156 to 158 (mp) |

[Chemical Formula 56]

(N)-1

(N)-2

(N)-3

(N)-4

| | | | | |
|---|---|---|---|---|
| pKa | 5.89 | 5.23 | 6.67 | 1.78 |
| boiling point | 69 | 116 | 144 | 124 |

[Chemical Formula 57]

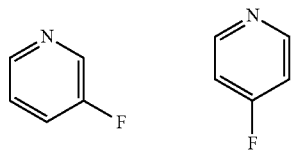

| | (N)-5 | (N)-6 |
|---|---|---|
| pKa | 2.81 | 4.15 |
| boiling point | 107 | 104 |

[Storage Test]

The obtained positive resist compositions were stored under a condition at −20° C. for two weeks and a condition at 23° C. for two weeks.

[Formation of Resist Pattern]

Using the stored resist compositions under the aforementioned conditions, resist patterns were formed by a method of forming a resist pattern as described below.

An organic anti-reflection film composition (product name: ARC29A, manufactured by Brewer Science Ltd.) was applied to an 12-inch silicon wafer using a spinner, and the composition was then baked and dried on a hotplate at 205° C. for 60 seconds, thereby forming an organic anti-reflection film having a film thickness of 89 nm.

Then, the resist composition was applied onto the anti-reflection film using a spinner, and was then prebaked (PAB) on a hotplate at a temperature indicated in Table 2 for 60 seconds and dried, thereby forming a resist film having a film thickness of 100 nm.

Subsequently, the resist film was selectively irradiated with an ArF excimer laser (193 nm) through a photomask (6% halftone), using an ArF exposure apparatus NSR-S308 (manufactured by Nikon Corporation; NA (numerical aperture)=0.92; Annuler, σ=0.75). Further, PEB treatment was conducted at a temperature indicated in Table 2 for 60 seconds.

Next, an alkali development was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist was washed for 30 seconds with pure water, followed by drying by shaking. Further, a post bake was conducted on a hot plate at 100° C. for 45 seconds.

Using the stored resist compositions under the aforementioned conditions, contact hole patterns (CH patterns) were formed by the aforementioned method of forming a resist pattern, with a target size having a hole diameter (CD) of 80 nm and a pitch of 140 nm.

[Optimum Exposure Dose (Eop)]

The optimum exposure dose Eop (mJ/cm$^2$) with which a CH pattern having the target size was formed by the aforementioned method of forming a resist pattern using the resist composition after storage for 2 weeks at −20° C. was determined. The results are shown in Tables 3 and 4.

[Storage Stability]

1) Using the resist composition after storage for 2 weeks at −20° C. or the resist composition after storage for 2 weeks at 23° C., a CH pattern was formed with the optimum exposure dose Eop, by the aforementioned method of forming a resist pattern, and then, the hole diameter (CD) was measured.

2) With respect to the resist compositions, the difference between the hole diameter in the CH pattern formed using the resist composition after storage for 2 weeks at −20° C. and the hole diameter in the CH pattern formed using the resist composition after storage for 2 weeks at 23° C. (i.e., variable value of CD) was calculated. The results are indicated under "ΔCD (nm)" in Tables 3 and 4.

When ΔCD was less than 5 nm, the level of storage stability is evaluated as excellent.

TABLE 3

| | PAB (° C.) | PEB (° C.) | ΔCD (nm) | Eop (mJ/cm$^2$) |
|---|---|---|---|---|
| Comparative Example 1 | 110 | 110 | 7.56 | 53.4 |
| Example 1 | 110 | 110 | 2.13 | 53.2 |
| Example 2 | 110 | 110 | 1.48 | 53.2 |
| Example 3 | 110 | 110 | 1.09 | 53.3 |
| Example 4 | 110 | 110 | 3.91 | 53.4 |
| Comparative Example 2 | 110 | 110 | >30 | 67.3 |
| Comparative Example 3 | 110 | 110 | 6.94 | 70.2 |
| Comparative Example 4 | 110 | 110 | 7.40 | 54.3 |
| Example 5 | 110 | 110 | 0.21 | 53.2 |
| Example 6 | 110 | 110 | 0.60 | 53.8 |
| Example 7 | 110 | 110 | 0.30 | 53.9 |
| Example 8 | 110 | 110 | 3.35 | 53.8 |
| Example 9 | 110 | 110 | 4.88 | 54.1 |
| Example 10 | 110 | 110 | 1.27 | 53.6 |

TABLE 4

| | PAB (° C.) | PEB (° C.) | ΔCD (nm) | Eop (mJ/cm$^2$) |
|---|---|---|---|---|
| Comparative Example 5 | 100 | 85 | >30 | 43.6 |
| Example 11 | 100 | 85 | 0.36 | 31.9 |
| Comparative Example 6 | 100 | 95 | >30 | 72.5 |
| Comparative Example 7 | 100 | 95 | >30 | 71.7 |
| Comparative Example 8 | 100 | 95 | 0.63 | 67.9 |
| Comparative Example 9 | 100 | 95 | 7.54 | 58.3 |
| Comparative Example 10 | 100 | 95 | 4.15 | 56.1 |
| Comparative Example 11 | 100 | 95 | >30 | 65.9 |
| Comparative Example 12 | 100 | 95 | 6.73 | 70.8 |
| Example 12 | 100 | 95 | 0.13 | 48.3 |
| Example 13 | 110 | 110 | 0.17 | 49.2 |

TABLE 4-continued

|  | PAB (° C.) | PEB (° C.) | ΔCD (nm) | Eop (mJ/cm$^2$) |
|---|---|---|---|---|
| Example 14 | 110 | 110 | 0.29 | 50.1 |
| Comparative Example 13 | 110 | 110 | 9.89 | 65.3 |
| Example 15 | 110 | 110 | 0.37 | 50.7 |
| Comparative Example 14 | 110 | 110 | >30 | 53.3 |
| Example 16 | 110 | 110 | 1.08 | 40.7 |
| Example 17 | 110 | 110 | 0.82 | 40.9 |

From the results shown in Tables, the resist composition according to the present invention exhibits a high level of sensitivity and excellent storage stability.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates acid upon exposure and exhibits changed solubility in a developing solution by the action of acid, comprising:
a base component (A) which exhibits changed solubility in a developing solution by the action of acid;
an acid generator component (B) that generates acid upon exposure;
a nitrogen-containing compound (N) which has a boiling point of 50 to 200° C., wherein a conjugate acid thereof has a pKa of 0 to 7; and
a photodecomposable base (D1).

2. The resist composition according to claim 1, wherein the acid generator component (B) has at least one cation moiety selected from the group consisting of a cation moiety represented by general formula (ca-11) shown below, a cation moiety represented by general formula (ca-12) shown below and a cation moiety represented by general formula (ca-3) shown below, or has an anion moiety represented by general formula (Ban-1) shown below;

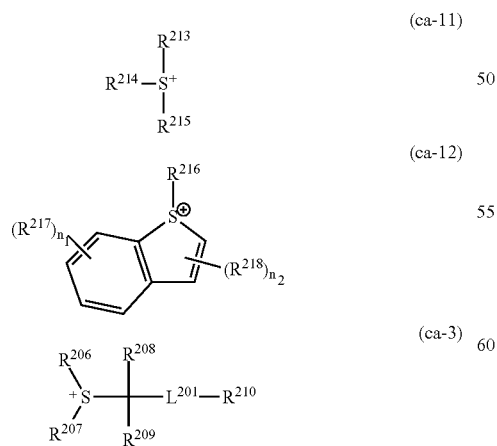

wherein $R^{213}$ to $R^{215}$ each independently represents an aryl group which may have a substituent, an alkyl group which may have a substituent or an alkenyl group which may have a substituent, and two of $R^{213}$ to $R^{215}$ may be mutually bonded to each other to form a ring with the sulfur atom; $R^{216}$ represents an aryl group which may have a substituent, an alkyl group which may have a substituent or an alkenyl group which may have a substituent; $R^{217}$ and $R^{218}$ each independently represents an alkyl group, an acetyl group, an alkoxy group, a carboxy group, a hydroxy group or a hydroxyalkyl group; $n_1$ represents an integer of 0 to 3; $n_2$ represents an integer of 0 to 2; $R^{206}$ and $R^{207}$ each independently represents an aryl group which may have a substituent, an alkyl group which may have a substituent or an alkenyl group which may have a substituent, and may be mutually bonded to each other to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an —SO$_2$— containing cyclic group which may have a substituent; and L$^{201}$ represents —C(=O)— or —C(=O)—O—;

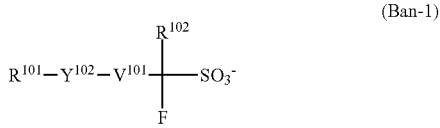

wherein $R^{101}$ represents a cyclic group which may have a substituent, a chain-like alkyl group which may have a substituent or a chain-like alkenyl group which may have a substituent; $Y^{102}$ represents a divalent linking group having —C(=O)—O—; $V^{101}$ represents a single bond, an alkylene group or a fluorinated alkylene group; and $R^{102}$ represents a fluorine atom or a fluorinated alkyl group of 1 to 5 carbon atoms.

3. The resist composition according to claim 1, wherein the nitrogen-containing compound (N) is at least one compound selected from the group consisting of a compound represented by general formula (N1) shown below and a compound represented by general formula (N2) shown below;

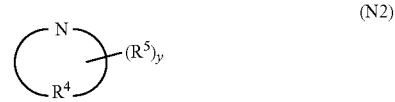

wherein $R^1$ to $R^3$ each independently represents a hydrogen atom, an alkyl group of 1 to 15 carbon atoms which may have a substituent, a fluorinated alkyl group which may have a substituent or an aryl group which may have a substituent, and two of $R^1$ to $R^3$ may be mutually bonded to form a ring, provided that, at least one of $R^1$ to $R^3$ represents a fluorinated alkyl group, an aryl group or an aryl group having a fluorine atom; $R^4$ represents a group which forms an aromatic ring with the nitrogen atom bonded to the $R^4$ group; $R^5$ represents an alkyl group of 1 to 15 carbon atoms which may have a substituent or a halogen atom; and y represents an integer of 0 to 5.

4. The resist composition according to claim 1, wherein the photodecomposable base (D1) is at least one compound selected from the group consisting of a compound represented by general formula (d1-1) shown below, a compound represented by general formula (d1-2) shown below and a compound represented by general formula (d1-3) shown below;

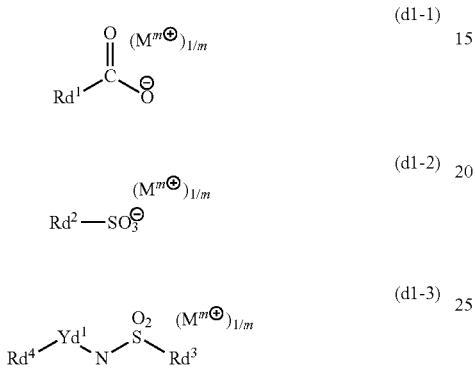

wherein $Rd^1$ to $Rd^4$ each represents a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents an organic cation having a valency of m.

5. The resist composition according to claim 1, wherein the base component (A) comprises a polymeric compound (A1) which comprises a structural unit (a1) containing an acid decomposable group that exhibits increased polarity by the action of acid.

6. A method of forming a resist pattern, comprising: forming a resist film on a substrate using a resist composition of claim 1; conducting exposure of the resist film; and developing the resist film to form a resist pattern.

7. The resist composition according to claim 1, wherein the nitrogen-containing compound (N) has a boiling point of 55 to 180° C.

8. The resist composition according to claim 1, wherein the conjugate acid has a pKa of 0.5 to 7.

9. The resist composition according to claim 3, wherein the compound represented by general formula (N1) is at least one compound selected from the group consisting of compounds represented by general formulas shown below;

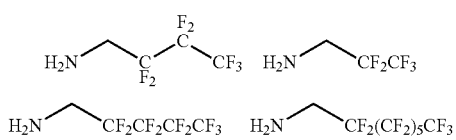

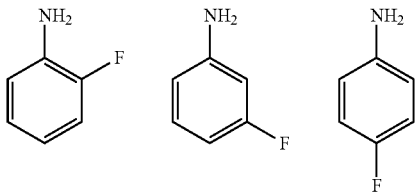

and the compound represented by general formula (N2) is at least one compound selected from the group consisting of compounds represented by general formulas shown below

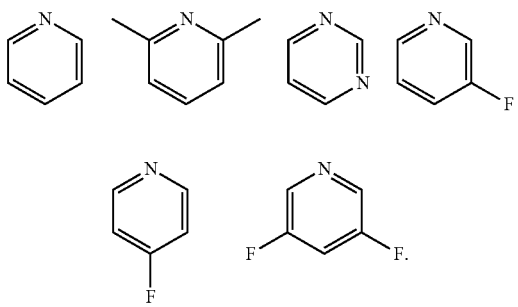

10. The resist composition according to claim 4, wherein the $Rd^1$-$CO_2^-$ group within the compound represented by general formula (d1-1) is at least one anion moiety selected from the group consisting of anion moieties represented by general formulas shown below;

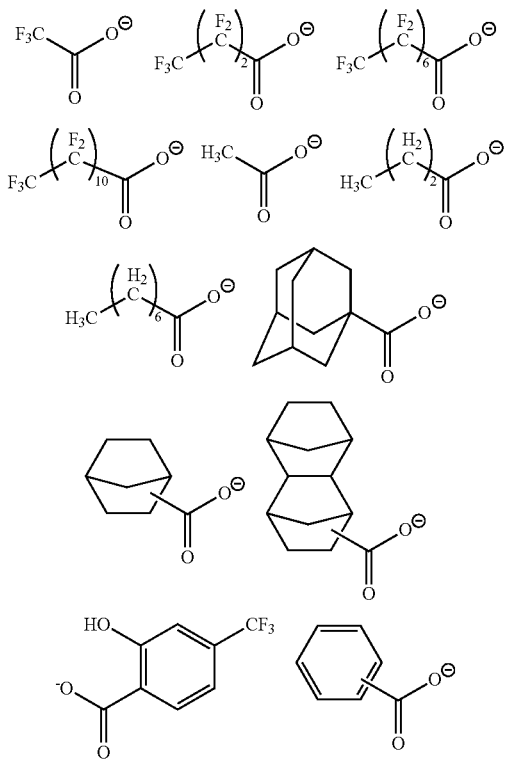

-continued

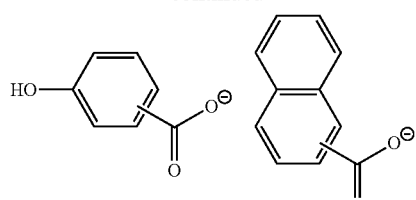

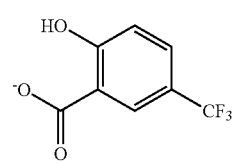

the Rd$^2$-SO$_3^-$ group within the compound represented by general formula (d1-2) is at least one anion moiety selected from the group consisting of anion moieties represented by general formulas shown below;

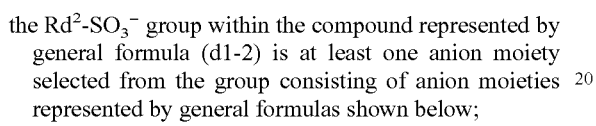

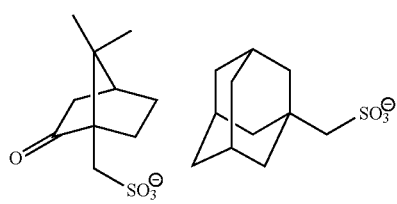

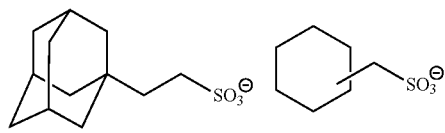

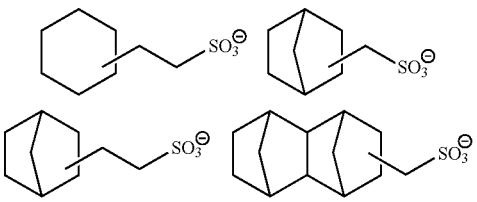

$C_aH_{2a+1}SO_3^-$
(a = 3~10)

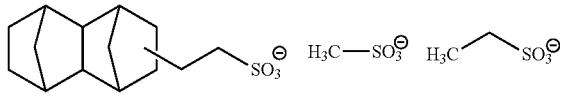

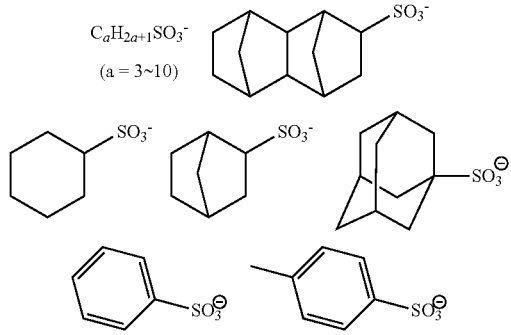

and the Rd$^4$-Yd$^1$-N$^-$—SO$_2$-Rd$^3$ group within the compound represented by general formula (d1-3) is at least one anion moiety selected from the group consisting of anion moieties represented by general formulas shown below;

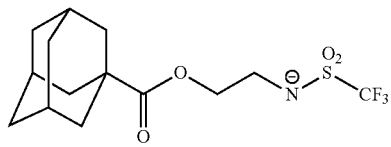

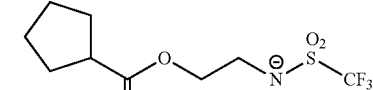

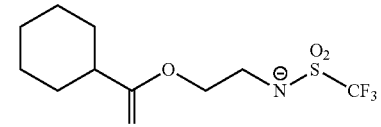

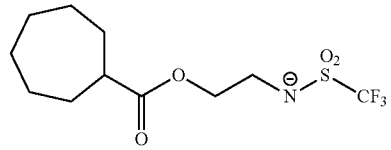

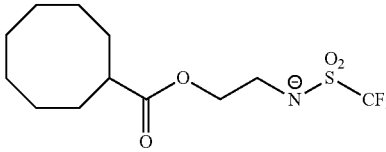

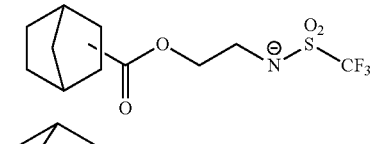

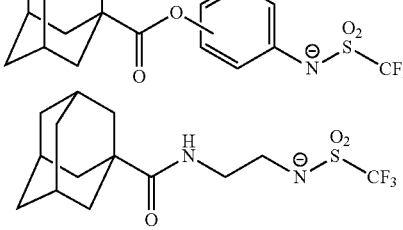

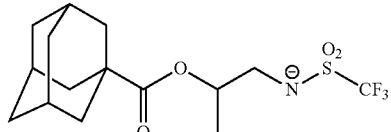

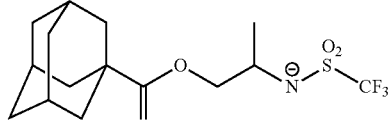

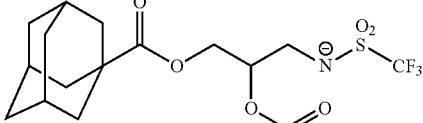

-continued

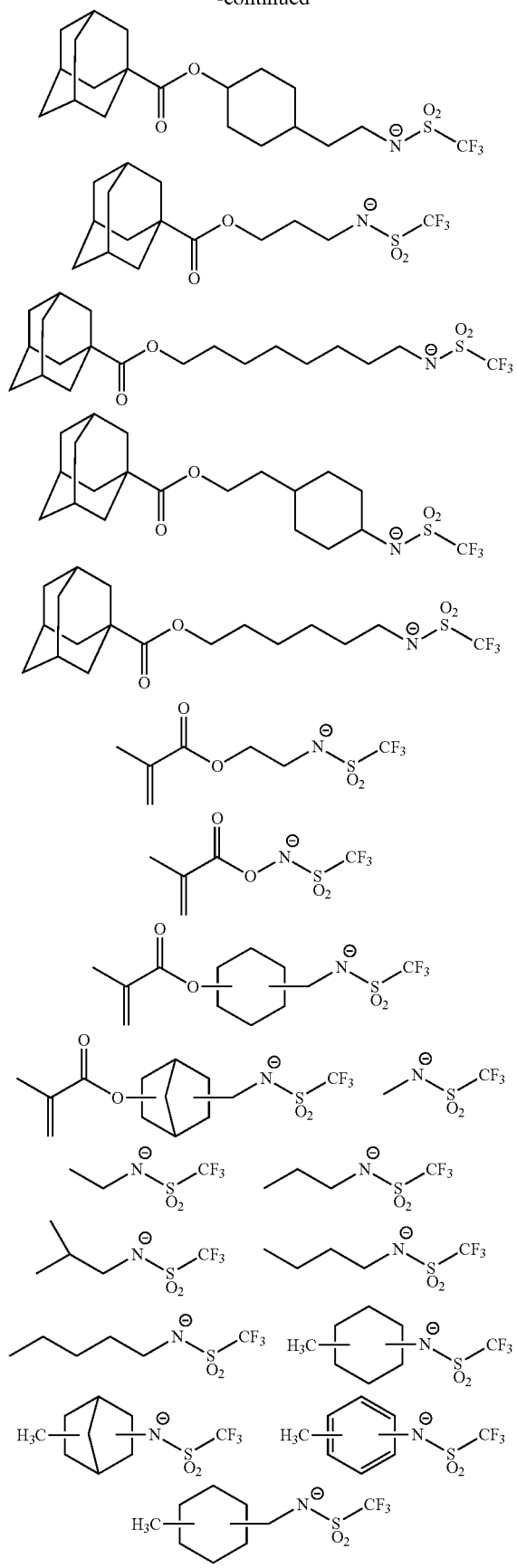

-continued

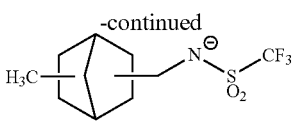
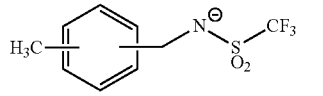 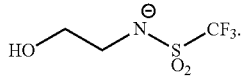

11. The resist composition according to claim 10, wherein $M^{m+}$ is at least one cation moiety selected from the group consisting of anion moieties represented by general formulas (ca-1) to (ca-4) shown below;

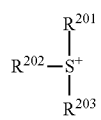 (ca-1)

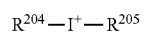 (ca-2)

 (ca-3)

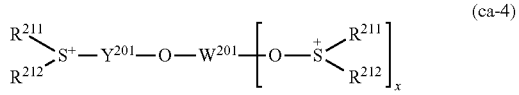 (ca-4)

wherein each of $R^{201}$ to $R^{207}$, $R^{211}$ and $R^{212}$ independently represents an aryl group which may have a substituent, an alkyl group which may have a substituent or an alkenyl group which may have a substituent; $R^{201}$ to $R^{203}$, $R^{206}$ and $R^{207}$, and $R^{211}$ and $R^{212}$ may be mutually bonded to form a ring with the sulfur atom; $R^{208}$ and $R^{209}$ each represents a hydrogen atom or an alkyl group of 1 to 5 carbon atoms; $R^{210}$ represents an aryl group which may have a substituent, an alkyl group which may have a substituent, an alkenyl group which may have a substituent or an —SO$_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

12. The resist composition according to claim 11, wherein the cation moiety represented by general formula (ca-1) is at least one cation moiety selected from the group consisting of anion moieties represented by general formulas (ca-1-1) to (ca-1-63) shown below;

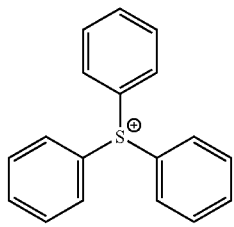 (ca-1-1)

-continued
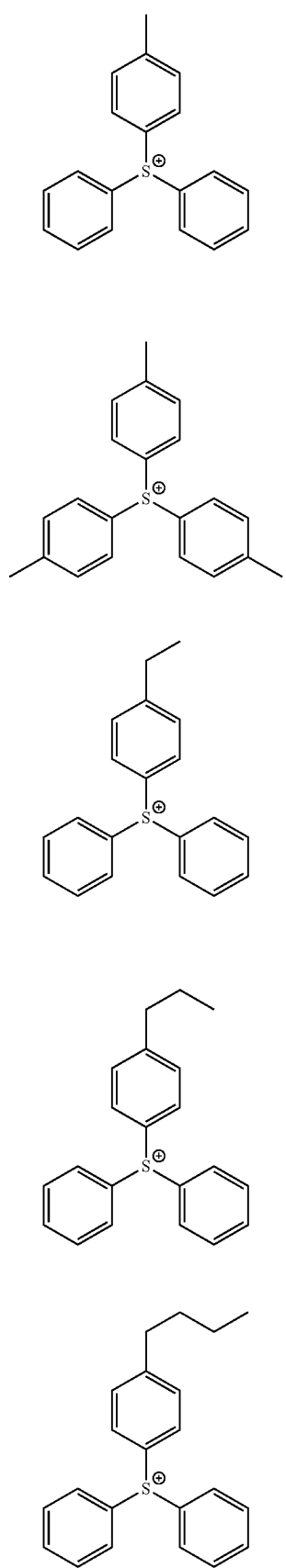
(ca-1-2)
(ca-1-3)
(ca-1-4)
(ca-1-5)
(ca-1-6)
-continued
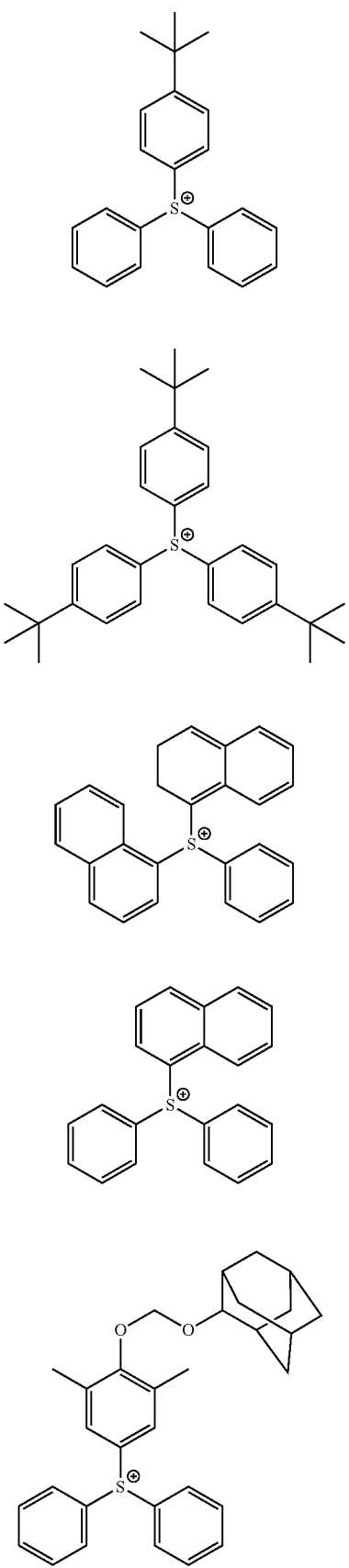
(ca-1-7)
(ca-1-8)
(ca-1-9)
(ca-1-10)
(ca-1-11)

(ca-1-12)
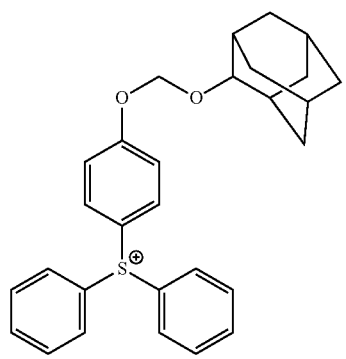
(ca-1-13)
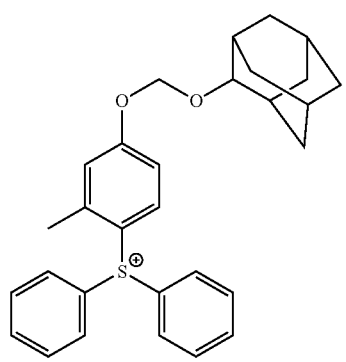
(ca-1-14)
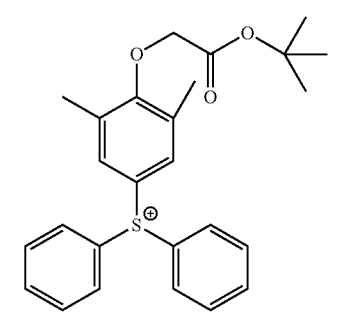
(ca-1-15)
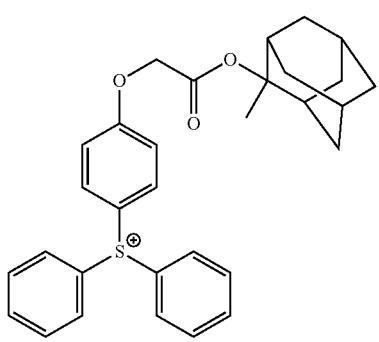
(ca-1-16)
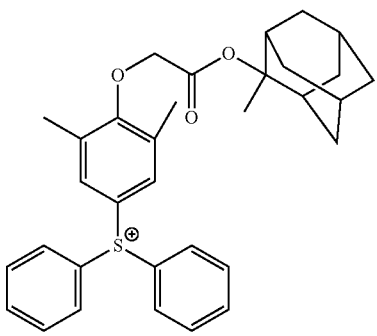
(ca-1-17)
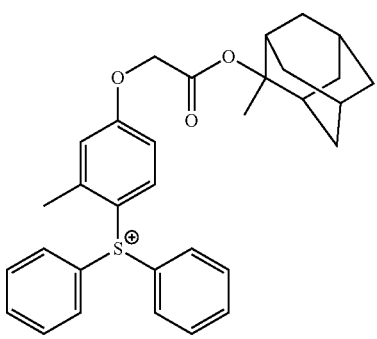
(ca-1-18)
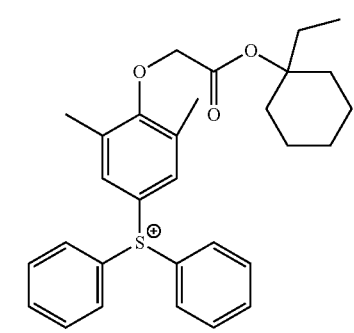
(ca-1-19)
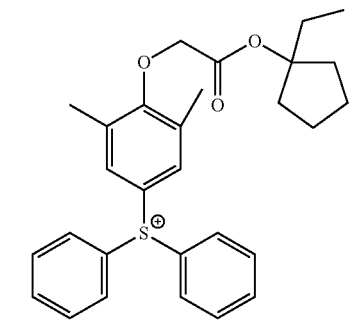
(ca-1-20)
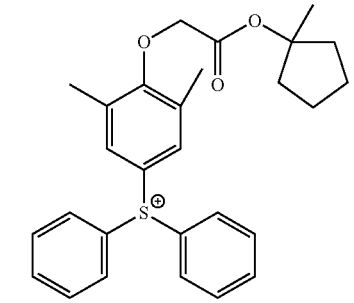

-continued
(ca-1-21)
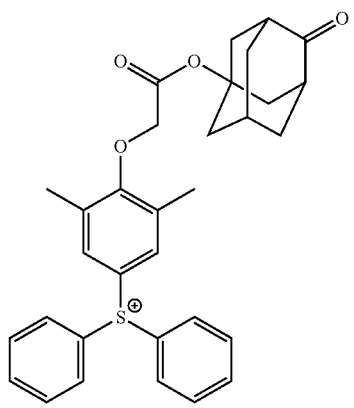
(ca-1-22)
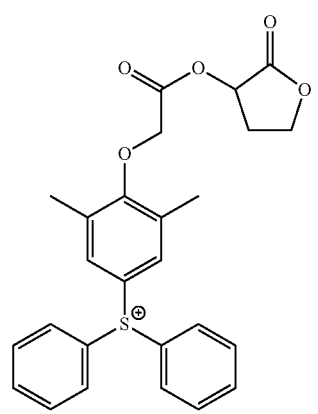
(ca-1-23)
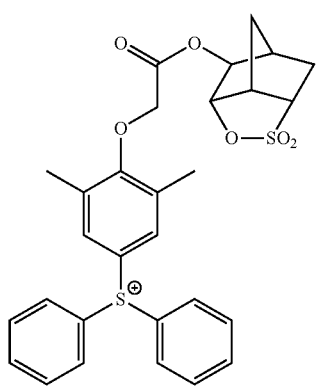
(ca-1-24)
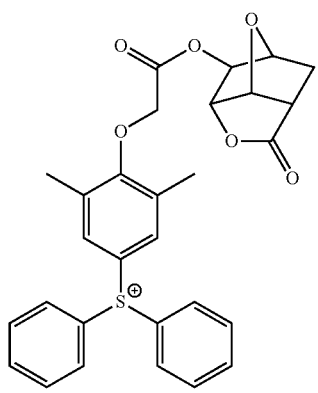
-continued
(ca-1-25)
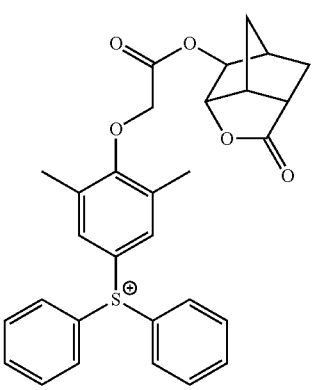
(ca-1-26)
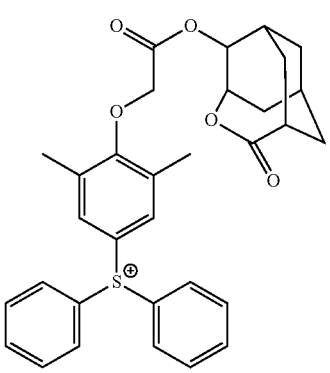
(ca-1-27)
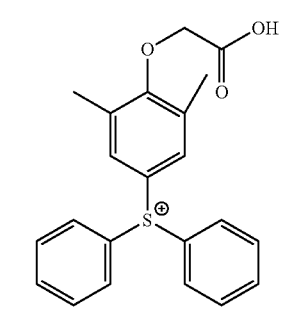
(ca-1-28)
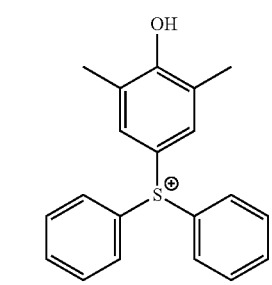
(ca-1-29)
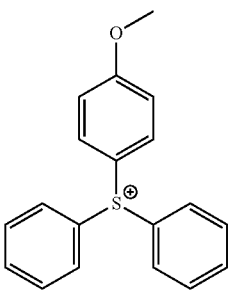

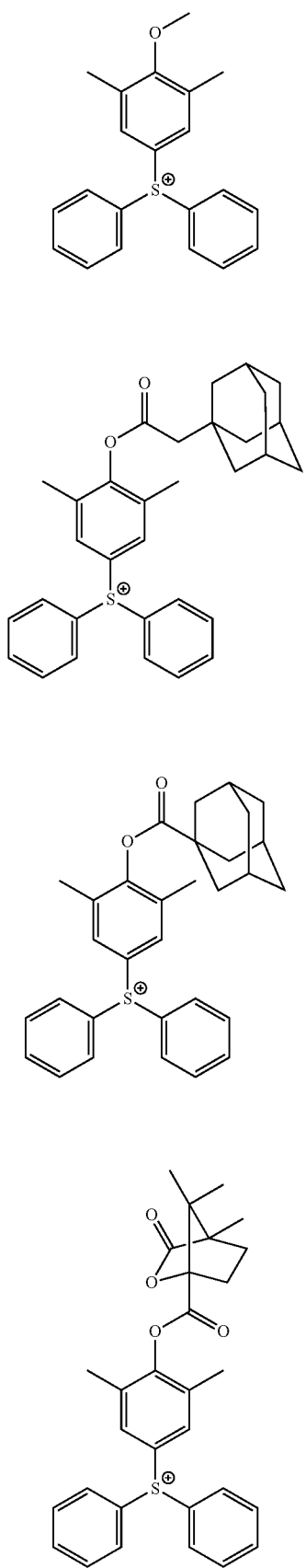
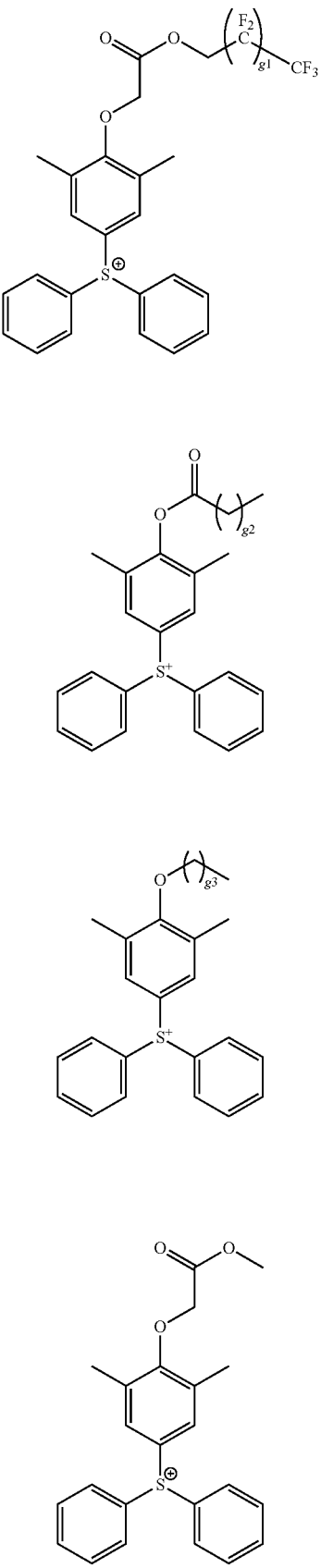

(ca-1-38)
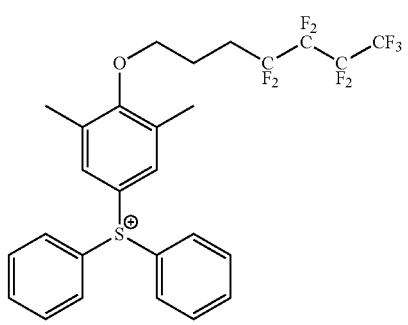
(ca-1-39)
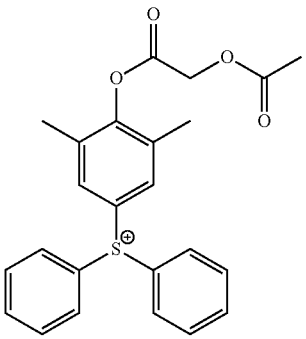
(ca-1-40)
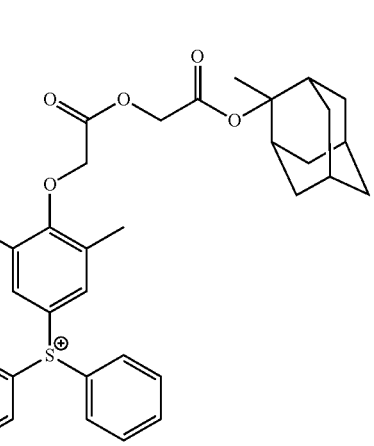
(ca-1-41)
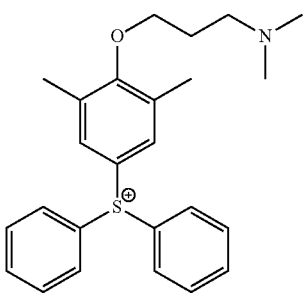
(ca-1-42)
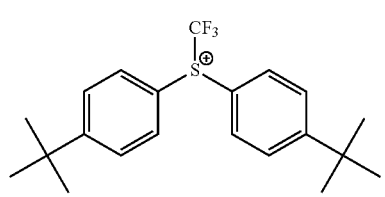
(ca-1-43)
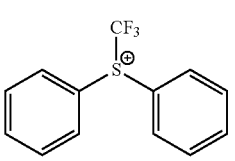
(ca-1-44)
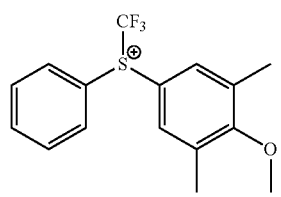
(ca-1-45)
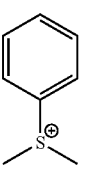
(ca-1-46)
(ca-1-47)
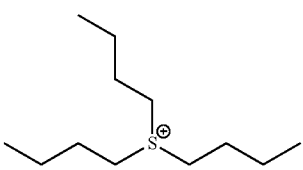
(ca-1-48)
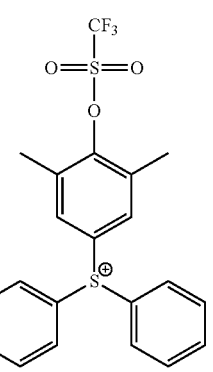
(ca-1-49)
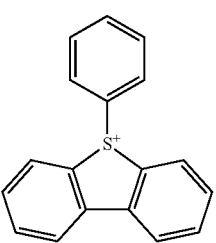

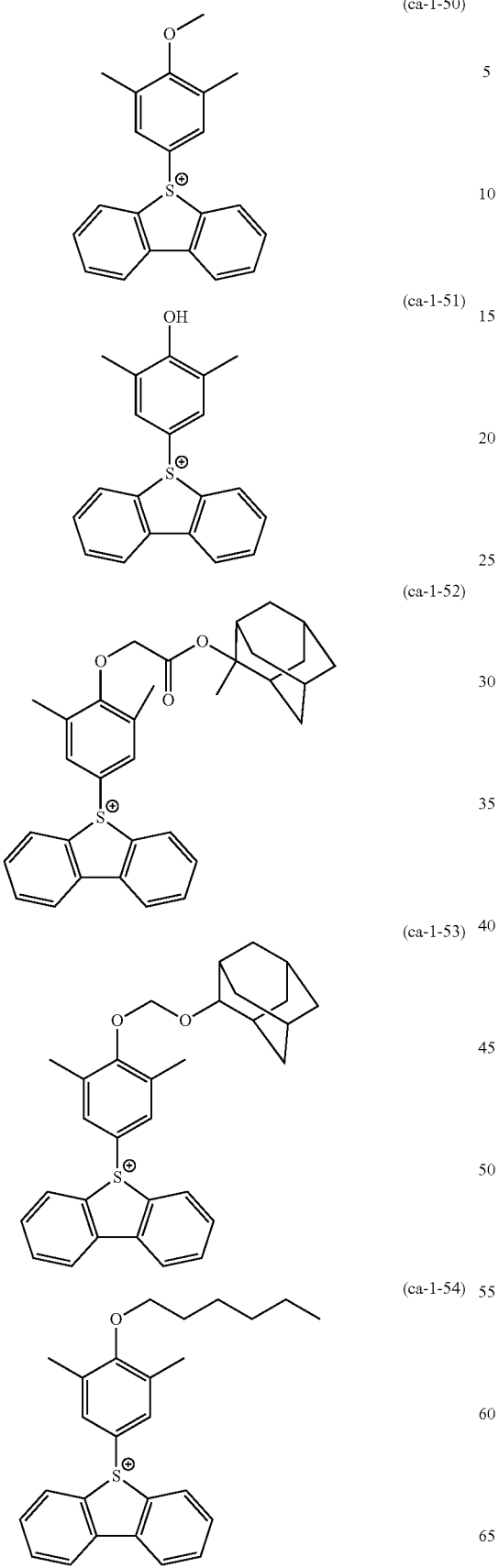
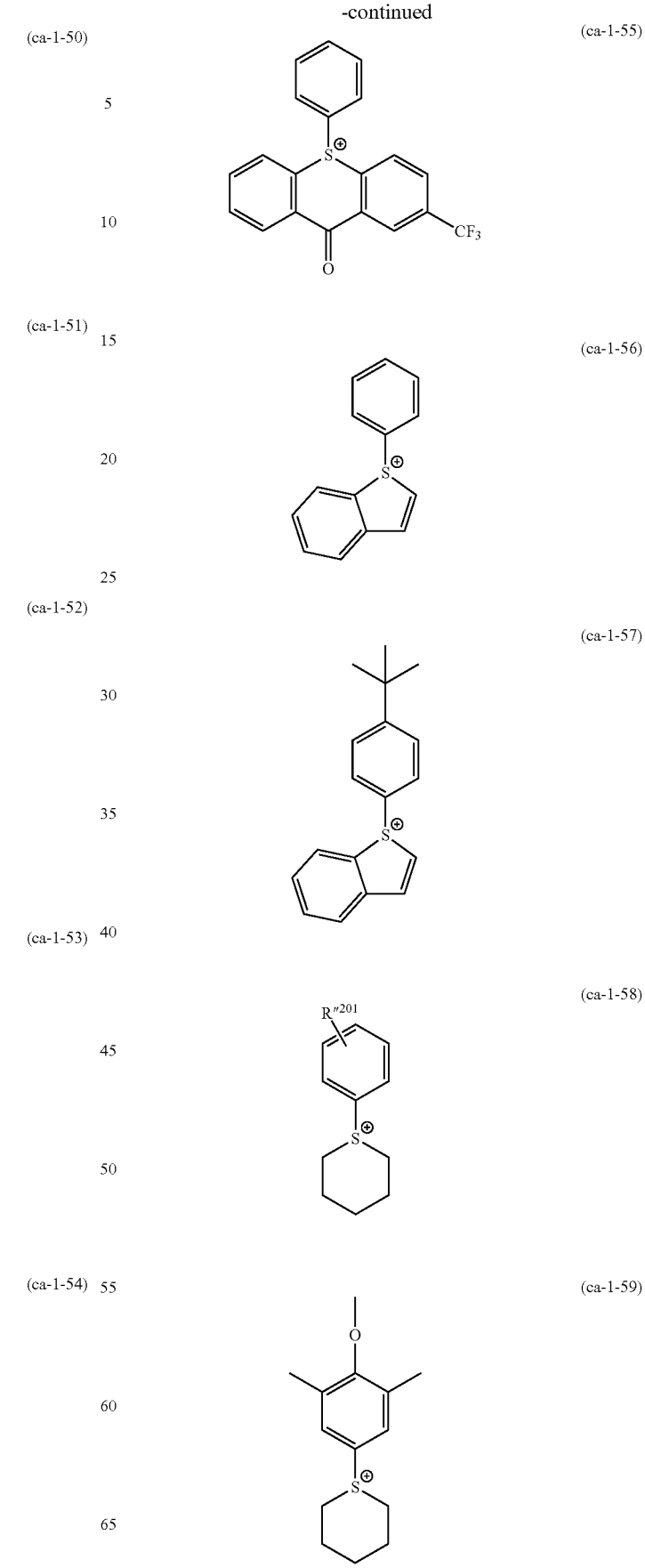

-continued

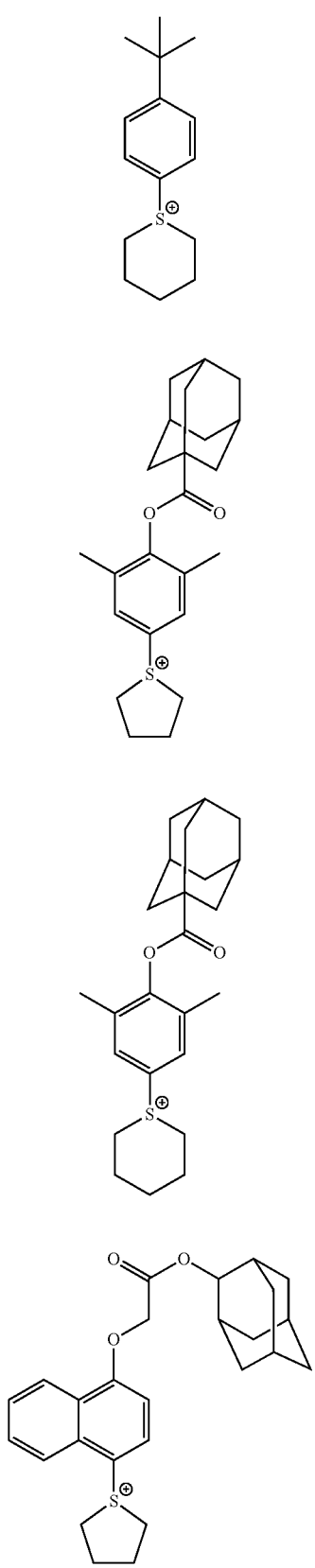

(ca-1-60)

(ca-1-61)

(ca-1-62)

(ca-1-63)

wherein g1, g2 and g3 represent recurring numbers, wherein g1 is an integer of 1 to 5, g2 is an integer of 0 to 20, g3 is an integer of 0 to 20, and $R''^{201}$ represents a hydrogen atom or a substituent;

the cation moiety represented by general formula (ca-3) is at least one cation moiety selected from the group consisting of anion moieties represented by general formulas (ca-3-1) to (ca-1-6) shown below;

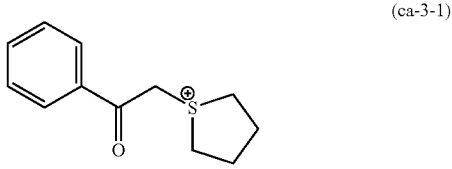

(ca-3-1)

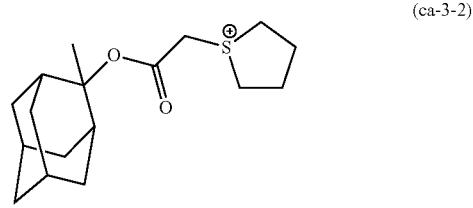

(ca-3-2)

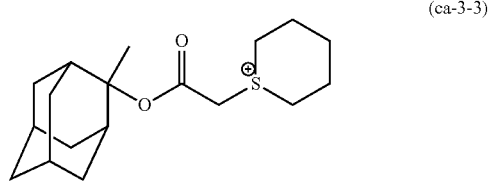

(ca-3-3)

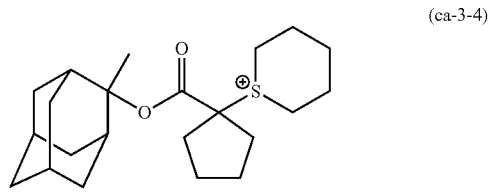

(ca-3-4)

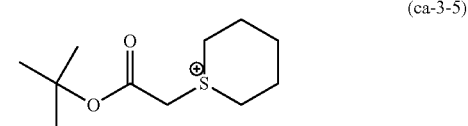

(ca-3-5)

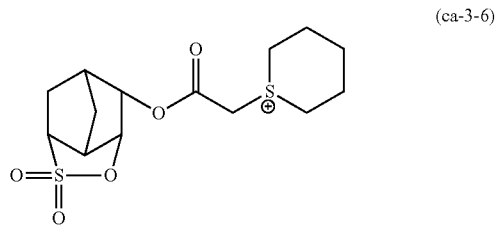

(ca-3-6)

and the cation moiety represented by general formula (ca-4) is at least one cation moiety selected from the group consisting of anion moieties represented by general formulas (ca-4-1) and (ca-4-2) shown below;

(ca-4-1)

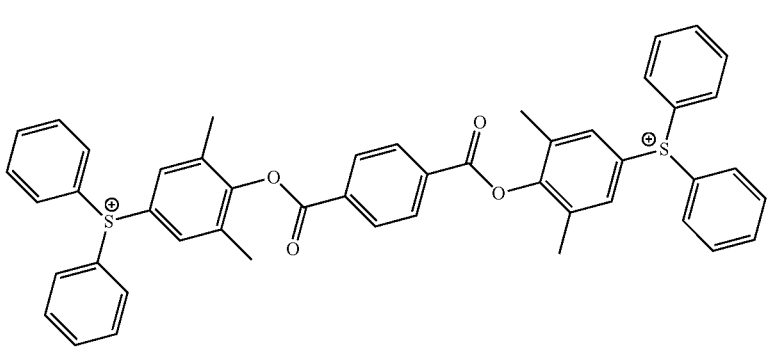

(ca-4-2)

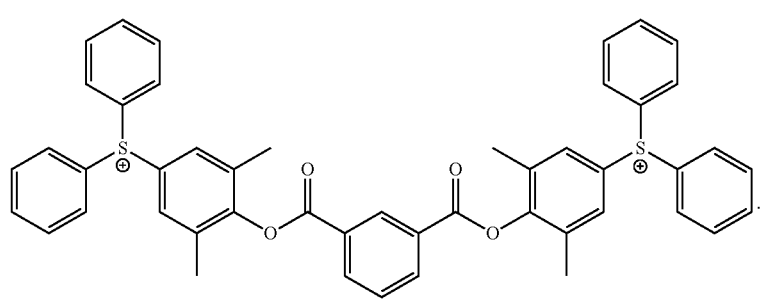

13. The resist composition according to claim 9, wherein the compound represented by general formula (N1) is a compound represented by general formula shown below;

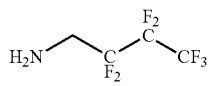 (N)-1 and the compound represented by general formula (N2) is at least one compound selected from the group consisting of compounds represented by general formulas shown below;

 (N)-2

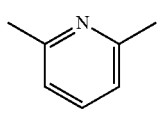 (N)-3

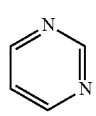 (N)-4

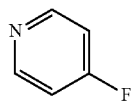 (N)-5

-continued

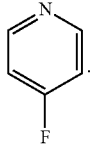 (N)-6

14. The resist composition according to claim 13, wherein the photodecomposable base (D1) is at least one compound selected from the group consisting of compounds represented by general formulas shown below;

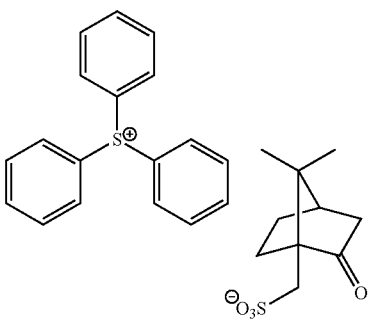 (D1)-1

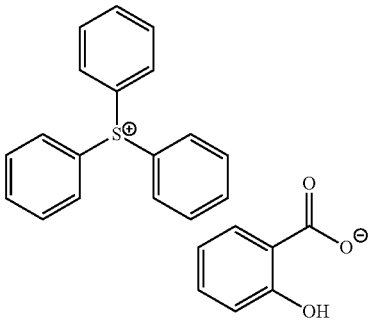 (D1)-2

-continued

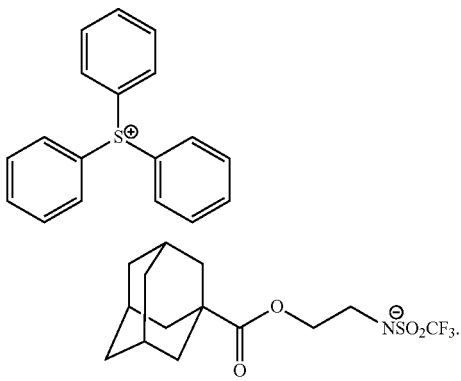
(D1)-3

15. The resist composition according to claim 14, wherein the acid generator component (B) is at least one compound selected from the group consisting of compounds represented by general formulas shown below;

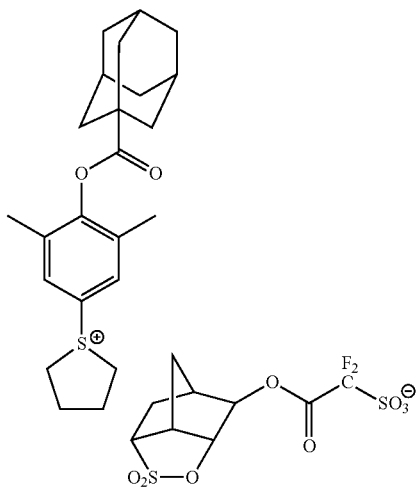
(B)-1

-continued

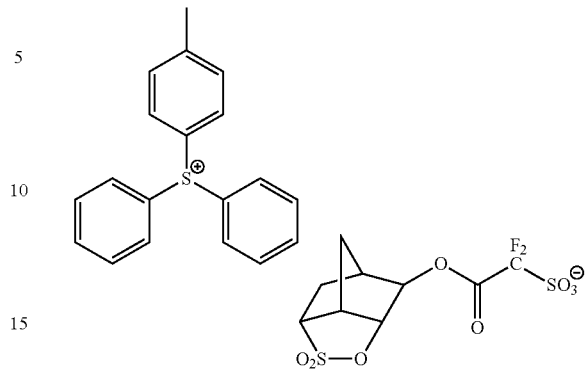
(B)-2

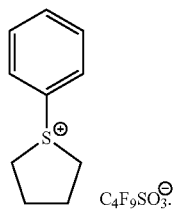
(B)-3

16. The resist composition according to claim 1, wherein the amount of the nitrogen-containing compound (N) relative to 100 parts by weight of the base component (A) is 0.05 to 30 parts by weight.

17. The resist composition according to claim 1, wherein the amount of the photodecomposable base (D1) relative to 100 parts by weight of the base component (A) is 0.5 to 10 parts by weight.

18. The resist composition according to claim 1, wherein the amount of the acid generator component (B) relative to 100 parts by weight of the base component (A) is 0.5 to 60 parts by weight.

\* \* \* \* \*